(12) United States Patent
Kanda et al.

(10) Patent No.: US 7,611,820 B2
(45) Date of Patent: Nov. 3, 2009

(54) POSITIVE RESIST COMPOSITION AND PATTERN-FORMING METHOD USING THE SAME

(75) Inventors: Hiromi Kanda, Shizuoka (JP); Shinichi Kanna, Shizuoka (JP); Haruki Inabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/519,966

(22) Filed: Sep. 13, 2006

(65) Prior Publication Data

US 2007/0059639 A1    Mar. 15, 2007

(30) Foreign Application Priority Data

| Sep. 13, 2005 | (JP) | P.2005-265750 |
| Dec. 9, 2005 | (JP) | P.2005-356959 |
| Apr. 10, 2006 | (JP) | P.2006-107726 |

(51) Int. Cl.
*G03F 7/00* (2006.01)
*G03F 7/004* (2006.01)

(52) U.S. Cl. .................. 430/270.1; 430/905; 430/913; 430/311

(58) Field of Classification Search ............. 430/270.1, 430/281.1, 905, 913
See application file for complete search history.

(56) References Cited

U.S. PATENT DOCUMENTS

| 6,165,682 A | 12/2000 | Foster et al. |
| 6,210,856 B1 | 4/2001 | Lin et al. |
| 6,420,084 B1 | 7/2002 | Angelopoulos et al. |
| 6,994,946 B2 * | 2/2006 | Hatakeyama et al. ..... 430/270.1 |
| 7,232,638 B2 * | 6/2007 | Hatakeyama et al. ..... 430/270.1 |
| 7,294,450 B2 * | 11/2007 | Tarutani ................... 430/270.1 |
| 2002/0048720 A1 | 4/2002 | Sasaki et al. |
| 2002/0081520 A1 | 6/2002 | Sooriyakumaran et al. |
| 2002/0127490 A1 | 9/2002 | Brock et al. |
| 2005/0014090 A1 | 1/2005 | Hirayama et al. |
| 2005/0069819 A1 | 3/2005 | Shiobara |
| 2006/0246373 A1 | 11/2006 | Wang |

FOREIGN PATENT DOCUMENTS

| EP | 1 004 936 A | 5/2000 |
| EP | 1004936 A1 | 5/2000 |
| EP | 1500977 A1 * | 1/2005 |

(Continued)

OTHER PUBLICATIONS

B.J. Lin, "Semiconductor Foundry, Lithography, and Partners", SPIE Proceedings vol. 4688 2002.

(Continued)

*Primary Examiner*—Amanda C. Walke
(74) *Attorney, Agent, or Firm*—Sughrue Mion, PLLC

(57) ABSTRACT

A positive resist composition comprises:
(A) a resin capable of increasing its solubility in an alkali developer by action of an acid and not containing a silicon atom;
(B) a compound capable of generating an acid upon irradiation with actinic ray or radiation,
(C) a silicon atom-containing resin having at least one group selected from groups (X) to (Z),
  (X) an alkali-soluble group,
  (Y) a group capable of decomposing by action of an alkali developer to increase the solubility of resin (C) in an alkali developer,
  (Z) a group capable of decomposing by action of an acid to increase the solubility of resin (C) in an alkali developer; and
(D) a solvent.

12 Claims, 1 Drawing Sheet

DYNAMIC CONTACT ANGLE

STATIC CONTACT ANGLE

FOREIGN PATENT DOCUMENTS

| | | | |
|---|---|---|---|
| EP | 1517179 A1 * | 3/2005 |
| JP | 57-153433 A | 9/1982 |
| JP | 7-220990 A | 8/1995 |
| JP | 2001-51418 A | 2/2001 |
| WO | 2004/040371 A2 | 5/2004 |
| WO | WO 2004/068242 A1 | 8/2004 |
| WO | WO 2004/077158 A1 | 9/2004 |

OTHER PUBLICATIONS

J.A. Hoffnagle, et al., "Liquid Immersion Deep-Ultraviolet Interferometric Lithography", J. Vac. Sci. Technol. B 17(6), Nov./Dec. 1999.

Database WPI XP-002416204. AN 2001-560170. Derwent Publications Ltd., London, GB; & JP 2001 051418 A (Canon KK), Feb. 23, 2001.

* cited by examiner

US 7,611,820 B2

POSITIVE RESIST COMPOSITION AND PATTERN-FORMING METHOD USING THE SAME

BACKGROUND OF THE INVENTION

1. Field of the Invention

The present invention relates to a positive resist composition used in a manufacturing process of semiconductors, such as IC, manufacture of circuit substrates for liquid crystals, thermal heads and the like, and lithographic process of other photo-fabrication, and also relates to a pattern forming method using the same. In particular, the invention relates to a positive resist composition for immersion exposure suitable for exposure with an immersion projection exposure apparatus using far ultraviolet rays of wavelengths of 300 nm or less as the light source, and a pattern-forming method using the same.

2. Description of the Related Art

With the progress of fining of semiconductor elements, shortening of the wavelengths of exposure light source and increasing of the numerical aperture of the projection lens have advanced, and now exposure apparatus of NA 0.84 using an ArF excimer laser having wavelength of 193 nm as the light source have been developed. As generally known, these can be expressed by the following expressions:

$$(\text{Resolution}) = k_1 \cdot (\lambda/\text{NA})$$

$$(\text{Depth of focus}) = \pm k_2 \cdot \lambda/\text{NA}^2$$

wherein $\lambda$ is the wavelength of an exposure light source, NA is the numerical aperture of the projection lens, $k_1$ and $k_2$ are the coefficients concerning the process.

For further higher resolution by the shortening of wavelengths, an exposure apparatus with an $F_2$ excimer laser having wavelength of 157 nm as the light source has been studied, however, the materials of lens for use in the exposure apparatus and the materials of resist are extremely restricted for shortening of wavelengths, so that the realization of the reasonable manufacturing costs of the apparatus and materials and quality stabilization are very difficult, as a result, there are possibilities of missing an exposure apparatus and a resist having sufficient performances and stabilities within a required period of time.

As a technique for increasing resolution in optical microscope, a so-called immersion method of filling between a projection lens and a sample with a liquid of high refractive index (hereinafter also referred to as "immersion liquid") has been conventionally known.

As "the effect of immersion", the above resolution and depth of focus can be expressed by the following expressions in the case of immersion, taking $\lambda_0$ as the wavelength of the exposure light in the air, n as the refractive index of immersion liquid to the air, and $\text{NA}_0 = \sin\theta$ with $\theta$ as convergence half angle of the ray of light:

$$(\text{Resolution}) = k_1 \cdot (\lambda_0/n)/\text{NA}_0$$

$$(\text{Depth of focus}) = \pm k_2 \cdot (\lambda_0/n)/\text{NA}_0^2$$

That is, the effect of immersion is equivalent to the case of using exposure wavelength of the wavelength of 1/n. In other words, in the case of the projection optical system of the same NA, the depth of focus can be made n magnifications by immersion. This is effective for every pattern form, and can be combined with super resolution techniques such as a phase shift method and a deformation lighting method.

The apparatus applying this effect to the transfer of microfine image pattern of semiconductor element are introduced by JP-A-57-153433 and JP-A-7-220990.

The latest technical advancement of immersion exposure is reported in *SPIE Proc.*, 4688, 11 (2002), *J. Vac. Sci. Tecnol. B*, 17 (1999), *SPIE Proc.*, 3999, 2 (2000), and WO 2004/077158. When an ArF excimer laser is used as the light source, it is thought that pure water (refractive index at 193 nm: 1.44) is most promising in the light of the safety in handling, and the transmittance and the refractive index at 193 nm. When an $F_2$ excimer laser is used as the light source, a solution containing fluorine is discussed from the balance of the transmittance and the refractive index at 157 nm, but a sufficiently satisfactory solution from the viewpoint of environmental safety and refractive index has not been found yet. From the extent of the effect of immersion and the degree of completion of resist, it is thought that immersion exposure technique will be carried on an ArF exposure apparatus earliest.

From the advent of the resist for a KrF excimer laser (248 nm) on, an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed area to thereby generate an acid, utilizing the generated acid as the reactive catalyst to change an alkali-insoluble group to an alkali-soluble group by the bake after exposure (PEB: Post Exposure Bake), and removing the exposed area by alkali development.

The resist for an ArF excimer laser (wavelength: 193 nm) using the chemical amplification mechanism is now being a main current, but the improvement of line edge roughness is required when used in immersion exposure.

When a chemical amplification resist is applied to immersion exposure, it is appointed that since the resist layer inevitably touches an immersion liquid at the time of exposure, the resist layer decomposes and ingredients that adversely influence the immersion liquid ooze from the resist layer. WO 2004/068242 discloses that the resist performance changes by the immersion of a resist for ArF exposure in water before and after exposure and appoints this is a problem in immersion exposure.

Further, when exposure is performed with a scanning system immersion exposure in an immersion exposure process, the speed of exposure lowers if an immersion liquid does not move following the movement of a lens, so that there is the fear of influence on productivity. In the case where the immersion liquid is water, the resist film is preferably hydrophobic in view of good following ability of water.

SUMMARY OF THE INVENTION

An object of the invention is to provide a positive resist composition improved in line edge roughness. Another object is to provide a positive resist composition suitable for immersion exposure capable of giving a good pattern profile with immersion exposure similarly to ordinary exposure, and having good following ability of an immersion liquid, and a further object is to provide a pattern forming method using the same.

The invention has been achieved by a positive resist composition having the following constitution, and a pattern forming method using the same.

(1) A positive resist composition containing:
(A) a resin capable of increasing its solubility in an alkali developer by action of an acid and not containing a silicon atom;
(B) a compound capable of generating an acid upon irradiation with actinic ray or radiation,
(C) a silicon atom-containing resin having at least one group selected from groups (X) to (Z),
(X) an alkali-soluble group,
(Y) a group capable of decomposing by action of an alkali developer to increase the solubility of resin (C) in an alkali developer,
(Z) a group capable of decomposing by action of an acid to increase the solubility of resin (C) in an alkali developer; and
(D) a solvent.
(2) The positive resist composition as described in the above item (1), wherein resin (A) has a monocyclic or polycyclic alicyclic hydrocarbon structure.
(3) The positive resist composition as described in the item (1) or (2), wherein the silicon atom-containing resin (C) is a silicon atom-containing resin that is alkali-soluble and/or capable of increasing its solubility in an alkali developer by action of an acid.
(4) The positive resist composition as described in the item (1), (2) or (3), wherein the silicon atom-containing resin (C) is a resin that is alkali-soluble and does not increase its solubility in an alkali developer by action of an acid.
(5) The positive resist composition as described in the item (1), (2) or (3), wherein the silicon atom-containing resin (C) has at least one kind of repeating unit having a lactone group.
(6) The positive resist composition as described in the item (1), (2) or (3), wherein the silicon atom-containing resin (C) is a resin that is alkali-insoluble and capable of increasing its solubility in an alkali developer by action of an acid.
(7) The positive resist composition as described in any of the items (1) to (6), which is exposed with vacuum ultraviolet rays of wavelengths of 200 nm or less.
(8) The positive resist composition as described in any of the items (1) to (7), wherein the weight average molecular weight of the silicon atom-containing resin (C) is from 1,000 to 100,000.
(9) The positive resist composition as described in any of the items (1) to (8), wherein the silicon atom-containing resin (C) further contains a fluorine atom.
(10) The positive resist composition as described in any of the items (1) to (9), wherein an addition amount of the silicon atom-containing resin (C) is from 0.1 to 5 mass % of a total solids content in the composition.
(11) The positive resist composition as described in any of the items (1) to (10), wherein the resin (A) has a repeating unit having an alicyclic hydrocarbon group substituted with a hydroxyl group or a cyano group.
(12) A pattern-forming method comprising: forming a resist film with the resist composition as described in any of the items (1) to (11); exposing the resist film; and developing the exposed resist film.

Figure 1:
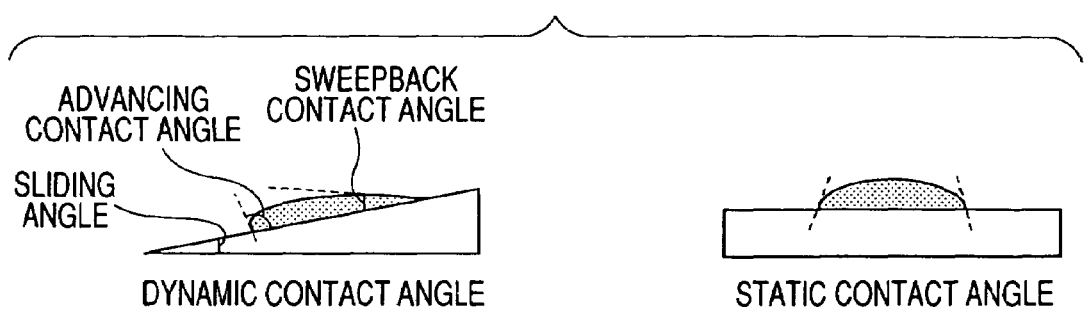
FIG. 1 is a schematic view showing a sweepback contact angle.

12 denotes a resist-coated wafer, 13 denotes a kite string, 14 denotes a quartz plate, 15 denotes a distilled water, 16 denotes a motor, 17 denotes an area where distilled water remains under a quartz plate, and 18 denotes an area where air gets in under a quartz plate.

DETAILED DESCRIPTION OF THE INVENTION

The present invention will be described in detail below.
In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).
(A) Resins capable of increasing the solubility in an alkali developer by the action of an acid and not containing a silicon atom:

A resin for use in a resist composition in the invention is a resin capable of decomposing by the action of an acid to increase solubility in an alkali developer and not containing a silicon atom (an acid-decomposable resin), and having a group capable of decomposing by the action of an acid to generate an alkali-soluble group (hereinafter also referred to as "an acid-decomposable group") on the main chain or side chain or both of the main chain and side chain of the resin (hereinafter also referred to as an acid-decomposable resin or resin (A)).

As the specific examples of resin (A), poly(hydroxy-styrene) derivatives including a meta, para or ortho substitution product as shown below.

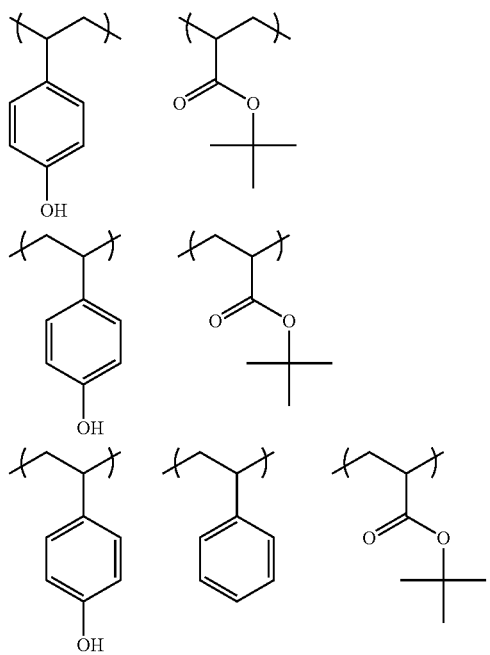

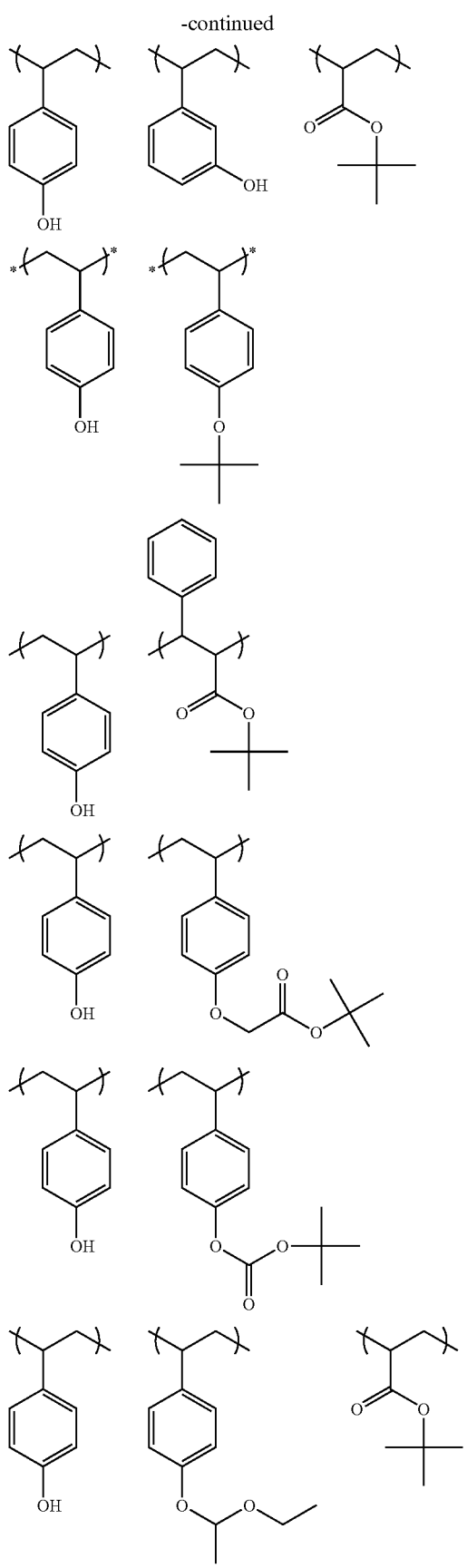
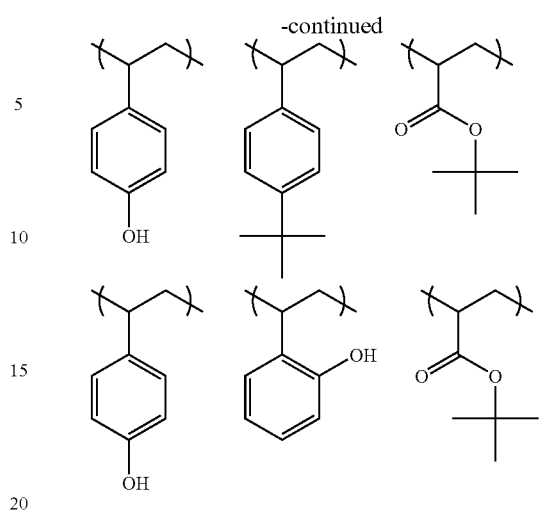

The alkali-soluble groups include groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)-methylene group, an (alkylsulfonyl)(alkylcarbonyl)imido group, a bis(alkylcarbonyl)methylene group, a bis(alkyl-carbonyl)imido group, a bis(alkylsulfonyl)methylene group, a bis(alkylsulfonyl)imido group, a tris(alkylcarbonyl)-methylene group, or a tris(alkylsulfonyl)methylene group.

As the preferred alkali-soluble groups, a carboxylic acid group, a fluorinated alcohol group (preferably hexafluoroisopropanol), and a sulfonic acid group are exemplified.

The preferred groups capable of decomposing by the action of an acid (acid-decomposable groups) are groups obtained by substituting the hydrogen atoms of these alkali-soluble groups with groups capable of being desorbed by the action of an acid.

The preferred acid-decomposable groups are a cumyl ester group, an enol ester group, an acetal ester group, a tertiary alkyl ester group, etc., and more preferred group is a tertiary alkyl ester group.

It is preferred that resin (A) has a monocyclic or polycyclic alicyclic hydrocarbon structure.

It is preferred for resin (A) to be a resin containing at least one repeating unit selected from the group consisting of a repeating unit having a partial structure containing alicyclic hydrocarbon represented by any of the following formulae (pI) to (pV), and a repeating unit represented by the following formula (II-AB) (hereinafter also referred to as alicyclic hydrocarbon series acid-decomposable resin).

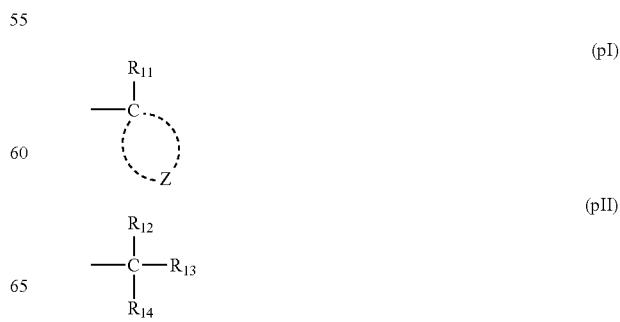

-continued

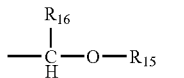
(pIII)

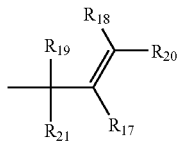
(pIV)

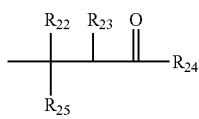
(pV)

In formulae (pI) to (pV), $R_{11}$ represents a methyl group, an ethyl group, an n-propyl group, an isopropyl group, an n-butyl group, an isobutyl group, or a sec-butyl group; and Z represents an atomic group necessary to form a cycloalkyl group together with a carbon atom.

$R_{12}$, $R_{13}$, $R_{14}$, $R_{15}$ and $R_{16}$ each represents a straight chain or branched alkyl group having from 1 to 4 carbon atoms, or a cycloalkyl group, provided that at least one of $R_{12}$ to $R_{14}$, or either $R_{15}$ or $R_{16}$ represents a cycloalkyl group.

$R_{17}$, $R_{18}$, $R_{19}$, $R_{20}$ and $R_{21}$ each represents a hydrogen atom, a straight chain or branched alkyl group having from 1 to 4 carbon atoms, or a cycloalkyl group, provided that at least one of $R_{17}$ to $R_{21}$ represents a cycloalkyl group, and either $R_{19}$ or $R_{21}$ represents a straight chain or branched alkyl group having from 1 to 4 carbon atoms, or a cycloalkyl group.

$R_{22}$, $R_{23}$, $R_{24}$ and $R_{25}$ each represents a hydrogen atom, a straight chain or branched alkyl group having from 1 to 4 carbon atoms, or a cycloalkyl group, provided that at least one of $R_{22}$ to $R_{25}$ represents a cycloalkyl group, and $R_{23}$ and $R_{24}$ may be bonded to each other to form a ring.

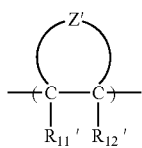
(II-AB)

In formula (II-AB), $R_{11}'$ and $R_{12}'$ each represents a hydrogen atom, a cyano group, a halogen atom, or an alkyl group.

Z' contains two bonded carbon atoms (C—C) and represents an atomic group to form an alicyclic structure.

The repeating unit represented by formula (II-AB) is preferably a repeating unit represented by the following formula (II-AB1) or (II-AB2).

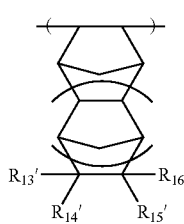
(II-AB1)

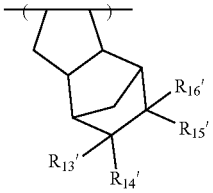
(II-AB2)

In formulae (II1-AB1) and (II-AB2), $R_{13}'$, $R_{14}'$, $R_{15}'$ and $R_{16}'$ each represents a hydrogen atom, a halogen atom, a cyano group, —COOH, —COOR$_5$, a group capable of decomposing by the action of an acid, —C(=O)—X-A'-R$_{17}'$, an alkyl group, or a cycloalkyl group, and at least two of $R_{13}'$ to $R_{16}'$ may be bonded to form a ring.

$R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or a group having a lactone structure.

$R_6$ represents an alkyl group or a cycloalkyl group.

n represents 0 or 1.

In formulae (pI) to (pV), the alkyl group represented by $R_{12}$ to $R_{25}$ is a straight chain or branched alkyl group having from 1 to 4 carbon atoms.

The cycloalkyl groups represented by $R_{11}$ to $R_{25}$ or the cycloalkyl groups formed by Z and carbon atoms may be monocyclic or polycyclic. Specifically, groups having a monocyclic, bicyclic, tricyclic or tetracyclic structure having 5 or more carbon atoms can be exemplified. The carbon atom number of these cycloalkyl groups is preferably from 6 to 30, and especially preferably from 7 to 25. These cycloalkyl groups may each have a substituent.

As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, a tetracyclododecanyl group, and a tricyclodecanyl group.

These alkyl groups and cycloalkyl groups may further have a substituent, and as the further substituents, an alkyl group (having from 1 to 4 carbon atoms), a halogen atom, a hydroxyl group, an alkoxyl group (having from 1 to 4 carbon atoms), a carboxyl group, and an alkoxycarbonyl group (having from 2 to 6 carbon atoms) can be exemplified. As the substituents that these alkyl group, alkoxyl group and alkoxycarbonyl group may further have, a hydroxyl group, a halogen atom and an alkoxyl group are exemplified.

The structures represented by formulae (pI) to (pV) in the above resin can be used for the protection of alkali-soluble groups.

As a repeating unit having an alkali-soluble group protected with the structure represented by any of formulae (pI) to (pV), a repeating unit represented by the following formula (pA) is preferred.

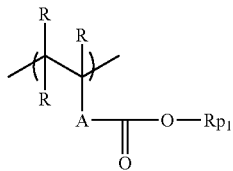

(pA)

In formula (pA), R represents a hydrogen atom, a halogen atom, or a straight chain or branched alkyl group having from 1 to 4 carbon atoms. A plurality of R may be the same or different.

A represents a single group or a combination comprising two or more groups selected from the group consisting of a single bond, an alkylene group, an ether group, a thioether group, a carbonyl group, an ester group, an amido group, a sulfonamido group, a urethane group, and a urea group, and preferably represents a single bond.

$Rp_1$ represents a group represented by any of formulae (pI) to (pV).

The repeating unit represented by (pA) is most preferably a repeating unit by 2-alkyl-2-adamantyl (meth)acrylate, or dialkyl(1-adamantyl)methyl (meth)acrylate.

The specific examples of the repeating units represented by formula (pA) are shown below.

(In the formulae, Rx represents H, CH$_3$, CF$_3$, CH$_2$OH, or Rxa, and Rxa represents an alkyl group having from 1 to 4 carbon atoms.)

1

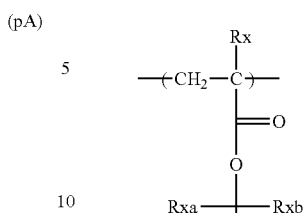

2

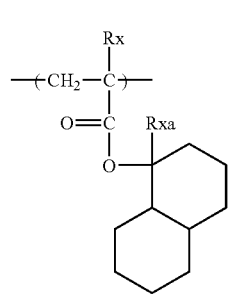

-continued

3

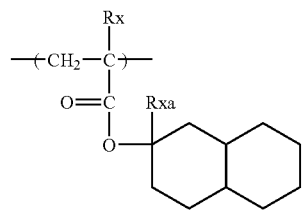

4

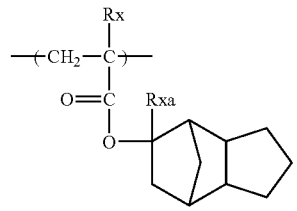

5

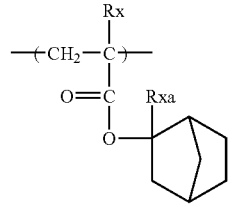

6

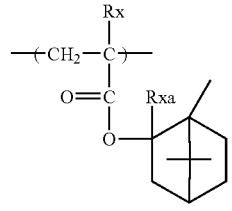

7

8

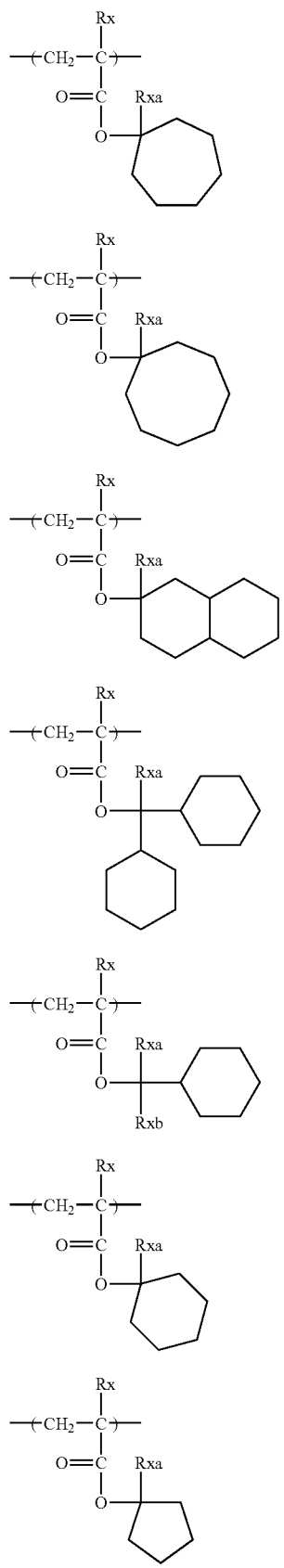
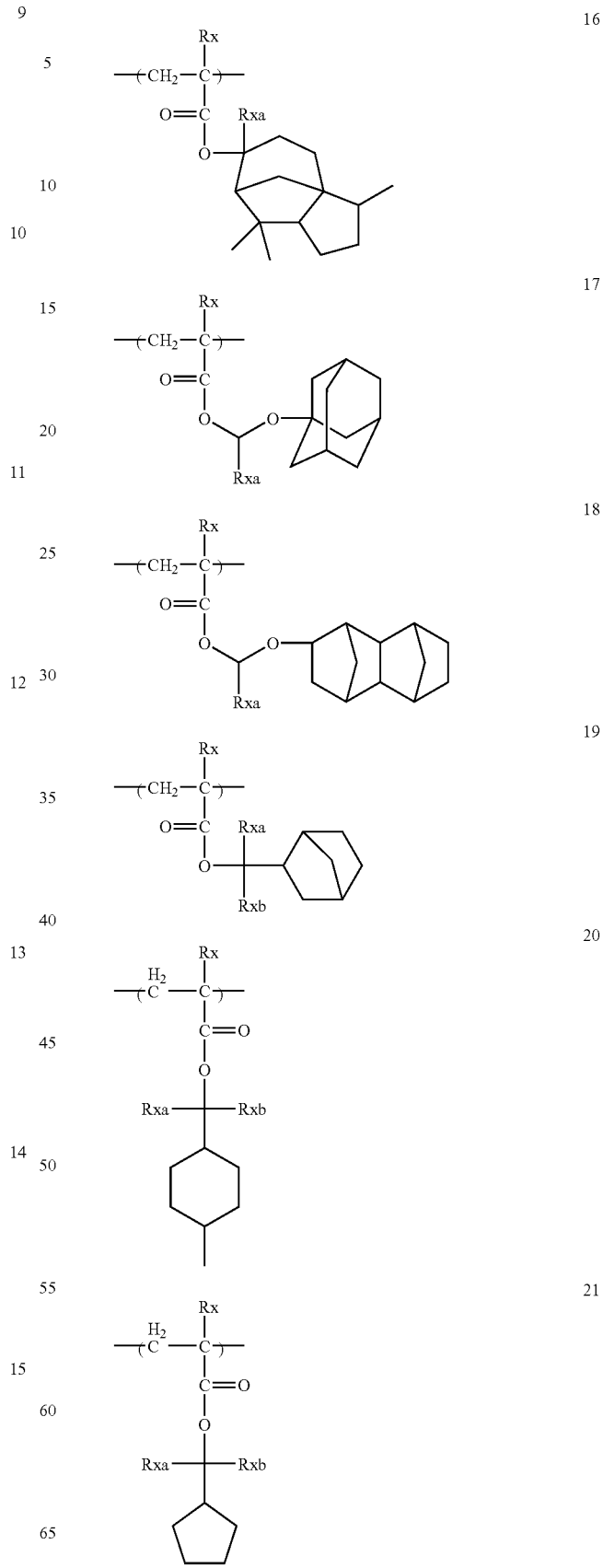

-continued

[22]

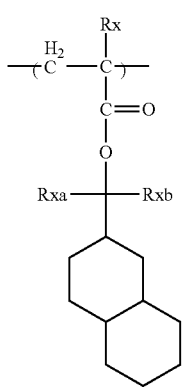

As the halogen atoms represented by $R_{11}'$ and $R_{12}'$ in formula (II-AB), a chlorine atom, a bromine atom, a fluorine atom and an iodine atom are exemplified.

As the alkyl groups represented by $R_{11}'$ and $R_{12}'$, straight chain or branched alkyl groups having from 1 to 10 carbon atoms are preferred.

The atomic group for forming an alicyclic structure represented by Z' is an atomic group for forming a repeating unit of alicyclic hydrocarbon to the resin, which may have a substituent, and an atomic group for forming a bridged alicyclic structure forming a bridged alicyclic hydrocarbon repeating unit is especially preferred.

As the skeleton of alicyclic hydrocarbon formed, the same alicyclic hydrocarbon groups as those represented by $R_{11}$ to $R_{25}$ in formulae (pI) to (pV) are exemplified.

The skeleton of alicyclic hydrocarbon may have a substituent, and as the substituents, the groups represented by $R_{13}'$ to $R_{16}'$ in formula (II-AB1) or (II-AB2) can be exemplified.

In the alicyclic hydrocarbon series acid-decomposable resin in the invention, a group capable of decomposing by the action of an acid can be contained in at least a repeating unit having a partial structure containing alicyclic hydrocarbon represented by any of formulae (pI) to (pV), a repeating unit represented by formula (II-AB), and a repeating unit of other copolymer components described later.

Various substituents of the groups represented by $R_{13}'$ to $R_{16}'$ in formula (II-AB1) or (II-AB2) can be substituents of an atomic group in formula (II-AB) for forming an alicyclic structure or an atomic group Z for forming a bridged alicyclic structure.

The specific examples of a repeating unit represented by formula (II-AB1) or (II-AB2) are shown below, but the invention is not restricted thereto.

[II-1]

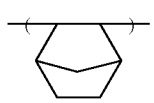

[II-2]

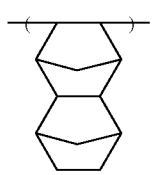

[II-3]

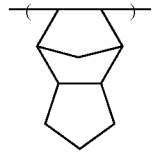

[II-4]

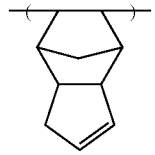

[II-5]

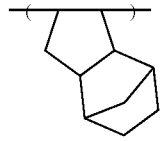

[II-6]

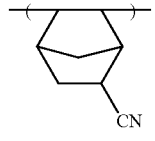

[II-7]

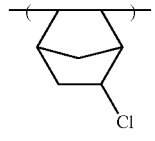

[II-8]

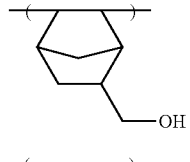

[II-9]

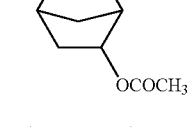

[II-10]

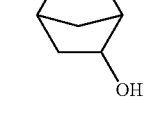

[II-11]

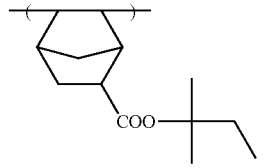

[II-12]

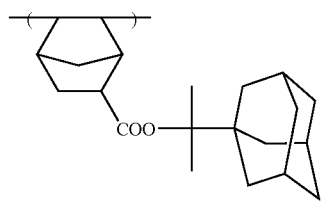

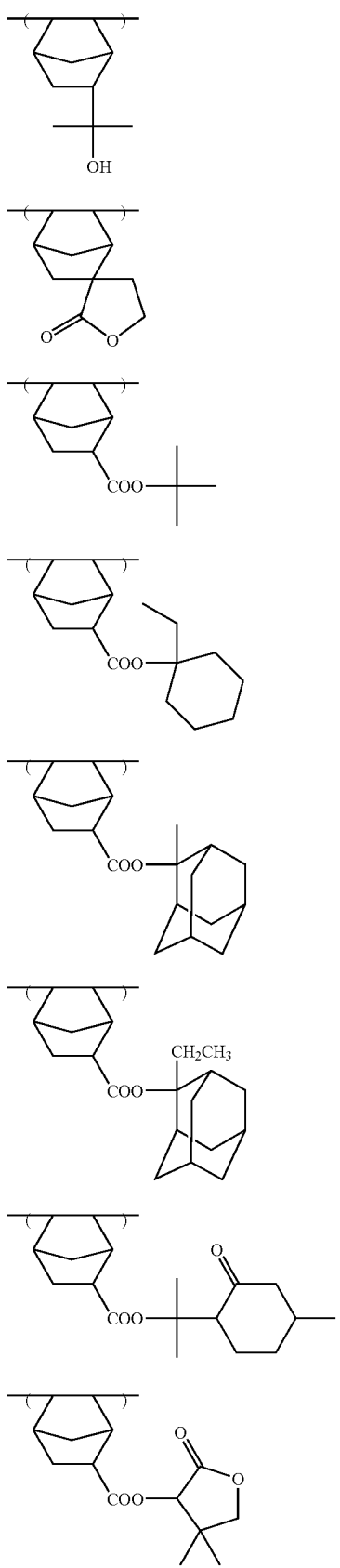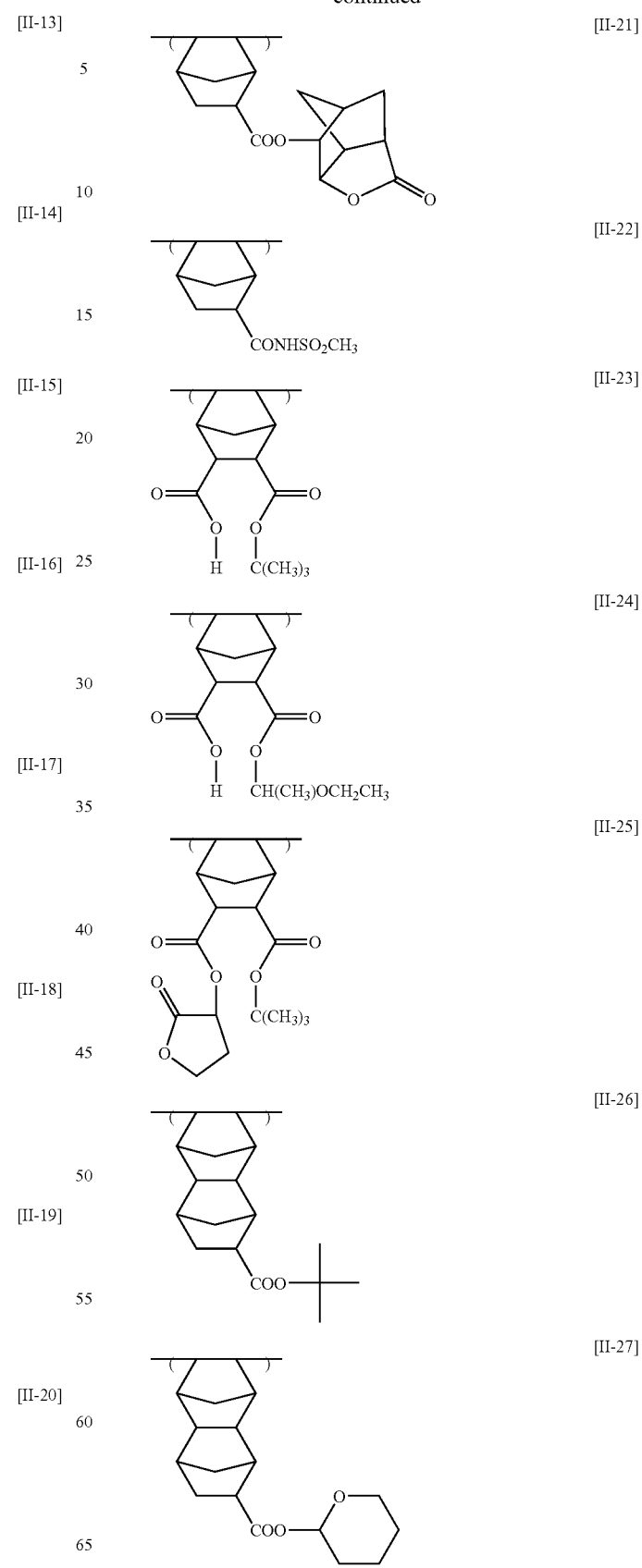

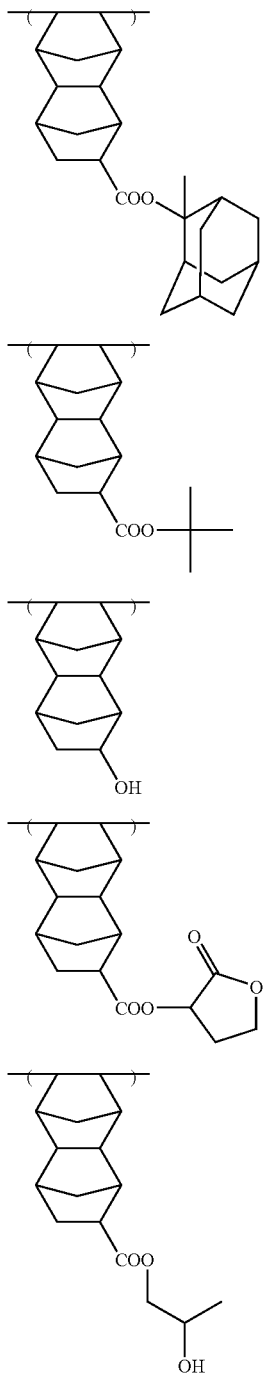

It is preferred for the alicyclic hydrocarbon series acid-decomposable resin in the invention to have a group having a lactone ring. As the groups having a lactone ring, any groups can be used so long as they have a lactone ring, but preferably groups having 5- to 7-membered ring lactone structures, and 5- to 7-membered ring lactone structures condensed with other ring structures in the form of forming a bicyclo structure or a spiro structure are preferred. A group having a lactone structure represented by any of the following formulae (LC1-1) to (LC1-16) is more preferred. The group having a lactone structure may be directly bonded to the main chain of a polymer. Preferred lactone structures are (LC1-1), (LC1-4) (LC1-5), (LC1-6), (LC1-13) and (LC1-14). By the use of a lactone structure, line edge roughness and development defect are bettered.

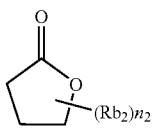

LC1-1

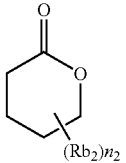

LC1-2

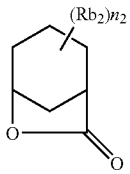

LC1-3

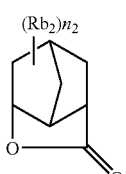

LC1-4

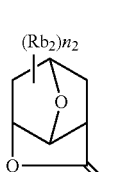

LC1-5

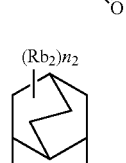

LC1-6

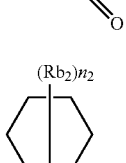

LC1-7

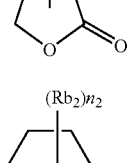

LC1-8

-continued

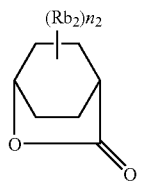
LC1-9

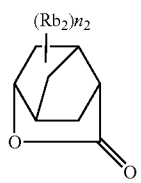
LC1-10

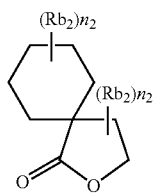
LC1-11

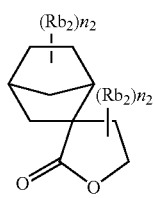
LC1-12

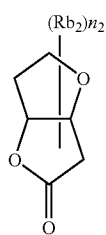
LC1-13

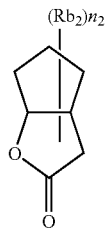
LC1-14

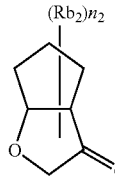
LC1-15

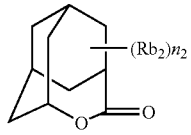
LC1-16

A lactone structural site may have or may not have a substituent ($Rb_2$). Preferred substituent ($Rb_2$) is an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, or an acid-decomposable group. $n_2$ represents an integer of from 0 to 4. When $n_2$ is 2 or more, a plurality of $Rb_2$ may be the same or different, and a plurality of $Rb_2$ may be bonded to each other to form a ring.

As the repeating units having a group having a lactone structure represented by any of formulae (LC1-1) to (LC1-16), a repeating unit represented by formula (II-AB1) or (II-AB2) in which at least one of $R_{13}'$ to $R_{16}'$ is a group represented by any of formulae (LC1-1) to (LC1-16) (e.g., $R_5$ of —$COOR_5$ is a group represented by any of formulae (LC1-1) to (LC1-16)), or a repeating unit represented by the following formula (AI) can be exemplified.

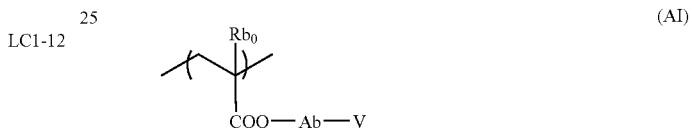
(AI)

In formula (AI), $Rb_0$ represents a hydrogen atom, a halogen atom, or an alkyl group having from 1 to 4 carbon atoms. As the examples of preferred substituents that the alkyl group represented by $Rb_0$ may have, a hydroxyl group and a halogen atom are exemplified.

As the halogen atom represented by $Rb_0$, a fluorine atom, a chlorine atom, a bromine atom, and an iodine atom are exemplified. $Rb_0$ preferably represents a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group of combining these groups, and preferably a single bond or a linking group represented by -$Ab_1$-$CO_2$—.

$Ab_1$ represents a straight chain or branched alkylene group, or a monocyclic or polycyclic cycloalkylene group, and preferably a methylene group, an ethylene group, a cyclohexyl group, an adamantyl group, or a norbomyl group.

V represents a group represented by any of formulae (LC1-1) to (LC1-16).

Repeating units having a lactone structure generally have optical isomers, and any optical isomer may be used. One kind of optical isomer may be used alone, or a plurality of optical isomers may be used as mixture. When one kind of optical isomer is used, the optical purity (ee) of the optical isomer is preferably 90 or more, and more preferably 95 or more.

The specific examples of repeating units having a lactone structure are shown below, but the invention is not restricted to these compounds.

(In the formulae, Rx represents H, CH₃, CH₂OH or CF₃.)
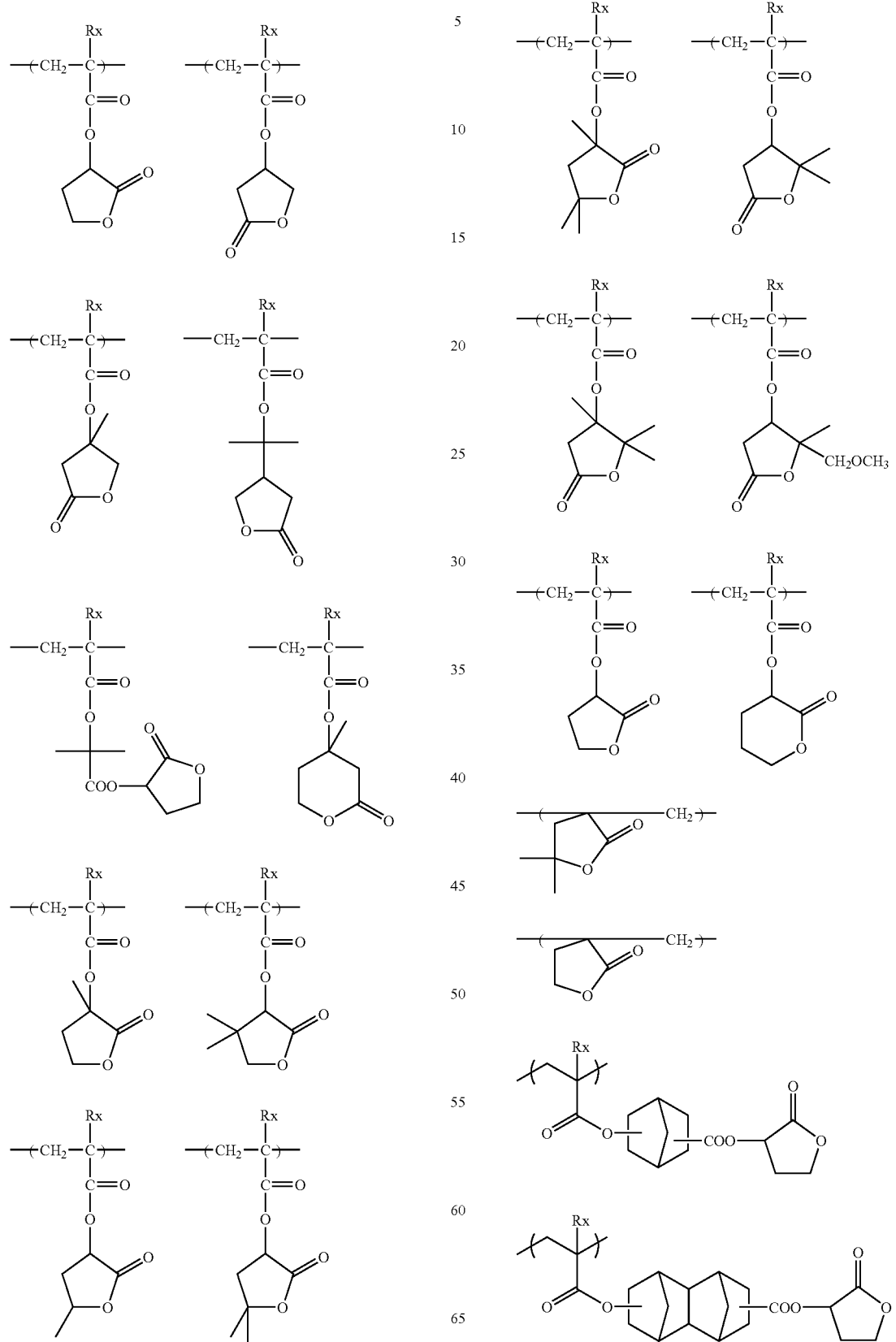
-continued

-continued
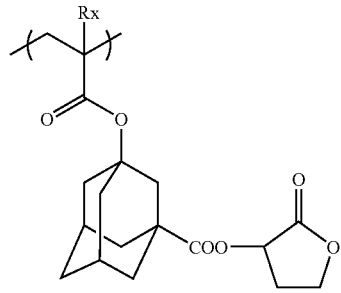
(In the formulae, Rx represents H, CH₃, CH₂OH or CF₃.)
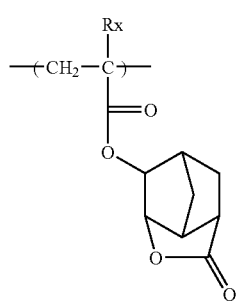 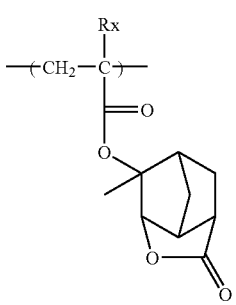
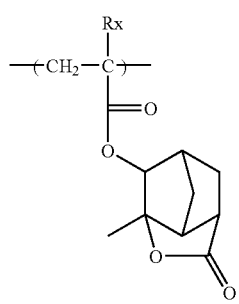 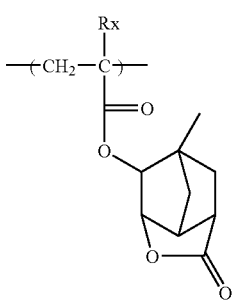
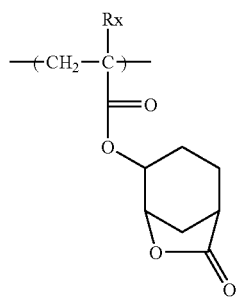 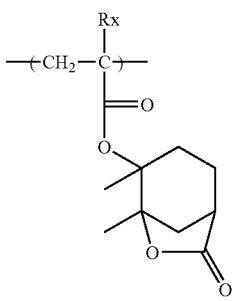
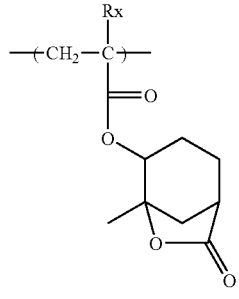
-continued
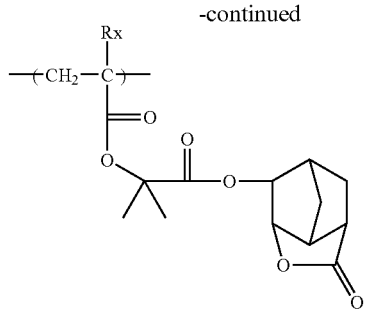
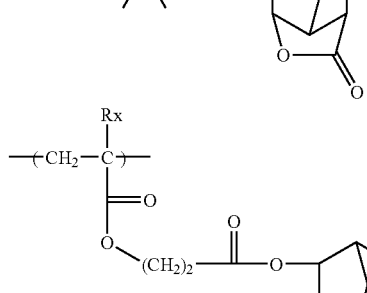
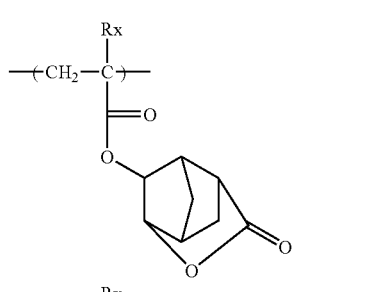
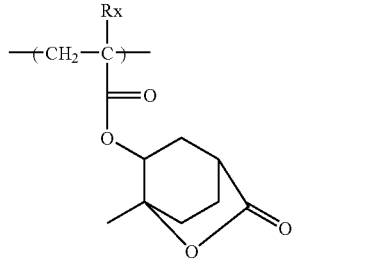
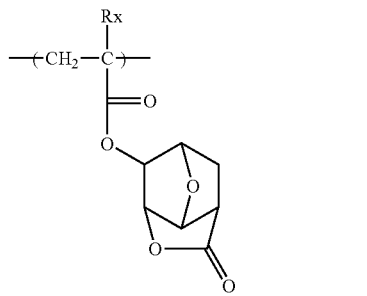
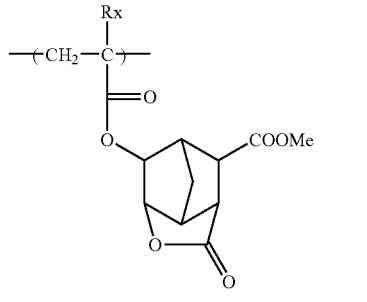

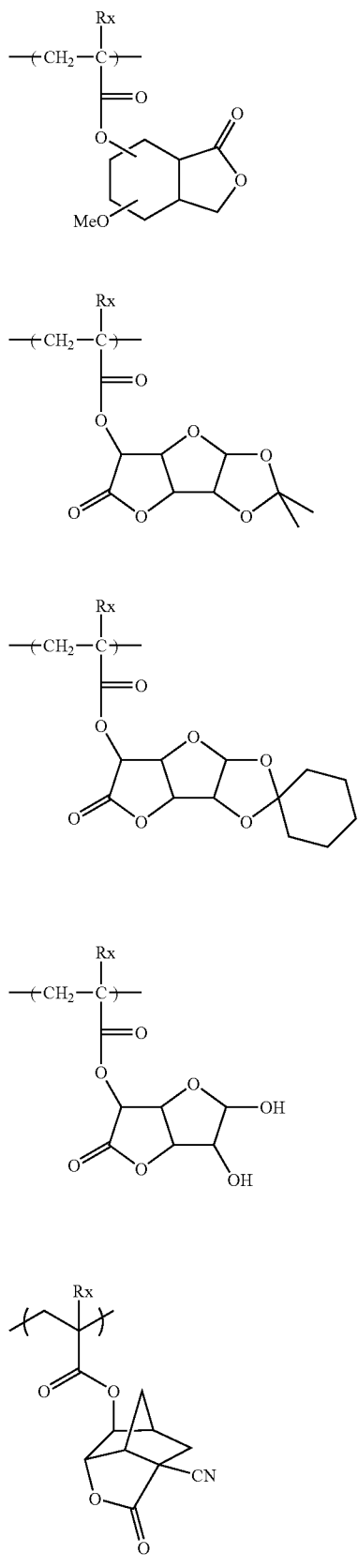
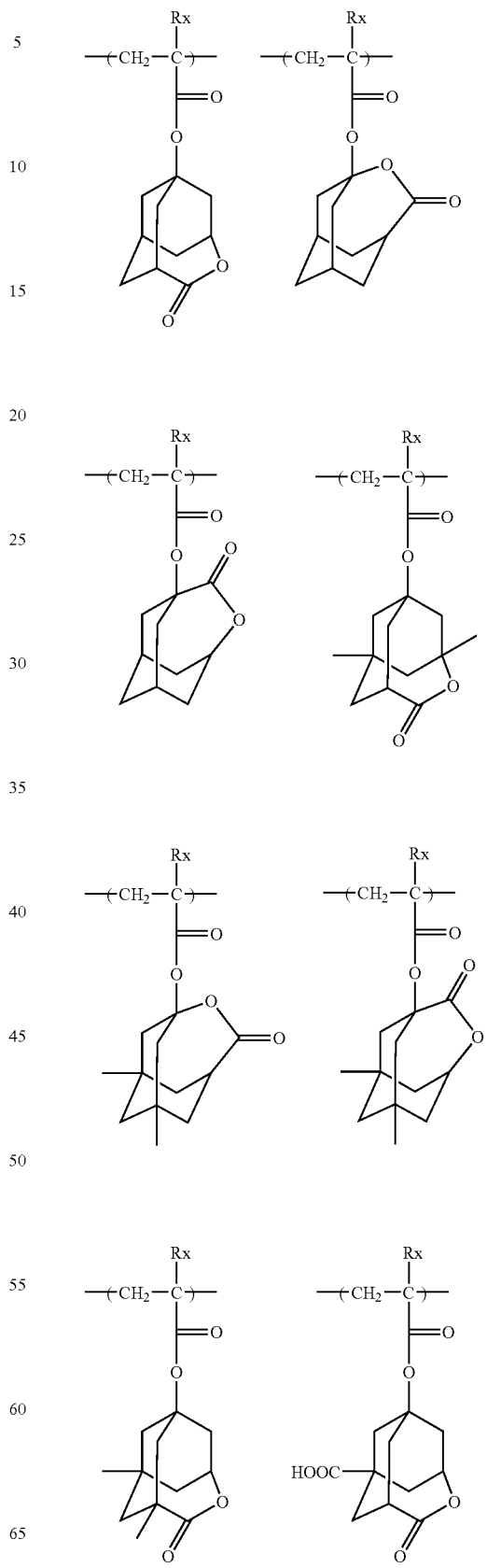
(In the formulae, Rx represents H, CH₃, CH₂OH or CF₃.)

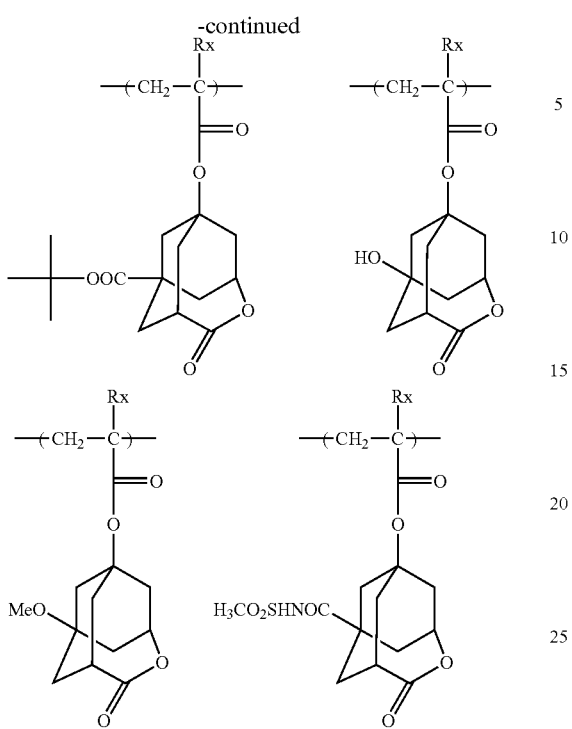

It is preferred that resin (A) of the invention has a repeating unit having an alicyclic hydrocarbon structure substituted with a polar group, by which adhesion with a substrate and affinity with a developing solution are improved. The polar group is preferably a hydroxyl group or a cyano group.

As preferred example of the alicyclic hydrocarbon structure substituted with a polar group, a structure represented by the following formula (VIIa) or (VIIb) is exemplified.

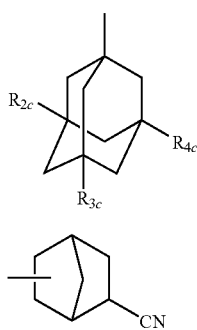

In formula (VIIa), $R_{2c}$, $R_{3c}$ and $R_{4c}$ each represents a hydrogen atom, a hydroxyl group, or a cyano group, provided that at least one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group and the remainder represents a hydrogen atom, and more preferably two of $R_2c$, $R_{3c}$ and $R_{4c}$ represent a hydroxyl group and the remainder represents a hydrogen atom.

The group represented by formula (VIIa) or (VIIb) is preferably dihydroxy or monohydroxy, preferably dihydroxy.

As the repeating unit having a group represented by formula (VIIa) or (VIIb), a repeating unit represented by formula (II-AB1) or (II-AB2) in which at least one of $R_{13}'$ to $R_{16}'$ is a group represented by formula (VIIa) or (VIIb) (e.g., $R_5$ of —COOR$_5$ is a group represented by formula (VIIa) or (VIIb)), or a repeating unit represented by the following formula (AIIa) or (AIIb) can be exemplified.

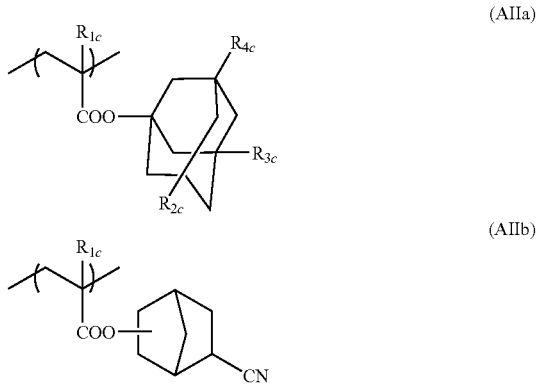

In formulae (AIIa) and (AIIb), $R_{1c}$, $R_{2c}$, $R_{3c}$ and $R_{4c}$ each represents a hydrogen atom, a methyl group, a trifluoromethyl group, or a hydroxymethyl group.

The specific examples of the repeating units having a structure represented by formula (AIIa) or (AIIb) are shown below, but the invention is not restricted thereto.

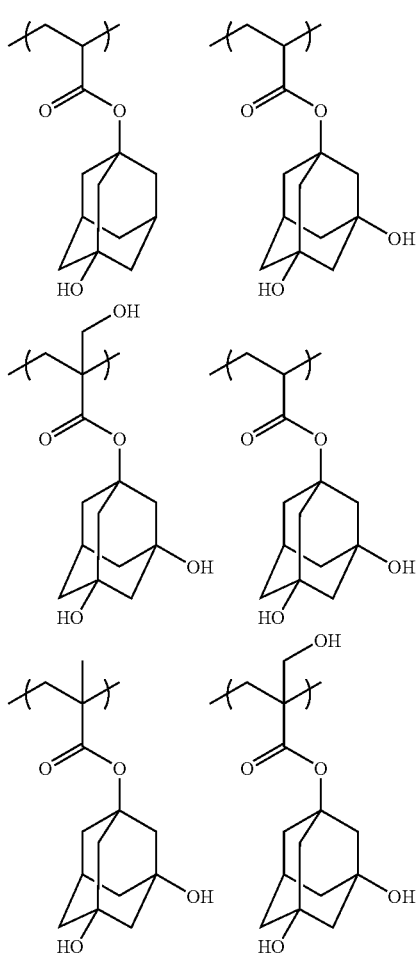

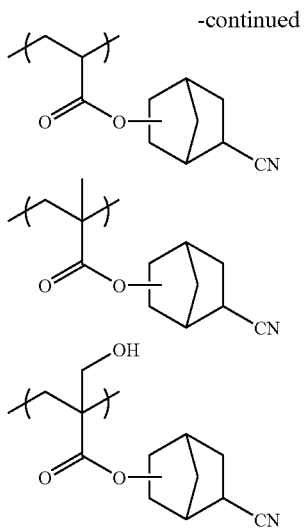

The alicyclic hydrocarbon series acid-decomposable resin in the invention may have a repeating unit represented by the following formula (VII).

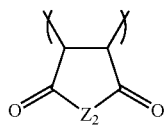

(VIII)

In formula (VIII), $Z_2$ represents —O— or —N($R_{41}$)—. $R_{41}$ represents a hydrogen atom, a hydroxyl group, an alkyl group, or —OSO$_2$—$R_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom) or the like.

As the specific examples of the repeating units represented by formula (VIII), the following compounds are exemplified, but the invention is not restricted thereto.

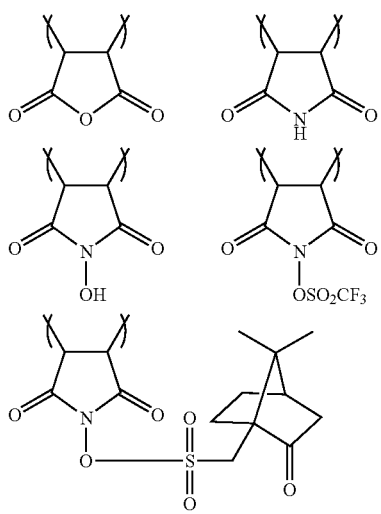

It is preferred for the alicyclic hydrocarbon series acid-decomposable resin in the invention to have a repeating unit having an alkali-soluble group, and it is more preferred to have a repeating unit having a carboxyl group, by which the resolution in the use for contact hole is enhanced. As the repeating units having a carboxyl group, a repeating unit in which a carboxyl group is directly bonded to the main chain of a resin such as a repeating unit by acrylic acid or methacrylic acid, and a repeating unit in which a carboxyl group is bonded to the main chain of a resin via a linking group are preferably used. The linking group may have a monocyclic or polycyclic hydrocarbon structure. Acrylic acid and methacrylic acid are most preferred.

The alicyclic hydrocarbon series acid-decomposable resin in the invention may further have a repeating unit having from one to three groups represented by the following formula (F1), by which line edge roughness property is improved.

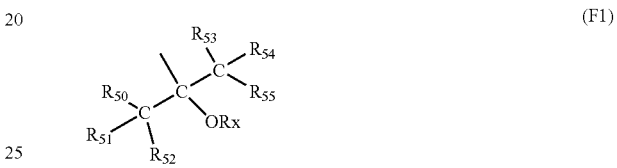

(F1)

In formula (F1), $R_{50}$, $R_{51}$, $R_{52}$, $R_{53}$, $R_{54}$ and $R_{55}$ each represents a hydrogen atom, a fluorine atom, or an alkyl group, provided that at least one of $R_{50}$ to $R_{55}$ represents a fluorine atom, or an alkyl group in which at least one hydrogen atom is substituted with a fluorine atom.

Rx represents a hydrogen atom or an organic group (preferably an acid-decomposable protective group, an alkyl group, a cycloalkyl group, an acyl group, or an alkoxycarbonyl group).

The alkyl group represented by $R_{50}$ to $R_{55}$ may be substituted with a halogen atom, e.g., a fluorine atom, or a cyano group, and preferably an alkyl group having from 1 to 3 carbon atoms, e.g., a methyl group and a trifluoromethyl group can be exemplified. It is preferred that all of $R_{50}$ to $R_{55}$ represent a fluorine atom.

The organic group represented by Rx may have an acid-decomposable protective group and a substituent, e.g., an alkyl group, a cycloalkyl group, an acyl group, an alkylcarbonyl group, an alkoxycarbonyl group, an alkoxycarbonylmethyl group, an alkoxymethyl group, and a 1-alkoxyethyl group are preferred.

The repeating unit having the group represented by formula (F1) is preferably a repeating unit represented by the following formula (F2).

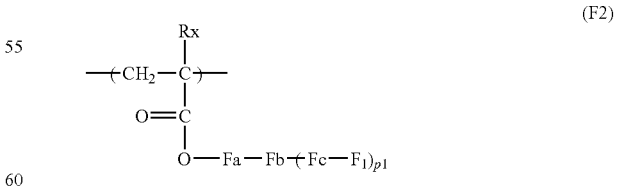

(F2)

In formula (F2), Rx represents a hydrogen atom, a halogen atom, or an alkyl group. As preferred substituents that the alkyl group represented by Rx may have, a hydroxyl group and a halogen atom are exemplified.

Fa represents a single bond or a straight chain or branched alkylene group, and preferably a single bond.

Fb represents a monocyclic or polycyclic hydrocarbon group.

Fc represents a single bond or a straight chain or branched alkylene group, and preferably a single bond or a methylene group.

$F_1$ represents a group represented by formula (F1).

$p_1$ is from 1 to 3.

As the cyclic hydrocarbon group represented by Fb, a cyclopentyl group, a cyclohexyl group, or a norbornyl group is preferred.

The specific examples of the repeating units having the structure represented by formula (F1) are shown below, but the invention is not restricted thereto.

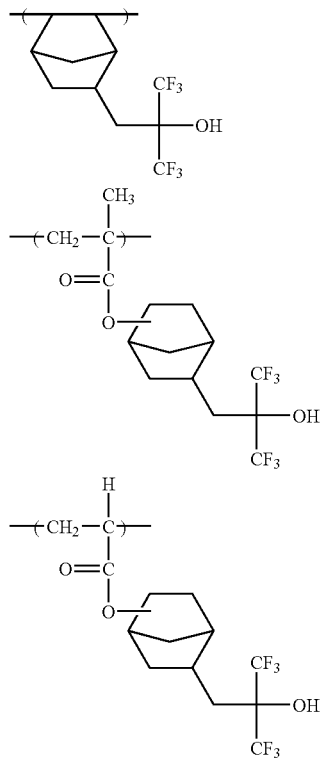

The alicyclic hydrocarbon series acid-decomposable resin in the invention can contain various kinds of repeating structural units, besides the above repeating structural units, for the purpose of the adjustments of dry etching resistance, aptitude for standard developing solutions, adhesion to a substrate, resist profile, and general requisite characteristics of resists, e.g., resolution, heat resistance and sensitivity.

As these repeating structural units, the repeating structural units corresponding to the monomers shown below can be exemplified, but the invention is not restricted thereto.

By containing such various repeating structural units, fine adjustment of performances required of the alicyclic hydrocarbon series acid-decomposable resin, in particular the following performances, becomes possible, that is, (1) solubility in a coating solvent, (2) a film-forming property (a glass transition point), (3) alkali developability, (4) decrease of layer thickness (hydrophobic-hydrophilic property, selection of an alkali-soluble group), (5) adhesion of an unexposed area to a substrate, and (6) dry etching resistance.

The examples of such monomers include compounds having one addition polymerizable unsaturated bond selected from acrylic esters, methacrylic esters, acrylamides, methacryl-amides, allyl compounds, vinyl ethers, vinyl esters, etc.

In addition to the aforementioned compounds, addition polymerizable unsaturated compounds copolymerizable with the monomers corresponding to the above various repeating structural units may be used for copolymerization.

In the alicyclic hydrocarbon series acid-decomposable resin, the molar ratio of the content of each repeating structural unit is arbitrarily set to adjust dry etching resistance and aptitude for standard developing solutions of a resist, adhesion to a substrate, and resist profile, in addition to these characteristics, general requisite characteristics of a resist, e.g., resolution, heat resistance and sensitivity.

As preferred embodiments of the alicyclic hydrocarbon series acid-decomposable resin in the invention, the following resins can be exemplified.

(1) A resin having a repeating unit having a partial structure containing the alicyclic hydrocarbon represented by any of formulae (pI) to (pV) (a side chain type), preferably a resin having a (meth)acrylate repeating unit having the structure of any of formulae (pI) to (pV);

(2) A resin having a repeating unit represented by formula (II-AB) (a main chain type); however, the following is further exemplified as embodiment (2):

(3) A resin having a repeating unit represented by formula (II-AB), a maleic anhydride derivative and a (meth)acrylate structure (a hybrid type).

In the alicyclic hydrocarbon series acid-decomposable resin, the content of a repeating unit having an acid-decomposable group is preferably from 10 to 60 mol % in the total repeating structural units, more preferably from 20 to 50 mol %, and still more preferably from 25 to 40 mol %.

In the alicyclic hydrocarbon series acid-decomposable resin, the content of a repeating unit having a partial structure containing the alicyclic hydrocarbon represented by any of formulae (pI) to (pV) is preferably from 25 to 70 mol % in the total repeating structural units, more preferably from 35 to 65 mol %, and still more preferably from 40 to 60 mol %.

In the alicyclic hydrocarbon series acid-decomposable resin, the content of a repeating unit represented by formula (II-AB) is preferably from 10 to 60 mol % in the total repeating structural units, more preferably from 15 to 55 mol %, and still more preferably from 20 to 50 mol %.

In resin (A), the content of a repeating unit having an acid-decomposable group is preferably from 5 to 50 mol % in the total repeating structural units, more preferably from 10 to 40 mol %, and still more preferably from 15 to 35 mol %.

In resin (A), the content of a repeating unit having a monocyclic or polycyclic alicyclic hydrocarbon structure is preferably from 25 to 70 mol % in the total repeating structural units, more preferably from 35 to 65 mol %, and still more preferably from 40 to 60 mol %.

In resin (A), the content of a repeating unit having an alicyclic hydrocarbon group substituted with a polar group is preferably from 5 to 50 mol % in the total repeating structural units, more preferably from 5 to 40 mol %, and still more preferably from 10 to 30 mol %.

The content of the repeating structural units on the basis of the monomers of further copolymerization components in the resin can also be optionally set according to the desired resist performances, and the content is generally preferably 99 mol % or less to the total mol number of the repeating structural unit having a partial structure containing the alicyclic hydrocarbon represented by any of formulae (pI) to (pV) and the repeating unit represented by formula (II-AB), more preferably 90 mol % or less, and still more preferably 80 mol % or less.

When the composition in the invention is for ArF exposure, it is preferred that resin (A) does not have an aromatic group from the aspect of the transparency to ArF rays.

The alicyclic hydrocarbon series acid-decomposable resin for use in the invention is preferably such that all the repeating units consist of (meth)acrylate series repeating units. In this case, any of the following cases can be used, that is, a case where all the repeating units are (meth)acrylate series repeating units, a case where all the repeating units are acrylate series repeating units, and a case where the repeating units are mixture of (meth)acrylate series repeating units and acrylate series repeating units, but it is preferred that acrylate series repeating units account for 50 mol % or less of all the repeating units. More preferred are ternary copolymers comprising from 25 to 50 mol % of (meth)acrylate series repeating units having the alicyclic hydrocarbon represented by any of formulae (pI) to (pV), from 25 to 50 mol % of (meth)acrylate series repeating units having a lactone structure, and from 5 to 30 mol % of (meth)acrylate series repeating units having an alicyclic hydrocarbon structure substituted with a polar group, and quaternary copolymers further containing from 5 to 20 mol % of (meth)acrylate series repeating units having a carboxyl group or a structure represented by formula (F1).

The weight average molecular weight of resin (A) for use in the invention is preferably in the range of from 1,500 to 100,000, more preferably in the range of from 2,000 to 70,000, and especially preferably in the range of from 3,000 to 50,000.

Resin (A) for use in the invention can be synthesized according to ordinary methods (e.g., radical polymerization). For example, as ordinary methods, a batch polymerization method of performing polymerization by dissolving a monomer seed and a polymerization initiator in a solvent and heating, and a dropping polymerization method of adding a solution of a monomer seed and a polymerization initiator into a heated solvent by dropping over 1 to 10 hours are exemplified, and a dropping polymerization method is preferred. As the reaction solvents, ethers, e.g., tetrahydrofuran, 1,4-dioxane, and diisopropyl ether, ketones, e.g., methyl ethyl ketone and methyl isobutyl ketone, ester solvents, e.g., ethyl acetate, amide solvents, e.g., dimethylformamide and dimethylacetamide, and solvents capable of dissolving a composition of the invention described later, e.g., propyelne glycol monomethyl ether acetate, propyelne glycol monomethyl ether, and cyclohexanone are exemplified. It is more preferred to use the same solvent in polymerization as used in a resist composition in the invention, by which the generation of particles during preservation can be restrained.

It is preferred to perform polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group, or a carboxyl group are preferred. As preferred initiators, azobisisobutyronitrile, azobis-dimethylvaleronitrile, dimethyl-2,2'-azibis(2-methyl-propionate), etc., are exemplified. Initiators are added additionally or dividedly, if desired, and after termination of reaction, the reaction product is put into a solvent and an objective polymer is recovered as powder or a solid state. The reaction concentration is from 5 to 50 mass %, and preferably from 10 to 30 mass %. The reaction temperature is generally from 10 to 150° C., preferably from 30 to 120° C., and more preferably from 50 to 100° C.

The addition amount of resin (A) to a positive resist composition is in the proportion of from 50 to 99.7% to the total solids content, and preferably from 70 to 99.5%. Here, total solids content means all the components excluding solvent (D) in the components constituting the resist composition. Further, besides the above resins in the invention, other resins can also be used, if necessary. In a composition of the invention, other resins can be mixed preferably in the range of the proportion of 70 mass parts or less per 100 mass parts of resin (A) in the invention, and especially preferably 50 mass parts or less.

(B) Compounds capable of generating an acid upon irradiation with actinic ray or radiation:

A positive resist composition in the invention contains a compound capable of generating an acid upon irradiation with actinic ray or radiation.

As such acid generators, photo-initiators of photo-cationic polymerization, photo-initiators of photo-radical polymerization, photo-decoloring agents and photo-discoloring agents of dyestuffs, well-known compounds capable of generating an acid upon irradiation with actinic ray or radiation that are used in micro-resists and the like, and the mixtures of these compounds can be optionally selected and used.

For example, diazonium salt, phosphonium salt, sulfonium salt, iodonium salt, imidosulfonate, oximesulfonate, diazodisulfone, disulfone, and o-nitrobenzylsulfonate are exemplified as acid generators.

Further, compounds obtained by introducing a group or a compound capable of generating an acid upon irradiation with actinic ray or radiation to the main chain or the side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

The compounds generating an acid by the action of lights as disclosed in U.S. Pat. No. 3,779,778, EP-126712, etc., can also be used.

Of the compounds capable of decomposing upon irradiation with actinic ray or radiation and generating an acid, the compounds represented by the following formulae (ZI), (ZII) and (ZIII) can be exemplified as preferred compounds.

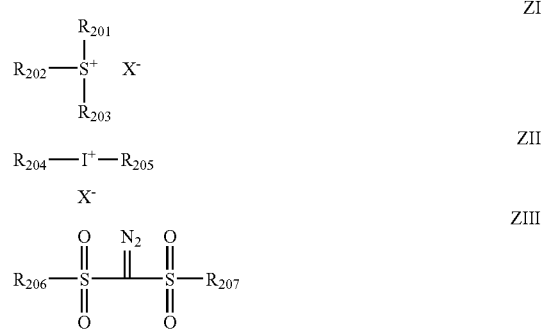

In formula (ZI), $R_{201}$, $R_{202}$ and $R_{203}$ each represents an organic group.

X- represents a non-nucleophilic anion, preferably a sulfonate anion, a carboxylate anion, a bis(alkylsulfonyl)-imide anion, a tris(alkylsulfonyl)methide anion, $BF_4^-$, $PF_6^-$, $SbF_6^-$, etc., are exemplified, and preferably an organic anion having a carbon atom.

As preferred organic anions, organic anions represented by the following formulae are exemplified.

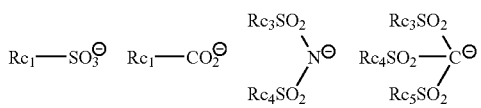

In the above formulae, $Rc_1$ represents an organic group.

As the organic group represented by $Rc_1$, an organic group having from 1 to 30 carbon atoms is exemplified, preferably an alkyl group, a cycloallyl group, an aryl group, each of which groups may be substituted, or a group obtained by linking a plurality of these groups with a linking group such as a single bond, —O—, —CO$_2$—, —S—, —SO$_3$— or —SO$_2$N($Rd_1$)- can be exemplified. $Rd_1$ represents a hydrogen atom or an alkyl group.

$Rc_3$, $Rc_4$ and $Rc_5$ each represents an organic group. As the organic groups represented by $Rc_3$, $Rc_4$ and $Rc_5$, the same organic groups as preferred organic groups in $Rc_1$ can be exemplified, and most preferably a perfluoroalkyl group having from 1 to 4 carbon atoms.

$Rc_3$ and $Rc_4$ may be bonded to each other to form a ring.

As the group formed by bonding $Rc_3$ and $Rc_4$, an alkylene group and an arylene group are exemplified, and preferably a perfluoroalkylene group having from 2 to 4 carbon atoms.

As the organic groups represented by $Rc_1$, $Rc_3$ to $Rc_5$, most preferably an alkyl group substituted with a fluorine atom or a fluoroalkyl group on the 1-position, and a phenyl group substituted with a fluorine atom or a fluoroalkyl group can be exemplified. By the presence of a fluorine atom or a fluoroalkyl group, the acidity of the acid generated with light irradiation increases to enhance sensitivity. Further, by the formation of a ring by the bonding of $Rc_3$ and $Rc_4$, the acidity of the acid generated with light irradiation increases to improve sensitivity.

In formula (ZI), the number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

A compound represented by formula (ZI) may be a compound having a plurality of structures represented by formula (ZI). For instance, a compound represented by formula (ZI) may be a compound having a structure that at least one of $R_{201}$, $R_{202}$ and $R_{203}$ is bonded to at least one of $R_{201}$, $R_{202}$ and $R_{203}$ of another compound represented by formula (ZI).

As further preferred components (ZI), the following compounds (ZI-1), (ZI-2) and (ZI-3) can be exemplified.

Compound (ZI-1) is an arylsulfonium compound in the case where at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryldialkyl-sulfonium compound, a diarylcycloalkylsulfonium compound, and an aryldicycloalkylsulfonium compound can be exemplified.

As the aryl group of the arylsulfonium compound, an aryl group, e.g., a phenyl group and a naphthyl group, and a heteroaryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group that the arylsulfonium compound may have according to necessity is preferably a straight chain or branched alkyl group having from 1 to 15 carbon atoms, e.g., a methyl group, an ethyl group, a propyl group, an n-butyl group, a sec-butyl group, a t-butyl group, etc., can be exemplified.

The cycloalkyl group that the arylsulfonium compound may have according to necessity is preferably a cycloalkyl group having from 3 to 15 carbon atoms, e.g., a cyclopropyl group, a cyclobutyl group, a cyclohexyl group, etc., can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the most preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent is substituted on the p-position of the aryl group.

Compound (ZI-2) is described below.

Compound (ZI-2) is a compound in the case where $R_{201}$, $R_{202}$ and $R_{203}$ in formula (ZI) each represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably represents a straight chain, branched or cyclic 2-oxoalkyl group, or an alkoxycarbonylmethyl group, and most preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 10 carbon atoms, e.g., a methyl group, an ethyl group, a propyl group, a butyl group, and a pentyl group can be exemplified. The alkyl group represented by $R_{201}$, $R_{202}$ and $R_{203}$ is preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbonyl group can be exemplified. The cycloalkyl group represented by $R_{201}$, $R_{202}$ and $R_{203}$ is preferably a cyclic 2-oxoalkyl group.

The 2-oxoalkyl group represented by $R_{201}$, $R_{202}$ and $R_{203}$ may be any of straight chain, branched and cyclic, and preferably a group having >C=O on the 2-position of the above alkyl group and the cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and has a phenacylsulfonium salt structure.

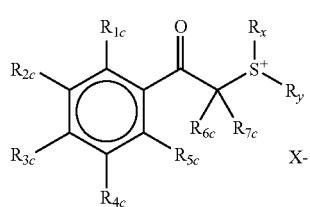

(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxy group, or a halogen atom.

$R_{6c}$ and $R_{7c}$ each represents a hydrogen atom, an alkyl group or a cycloalkyl group.

$R_x$ and $R_y$ each represents an alkyl group, a cycloalkyl group, an allyl group, or a vinyl group.

Any two or more of $R_{1c}$ to $R_{7c}$, and $R_x$ and $R_y$ may be bonded to each other to form cyclic structures, respectively, and the cyclic structures may contain an oxygen atom, a sulfur atom, an ester bond, or an amido bond. As the groups formed by any two or more of $R_{1c}$ to $R_{7c}$, and $R_x$ and $R_y$ by bonding, a butylene group, a pentylene group, etc., can be exemplified.

$X^-$ represents a non-nucleophilic anion, and the same anion as the non-nucleophilic anion represented by $X^-$ in formula (ZI) can be exemplified.

The alkyl group represented by $R_{1c}$ to $R_{7c}$ may be either straight chain or branched, e.g., a straight chain or branched alkyl group having from 1 to 20 carbon atoms, preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

As the cycloalkyl group represented by $R_{1c}$ to $R_{7c}$ a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group, and a cyclohexyloxy group) can be exemplified.

Preferably any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15. By selecting such substituents, the solubility in a solvent is bettered and the generation of particles during preservation can be restrained.

As the alkyl groups represented by $R_x$ and $R_y$, the same alkyl groups as represented by $R_{1c}$ to $R_{7c}$ can be exemplified. The alkyl group represented by $R_x$ and $R_y$ is more preferably a straight chain or branched 2-oxoalkyl group or an alkoxycarbonylmethyl group.

As the cycloalkyl group represented by $R_x$ and $R_y$, the same cycloalkyl group as represented by $R_{1c}$ to $R_{7c}$ can be exemplified. The cycloalkyl group represented by $R_x$ and $R_y$ is preferably a cyclic 2-oxoalkyl group.

As the straight chain, branched, or cyclic 2-oxoalkyl group, a group having >C=O on the 2-position of the alkyl group or the cycloalkyl group represented by $R_{1c}$ to $R_{7c}$ can be exemplified.

As the alkoxyl group in the alkoxycarbonylmethyl group, the same alkoxyl group as represented by $R_{1c}$ to $R_{5c}$ can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), $R_{204}$, $R_{205}$, $R_{206}$ and $R_{207}$ each represents an aryl group, an alkyl group, or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be either straight chain or branched, and preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbonyl group can be exemplified.

$R_{204}$ to $R_{207}$ may each have a substituent. As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a non-nucleophilic anion, and the same anion as the non-nucleophilic anion represented by $X^-$ in formula (ZI) can be exemplified.

Of the compounds capable of generating an acid upon irradiation with actinic ray or radiation, compounds represented by the following formula (ZIV), (ZV) or (ZVI) can further be exemplified as preferred compounds.

$$Ar_3-SO_2-SO_2-Ar_4$$

ZIV

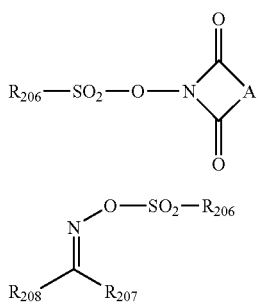

In formulae (ZIV) to (ZVI), $Ar_3$ and $Ar_4$ each represents an aryl group.

$R_{206}$ represents an alkyl group, a cycloalkyl group, or an aryl group.

$R_{207a}$ and $R_{208}$ each represents an alkyl group, a cycloalkyl group, an aryl group, or an electron attractive group. $R_{207}$ preferably represents an aryl group. $R_{208}$ preferably represents an electron attractive group, and more preferably a cyano group or a fluoroalkyl group.

A represents an alkylene group, an alkenylene group, or an arylene group.

Of the compounds capable of decomposing upon irradiation with actinic ray or radiation and generating an acid, the more preferred are the compounds represented by any of formulae (ZI), (ZII) and (ZIII).

Of the compounds capable of generating an acid upon irradiation with actinic ray or radiation, particularly preferred examples are shown below, but the invention is not restricted thereto.

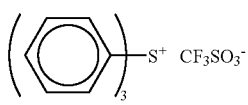
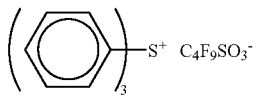
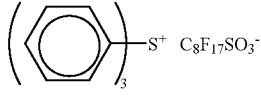
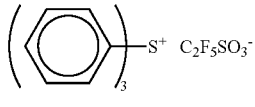
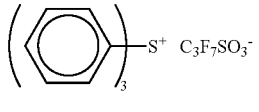
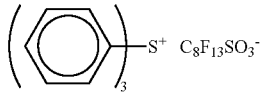
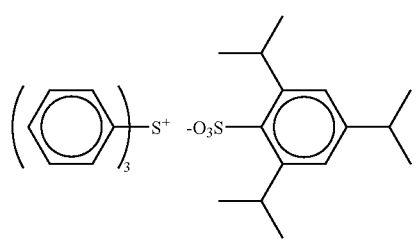
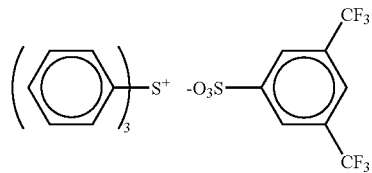
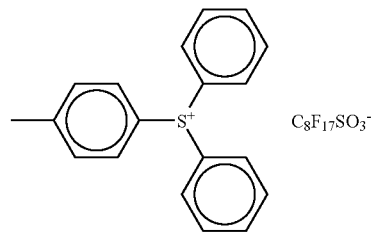
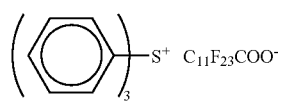
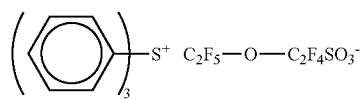
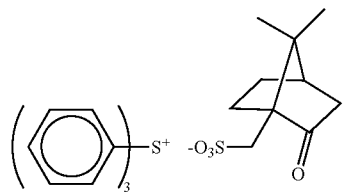
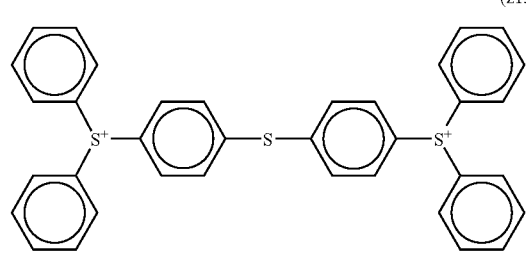
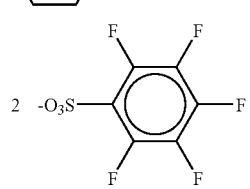

-continued
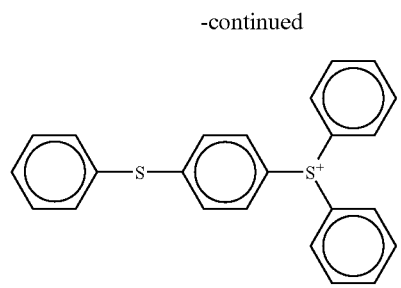 (z14)
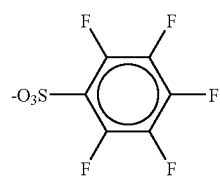
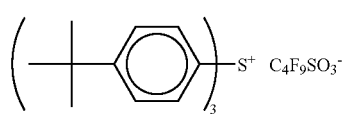 (z15)
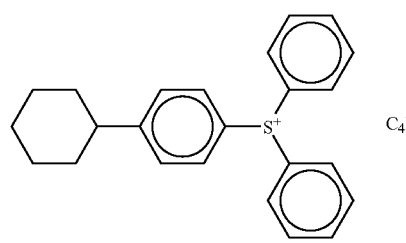 (z16)
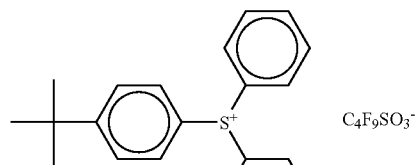 (z17)
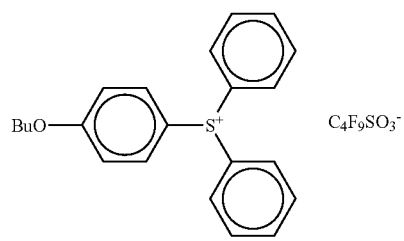 (z18)
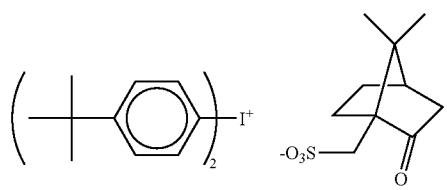 (z19)
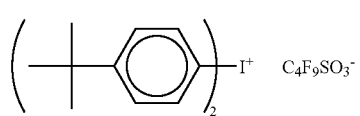 (z20)
-continued
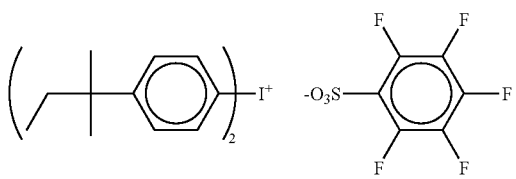 (z21)
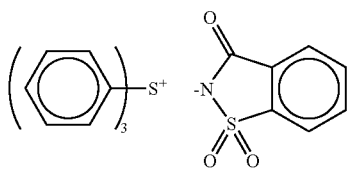 (z22)
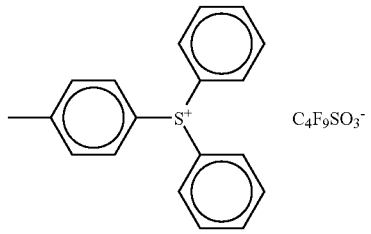 (z23)
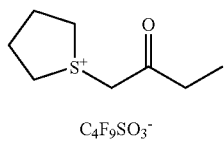 (z24)
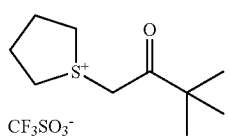 (z25)
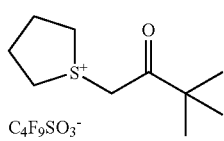 (z26)
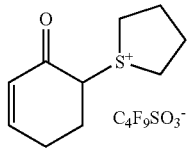 (z27)
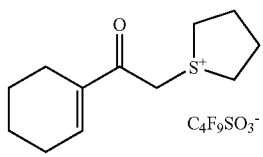 (z28)
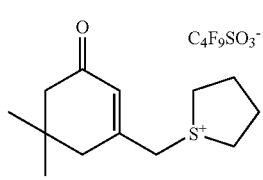 (z29)

-continued
(z30)
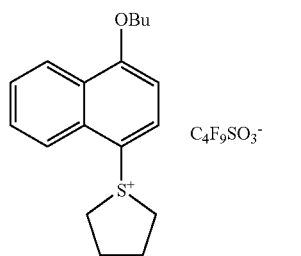
(z31)
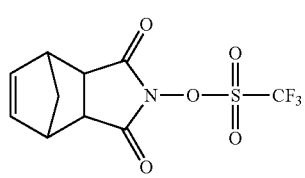
(z32)
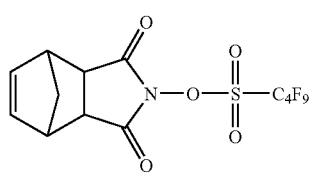
(z33)
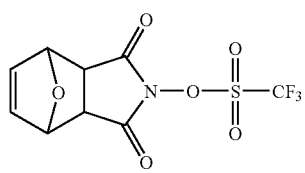
(z34)
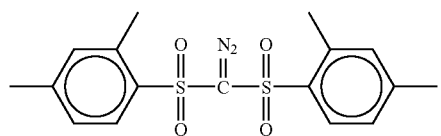
(z35)
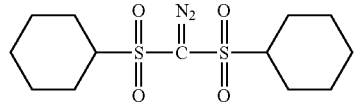
(z36)
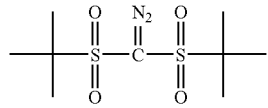
(z37)
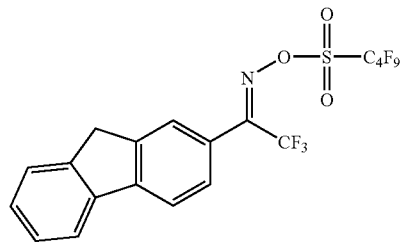
-continued
(z38)
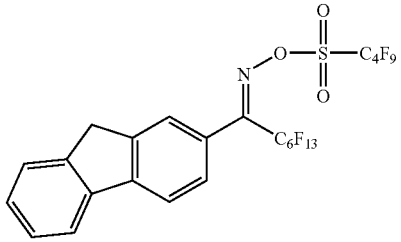
(z39)
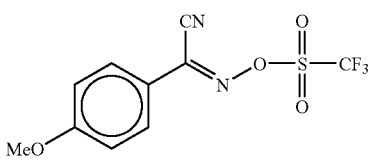
(z40)
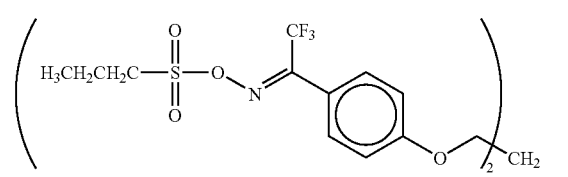
(z41)
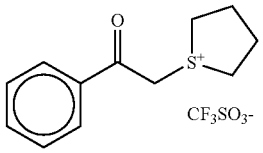
(z42)
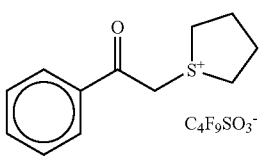
(z43)
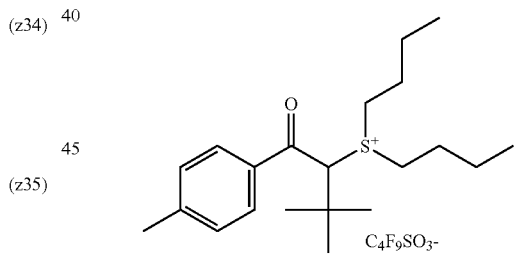
(z44)
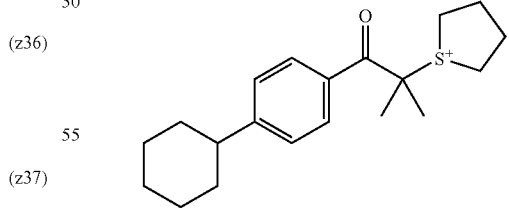
(z45)
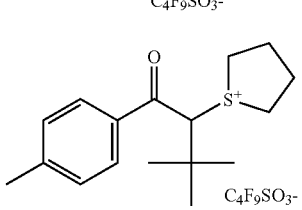

-continued
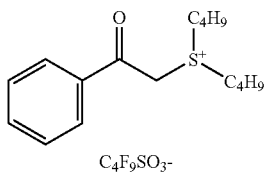 (z46)
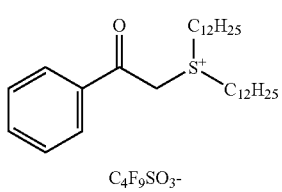 (z47)
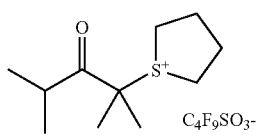 (z48)
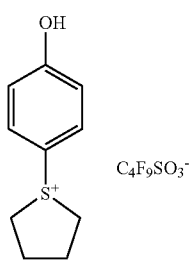 (z49)
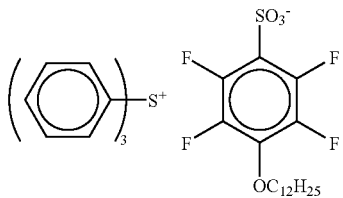 (z50)
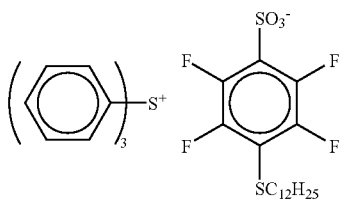 (z51)
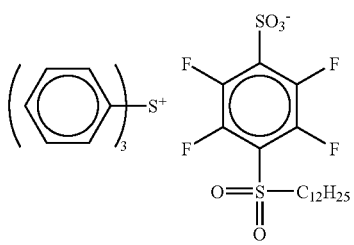 (z52)
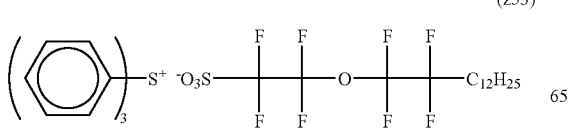 (z53)
-continued
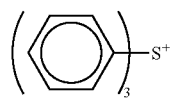 (z54)
 (z55)
 (z56)
 (z57)
 (z58)
 (z59)
 (z60)

-continued
(z61) 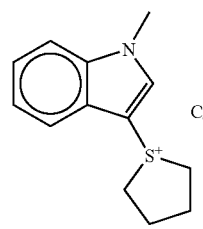
(z62) 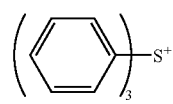 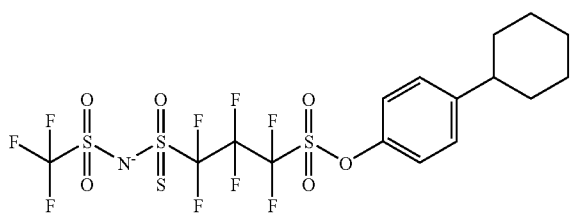
(z63) 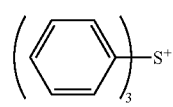 
(z64) 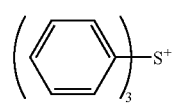 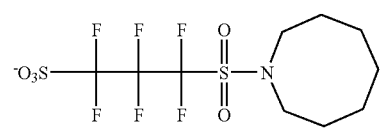
(z65) 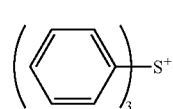 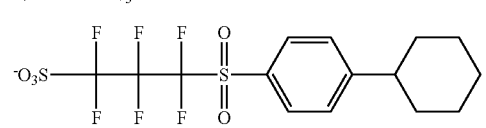
(z66) 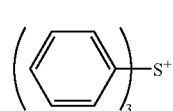 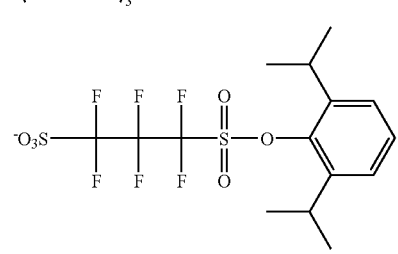
-continued
(z67) 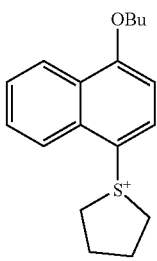 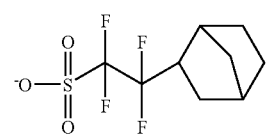
(z68) 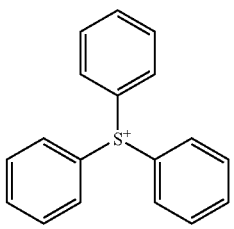 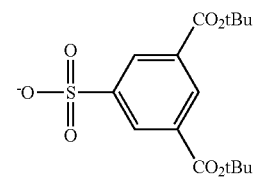
(z69) 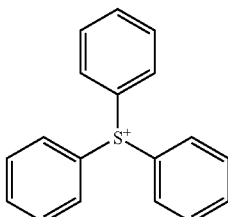
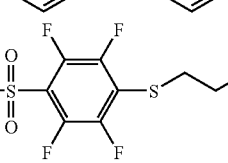
(z70) 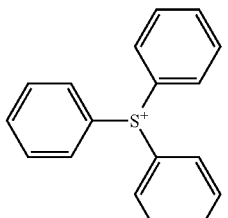 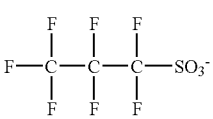
(z71) 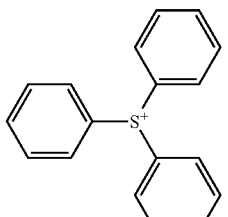 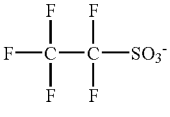
(z72) 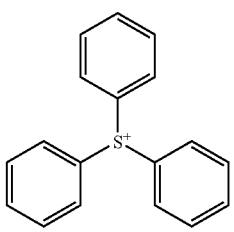

-continued

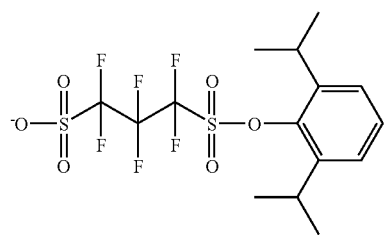

(z73)

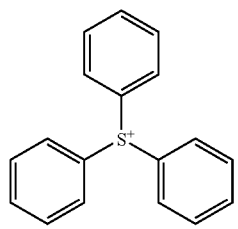

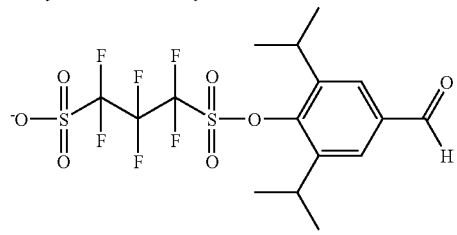

(z74)

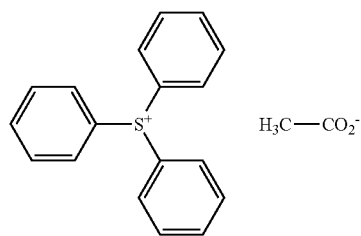

The acid generators can be used one kind alone, or two or more kinds can be used in combination. When two or more compounds are used in combination, it is preferred to combine compounds capable of generating two kinds of organic acids in which the total atom number exclusive of a hydrogen atom differs by 2 or more.

The content of the acid generators in a composition is preferably from 0.1 to 20 mass % based on the total solids content of the resist composition, more preferably from 0.5 to 10 mass %, and still more preferably from 1 to 7 mass %.

(C) Silicon atom-containing resins:

A positive resist composition in the invention contains a silicon atom-containing resin (sometimes referred to as resin (C)) having at least one group selected from the following (X) to (Z).

(X) An alkali-soluble group, (Y) A group capable of decomposing by the action of an alkali developer to increase the solubility of resin (C) in an alkali developer (hereinafter sometimes referred to as "an alkali-hydrolyzable group"), and (Z) A group capable of decomposing by the action of an acid to increase the solubility of resin (C) in an alkali developer (hereinafter sometimes referred to as "an acid-decomposable group").

Alkali-soluble group (X) means a group capable of increasing the solubility of silicon atom-containing resin (C) in a 2.38% tetramethylammonium hydroxide aqueous solution at 23° C. as compared with the time when the alkali-soluble group (X) is not contained, and alkali-soluble group (X) is preferably an acid group having pKa of from 0.0 to 15.0, and more preferably from 3.0 to 12.0.

As alkali-soluble groups (X), groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)-methylene group, an (alkylsulfonyl)(alkylcarbonyl)imido group, a bis(alkylcarbonyl)methylene group, a bis(alkyl-carbonyl)imido group, a bis(alkylsulfonyl)methylene group, a bis(alkylsulfonyl)imido group, a tris(alkylcarbonyl)-methylene group, or a tris(alkylsulfonyl)methylene group can be exemplified as preferred examples.

As more preferred alkali-soluble groups (X), a carboxylic acid group, a fluorinated alcohol group (more preferably hexafluoroisopropanol), and a sulfonylimido group are exemplified.

As a repeating units having alkali-soluble group (X), a repeating unit in which an alkali-soluble group is directly bonded to the main chain of a resin such as a repeating unit by acrylic acid or methacrylic acid, a repeating unit in which an alkali-soluble group is bonded to the main chain of a resin via a linking group, and a repeating unit in which a polymerization initiator having an alkali-soluble group and a chain transfer agent are introduced to the terminals of a polymer chain by polymerization are exemplified, and these are all preferably used.

The content of a repeating unit having alkali-soluble group (X) is preferably in the proportion of from 1 to 50 mol % of the total repeating units in resin (C), more preferably from 3 to 35 mol %, and still more preferably from 5 to 20 mol %.

The specific examples of repeating units having alkali-soluble group (X) are shown below, but the invention is not restricted thereto.

(In the formulae, Rx represents H, $CH_3$, $CF_3$, or $CH_2OH$.)

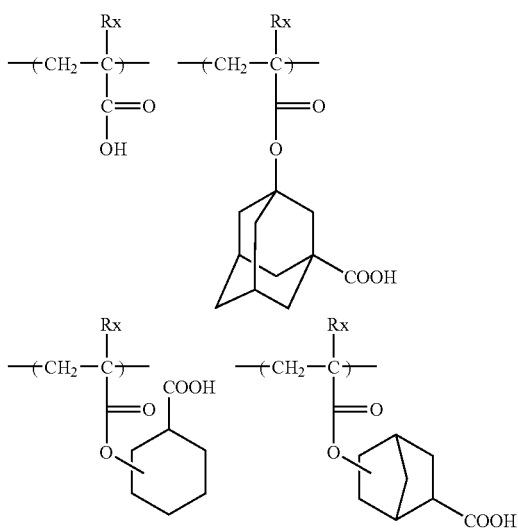

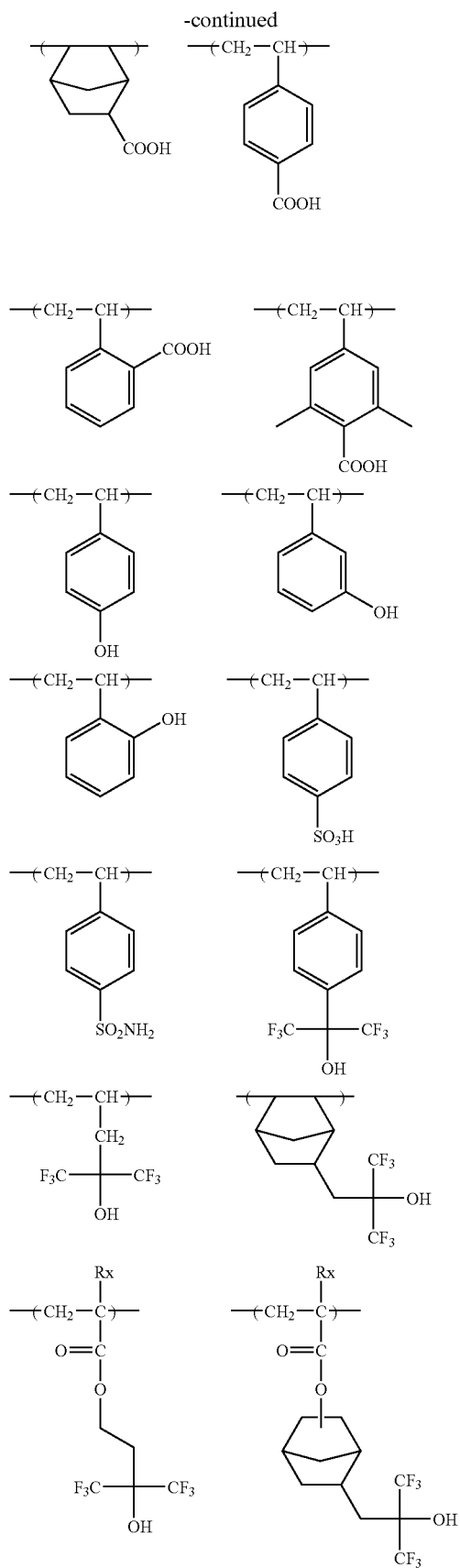
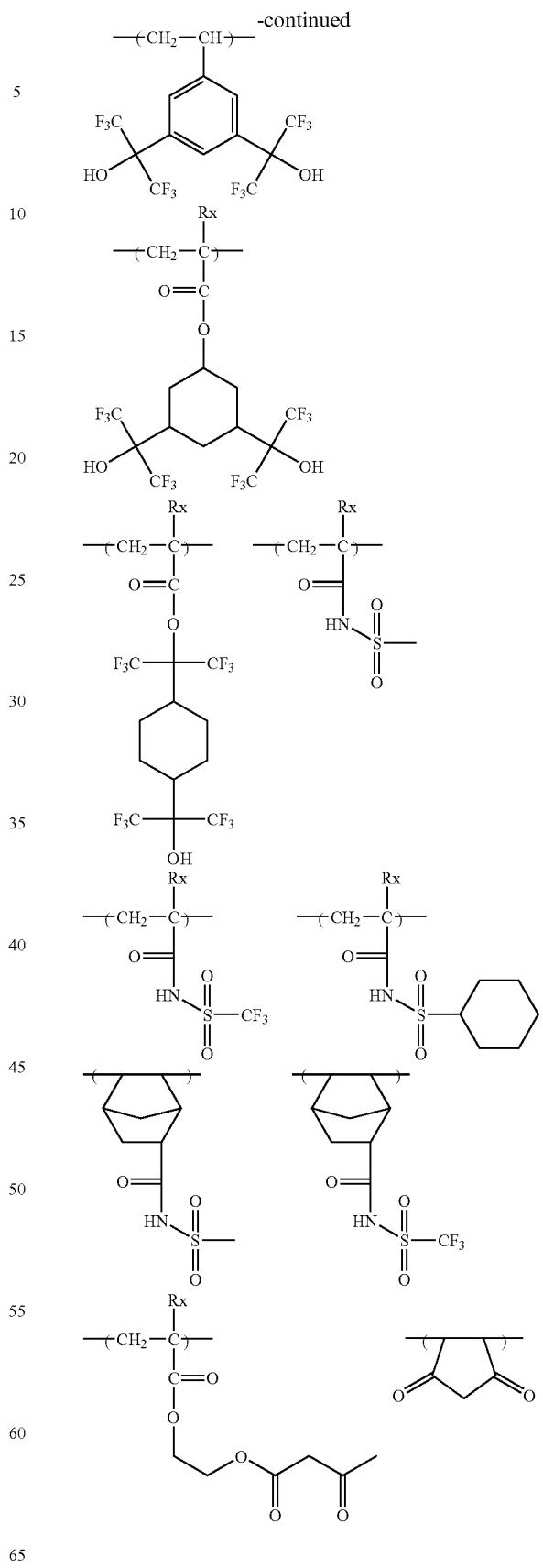
(Y) A group capable of decomposing by the action of an alkali developer to increase the solubility of resin (C) in an alkali developer (an alkali-hydrolyzable group) means a group capable of causing a hydrolysis reaction in an alkali developer to be converted to alkali-soluble group (X).

As alkali-hydrolyzable group (Y), e.g., a lactone group, a sulfonamido group, an acid anhydride, and an acid imide group are preferred examples, and a lactone group, a sulfonamido group, and an acid imide group are more preferred.

As repeating units having an alkali-hydrolyzable group, a repeating unit in which an alkali-hydrolyzable group is bonded to the main chain of a resin via a linking group such as a repeating unit by acrylic acid ester or methacrylic acid ester, and a repeating unit in which a polymerization initiator having alkali-hydrolyzable group (Y) and a chain transfer agent are introduced to the terminals of resin (C) by polymerization are exemplified, and these are all preferably used.

The content of a repeating unit having alkali-hydrolyzable group (Y) is preferably in the proportion of from 1 to 40 mol % of the total repeating units in resin (C), more preferably from 3 to 30 mol %, and still more preferably from 5 to 15 mol %.

Especially preferred alkali-hydrolyzable group (Y) is a lactone group. As lactone groups, any group having a lactone structure can be used, but preferably groups having 5- to 7-membered ring lactone structures, and 5- to 7-membered ring lactone structures condensed with other ring structures in the form of forming a bicyclo structure or a spiro structure are preferred. A group having a lactone structure represented by any of the following formulae (LC1-1) to (LC1-16) is more preferred. A group having a lactone structure may be directly bonded to the main chain of a polymer. Preferred lactone structures are (LC1-1), (LC1-4) (LC1-5), (LC1-6), (LC1-13) and (LC1-14). By the use of such a lactone structure, line edge roughness and development defect are bettered.

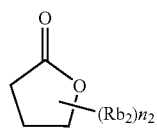

LC1-1

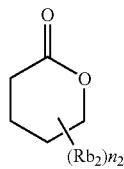

LC1-2

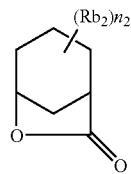

LC1-3

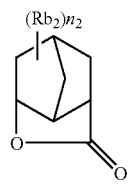

LC1-4

-continued

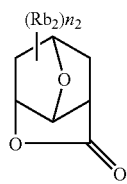

LC1-5

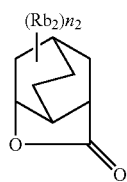

LC1-6

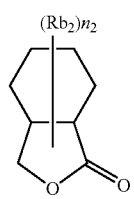

LC1-7

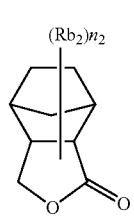

LC1-8

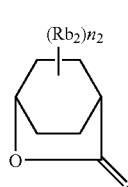

LC1-9

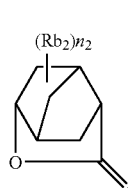

LC1-10

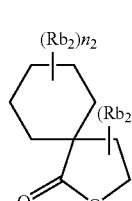

LC1-11

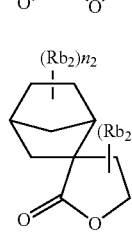

LC1-12

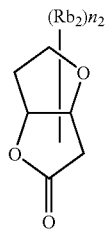
LC1-13

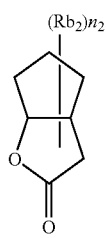
LC1-14

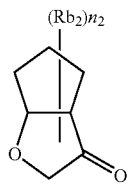
LC1-15

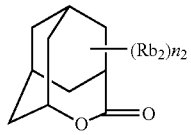
LC1-16

A lactone structural site may have or may not have a substituent (Rb$_2$). Preferred substituent (Rb$_2$) is an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, or an acid-decomposable group. n$_2$ represents an integer of from 0 to 4. When n$_2$ is 2 or more, a plurality of Rb$_2$ may be the same or different, and a plurality of Rb2 may be bonded to each other to form a ring.

As repeating units having a group having a lactone structure represented by any of formulae (LC1-1) to (LC1-16), repeating units represented by the following formulae (Lc-AB1), (Lc-AB2) and (LcI) can be exemplified.

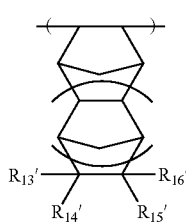
(Lc-AB1)

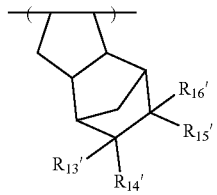
(Lc-AB2)

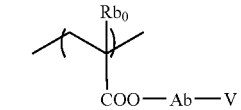
(LcI)

In formulae (Lc-AB1) and (Lc-AB2), R$_{13}$', R$_{14}$', R$_{15}$' and R$_{16}$' each represents —COOR$_5$ or —C(=O)-X-A'-R$_{17}$'.

R$_5$ represents a group having a lactone structure represented by any of formulae (LC1-1) to (LC1-16).

X represents an oxygen atom, a sulfur atom, —NH—, —NHSO$_2$—, or —NHSO$_2$NH—.

A' represents a single bond or a divalent linking group.

R$_{17}$' represents —COOR$_5$, or a group having a lactone structure represented by any of formulae (LC1-1) to (LC1-16).

In formula (LcI), Rb$_0$ represents a hydrogen atom, a halogen atom, or an alkyl group. As the examples of preferred substituents that the alkyl group represented by Rb$_0$ may have, a hydroxyl group and a halogen atom a are exemplified.

As the halogen atom represented by Rb$_0$, a fluorine atom, a chlorine atom, a bromine atom, and an iodine atom are exemplified.

Rb$_0$ preferably represents a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group of combining these groups, and preferably a single bond or a lining group represented by -Ab$_1$-CO$_2$—. Ab$_1$ represents a straight chain or branched alkylene group, or a monocyclic or polycyclic cycloalkylene group, and preferably a methylene group, an ethylene group, a cyclohexyl group, an adamantyl group, or a norbomyl group.

V represents a group represented by any of formulae (LC1-1) to (LC1-16).

As the repeating unit having a lactone ring, a repeating unit represented by formula (LcI) is preferred.

Repeating units having a lactone structure generally have optical isomers, and any optical isomer may be used. One kind of optical isomer may be used alone, or a plurality of optical isomers may be used as mixture. When one kind of optical isomer is used, the optical purity (ee) of the optical isomer is preferably 90 or more, and more preferably 95 or more.

The specific examples of repeating units having a lactone structure are shown below, but the invention is not restricted to these compounds.

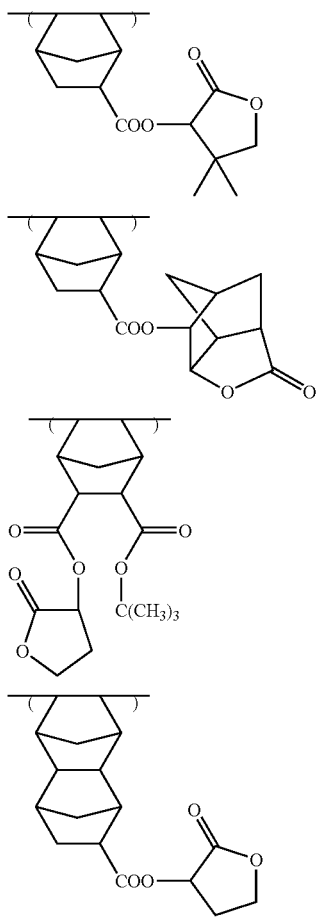
(In the formulae, Rx represents H, CH$_3$, CH$_2$OH or CF$_3$.)
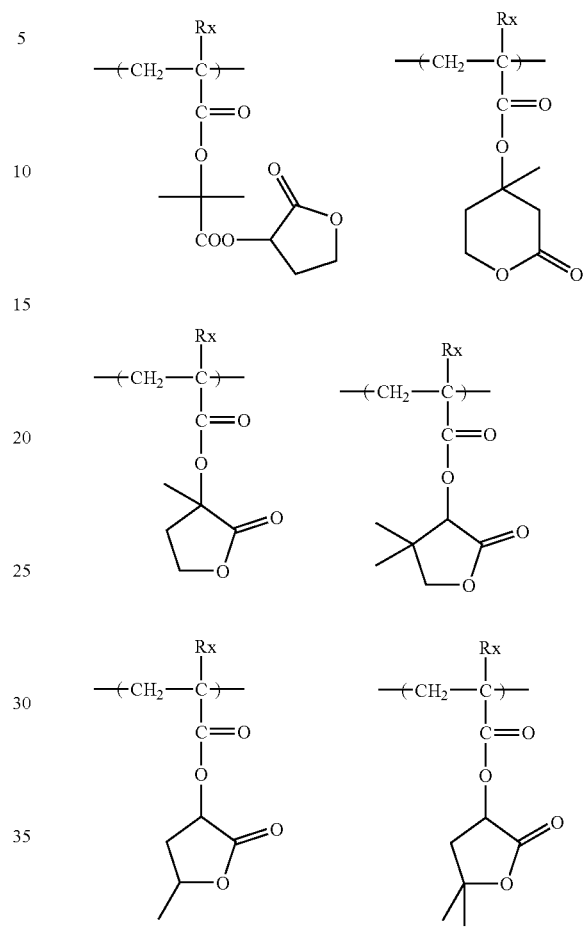
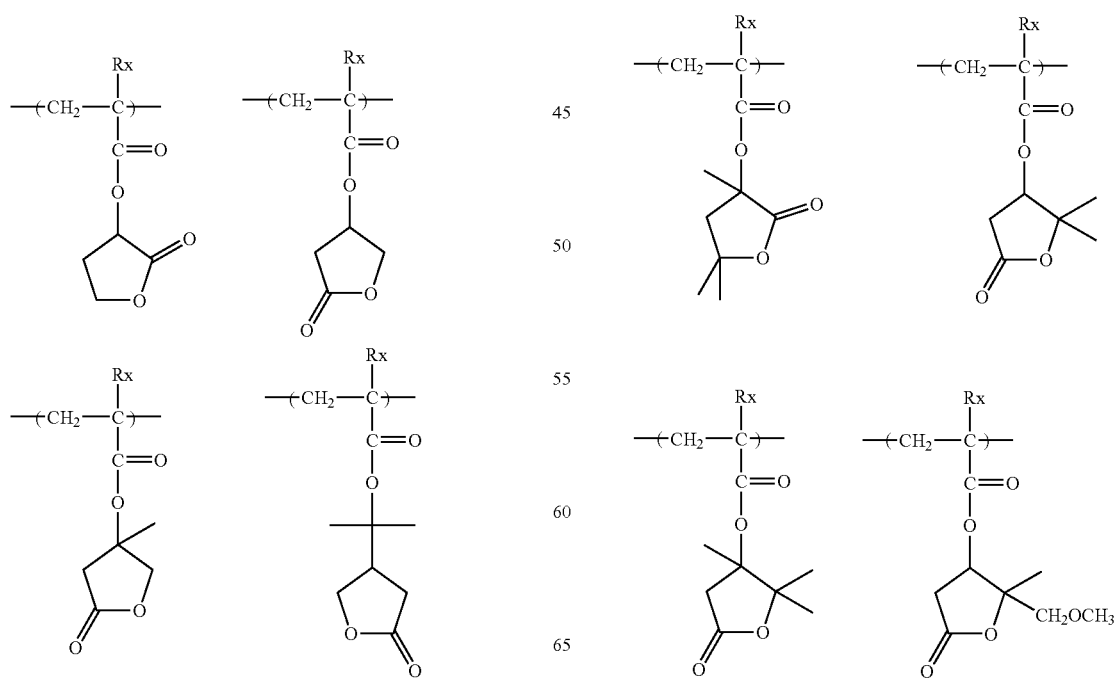

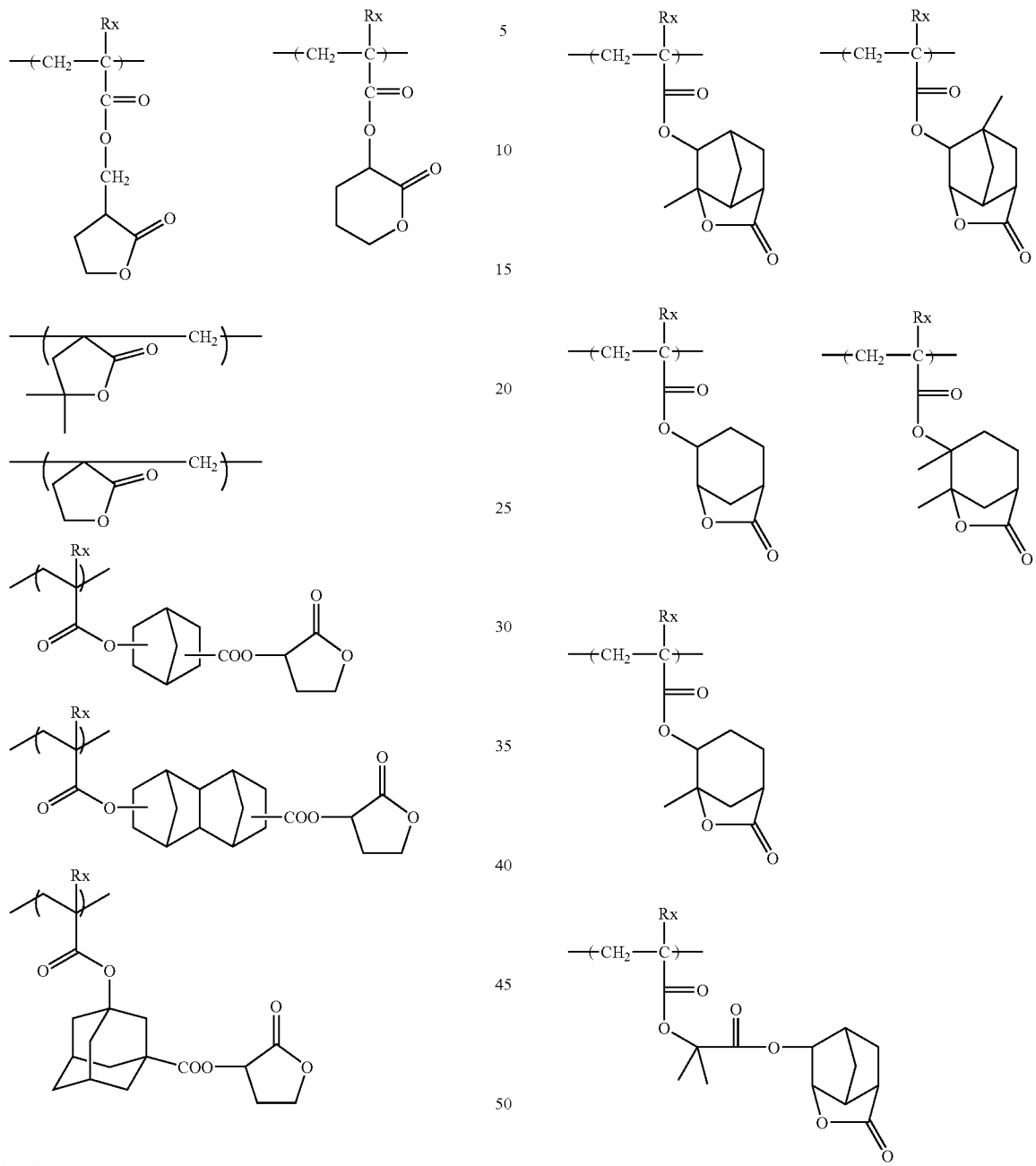
(In the formulae, Rx represents H, CH$_3$, CH$_2$OH or CF$_3$.)
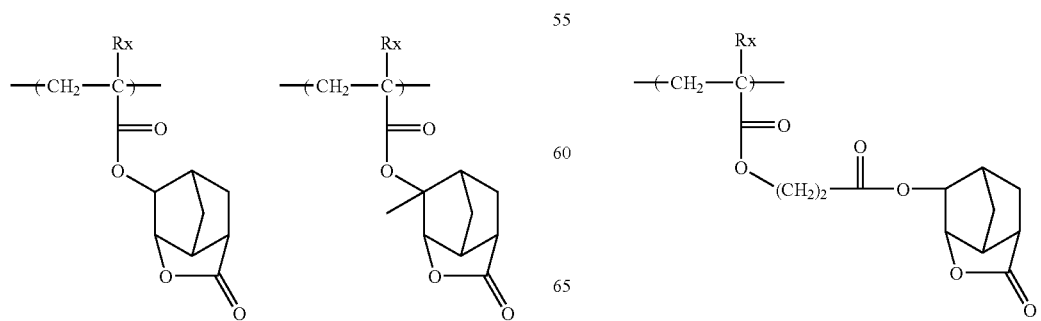

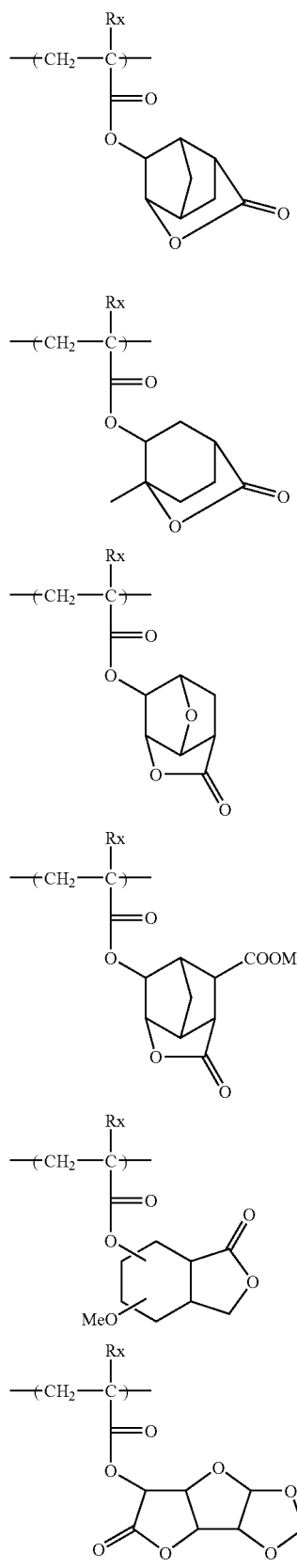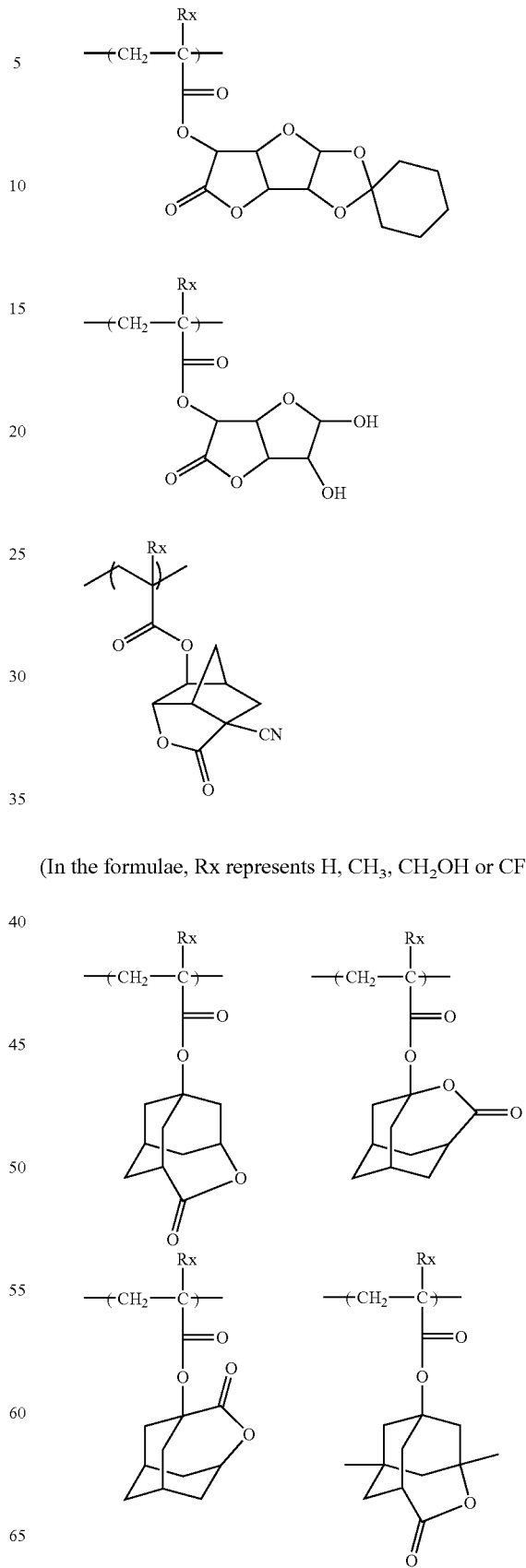
(In the formulae, Rx represents H, CH$_3$, CH$_2$OH or CF$_3$.)

-continued

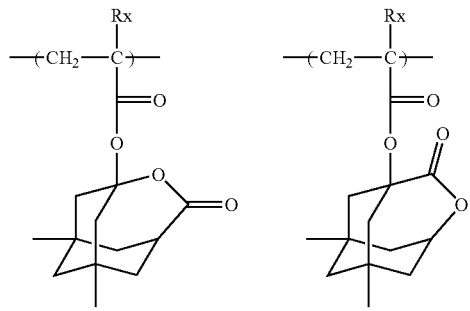

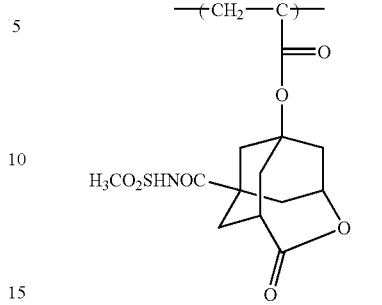

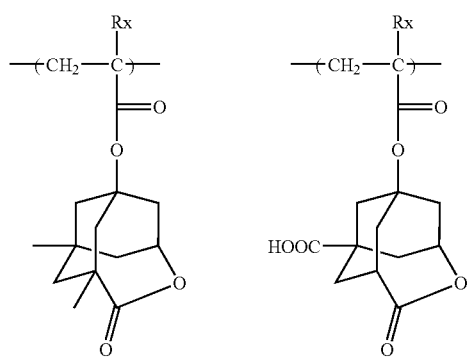

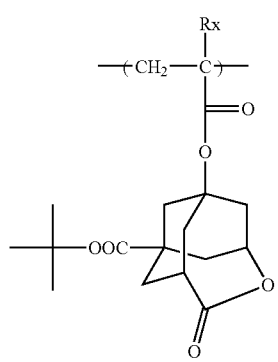

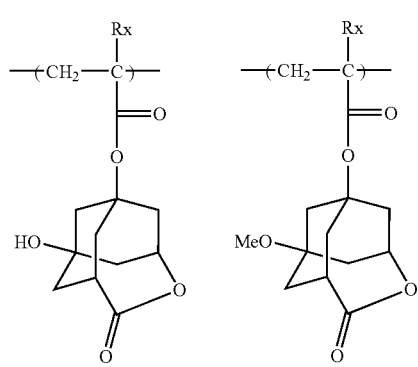

-continued

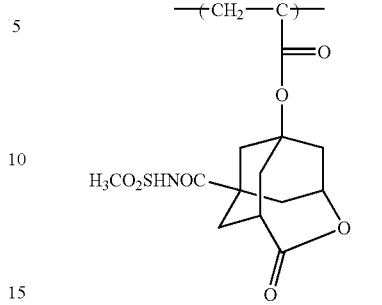

(Z) A group capable of decomposing by the action of an acid to increase the solubility of resin (C) in an alkali developer (an acid-decomposable group) means a group capable of causing a decomposition reaction with the acid generated in the exposed area as a catalyst to be converted to alkali-soluble group (X) in the process of heating after exposure (a process generally called Post Exposure Bake=PEB) that is included in a general resist pattern forming process.

As acid-decomposable group (Z), the same acid-decomposable groups as described above in the item of resin (A) can be exemplified.

The content of a repeating unit having acid-decomposable group (Z) is preferably in the proportion of from 1 to 80 mol % of the total repeating units in resin (C), more preferably from 10 to 80 mol %, and still more preferably from 20 to 60 mol %.

In silicon atom-containing resin (C), when either alkali-soluble group (X) or alkali-hydrolyzable group (Y) (or both) is contained, it is preferred that acid-decomposable group (Z) is not contained.

Further, in silicon atom-containing resin (C), when acid-decomposable group (Z) is contained, it is preferred that neither alkali-soluble group (X) nor alkali-hydrolyzable group (Y) is contained.

Further, silicon atom-containing resin (C) may be a resin having at least one group selected from the above groups (X) to (Z), and alkali-soluble and/or capable of increasing the solubility in an alkali developer by the action of an acid.

The alkali solubility in resin (C) means that resin (C) is soluble in an alkali developer described later (an alkaline aqueous solution generally having pH of from 10.0 to 15.0 at 23° C.).

In the case where resin (C) is an alkali-soluble resin, resin (C) has an alkali-soluble group (X) and/or a group capable of hydrolyzing by an alkali developer to be solubilized (Y). Specifically, the above alkali-soluble groups and alkali-hydrolyzable groups are exemplified.

The acid decomposability in resin (C) means that the solubility in an alkali developer increases by the action of an acid.

When resin (C) is a resin capable of increasing the solubility in an alkali developer by the action of an acid, resin (C) has a group capable of decomposing by the action of an acid to thereby generate an alkali-soluble group (Z) (acid-decomposable group), that is, a group protecting an alkali-soluble group. Specifically, a group having the same group as the acid-decomposable group in resin (A) is exemplified.

When resin (C) is alkali-soluble, resin (C) is preferably a resin that is alkali-soluble and not increasing the solubility in an alkali developer by the action of an acid.

When resin (C) is a resin capable of increasing the solubility in an alkali developer by the action of an acid, it is preferred that the solubility in an alkali developer increases by the action of an acid and an unexposed area is alkali-insoluble.

A silicon atom is contained in resin (C), and the silicon atom may be contained together in repeating units containing alkali-soluble group (X), alkali-hydrolyzable group (Y), and acid-decomposable group (Z), or may be contained in a repeating unit other than repeating units containing groups (X) to (Z).

Groups having a silicon atom contained in resin (C) are not especially restricted so long as they are groups containing at least one silicon atom, but silyl ether, siloxane, alkylsilane, etc., are preferred, and cyclic siloxane or a group represented by the following formula (I) is especially preferred.

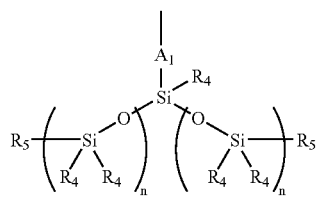

(I)

In formula (I), $A_1$ represents a single bond, an alkylene group, or —$(CH_2O)_n$—.

$R_4$ each represents a hydrogen atom, an alkyl group, or an alkoxyl group.

$R_5$ each represents a hydrogen atom, an alkyl group, or an alkoxyl group. Two $R_5$ may be bonded to each other to form a cyclic structure.

Each n represents an integer of from 0 to 5.

The specific examples of cyclic siloxane that is preferably contained in resin (C) are shown below, but the invention is not restricted to these compounds.

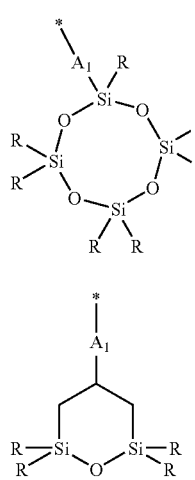

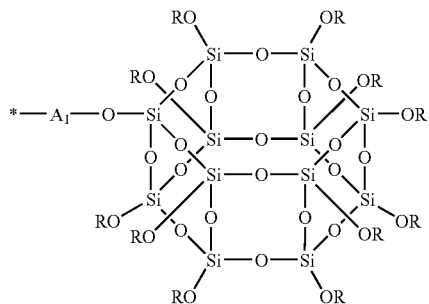

In the above formulae, R represents an alkyl group.

$A_1$ represents a single bond, an alkylene group, or —$(CH_2O)_n$—.

The preferred specific examples of silicon-containing group represented by formula (I) are shown below, but the invention is not restricted to these compounds.

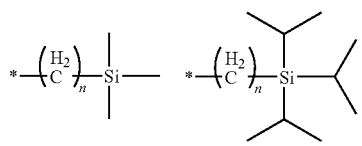

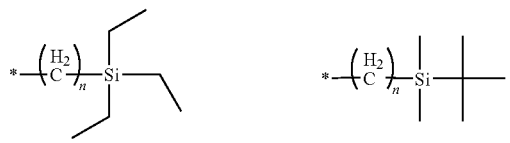

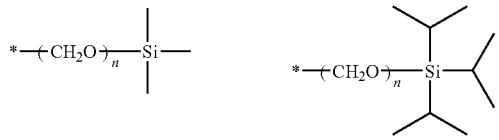

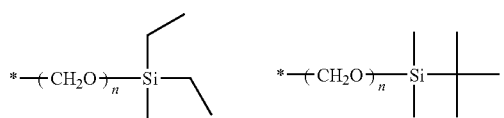

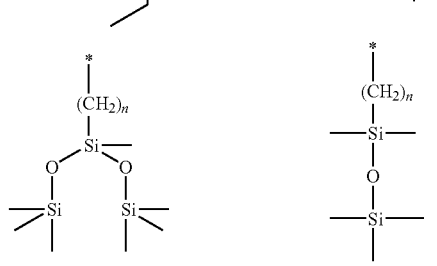

(n is an integer of 0 to 4.)

It is preferred for resin (C) to contain a silicon atom in either form of a repeating unit shown by the following formula (C1) or (C2).

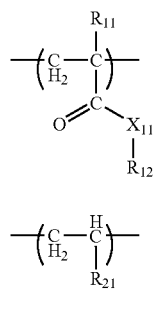

(C1)

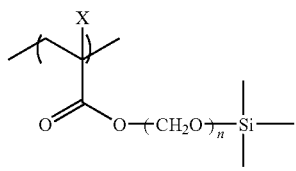

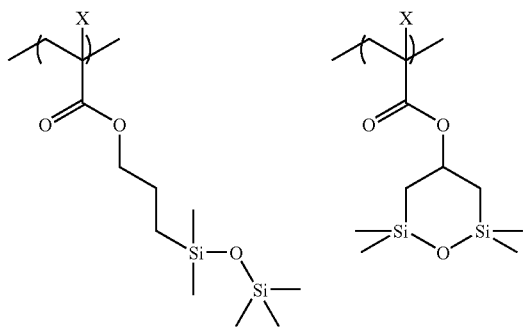

In formulae (C1) and (C2), $X_{11}$ represents an oxygen atom or —N($R_{13}$)—. $R_{13}$ represents a hydrogen atom, an alkyl group, or a cycloalkyl group. The alkyl group may be straight chain or branched, and may have a substituent such as a halogen atom.

$R_{11}$ represents a hydrogen atom, a halogen atom, an alkyl group, or a cycloalkyl group. The alkyl group may be straight chain or branched, and may have a substituent such as a halogen atom.

$R_{12}$ and $R_{21}$ each represents an organic group having at least one silicon atom. Specifically, the silicon-containing groups described above are preferably used.

The alkyl group represented by $R_{11}$ and $R_{13}$ preferably has from 1 to 5 carbon atoms, e.g., a methyl group, an ethyl group, a t-butyl group, etc., are exemplified. The cycloalkyl group represented by $R_{11}$ and $R_{13}$ preferably has from 3 to 10 carbon atoms, e.g., a cyclohexyl group, a cyclooctyl group, etc., are exemplified.

The specific examples of repeating units having a silicon atom contained in resin (C) are shown below, but the invention is not restricted thereto.

X=H, CH$_3$, F, CF$_3$

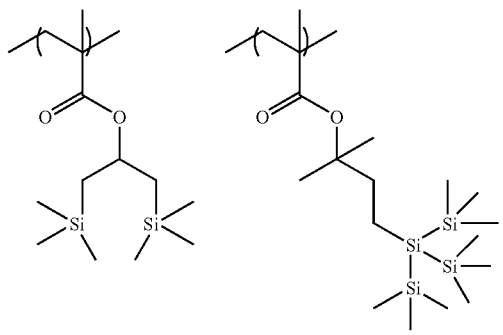

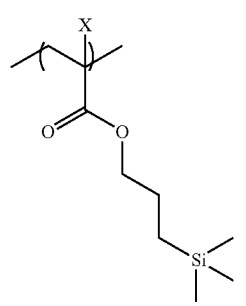

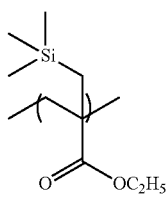

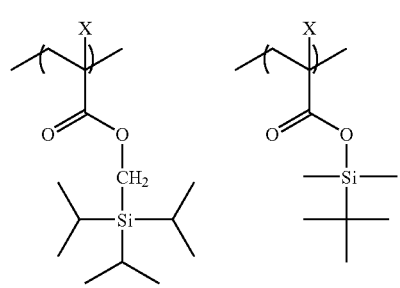

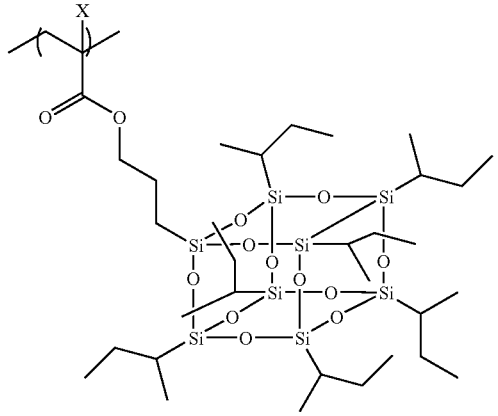

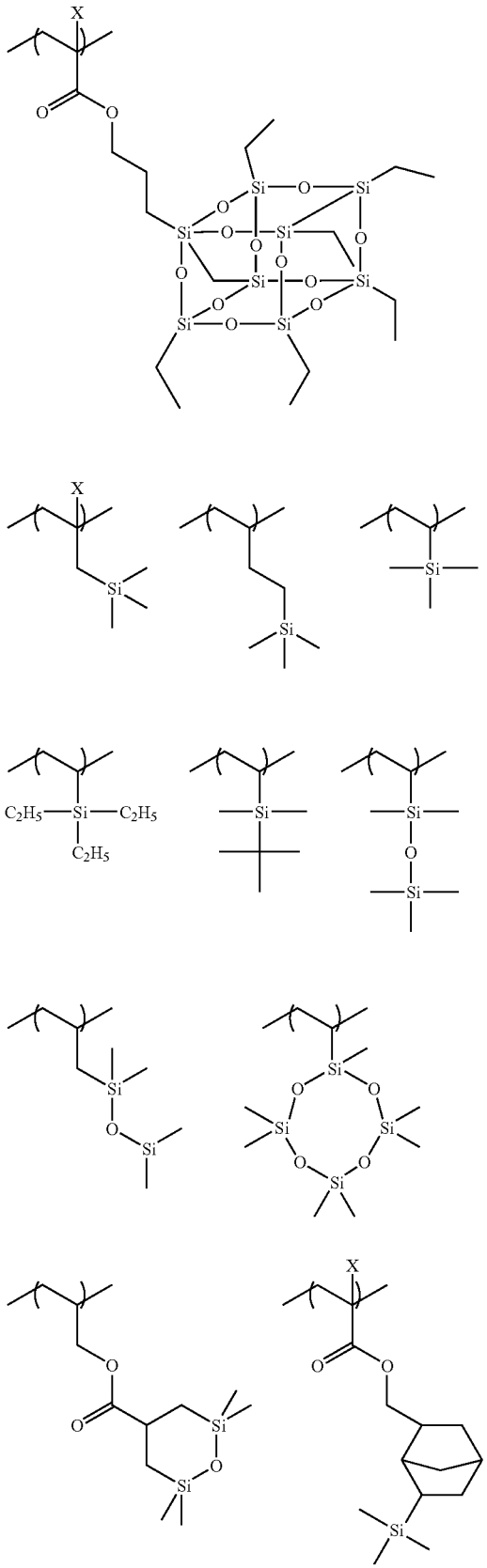
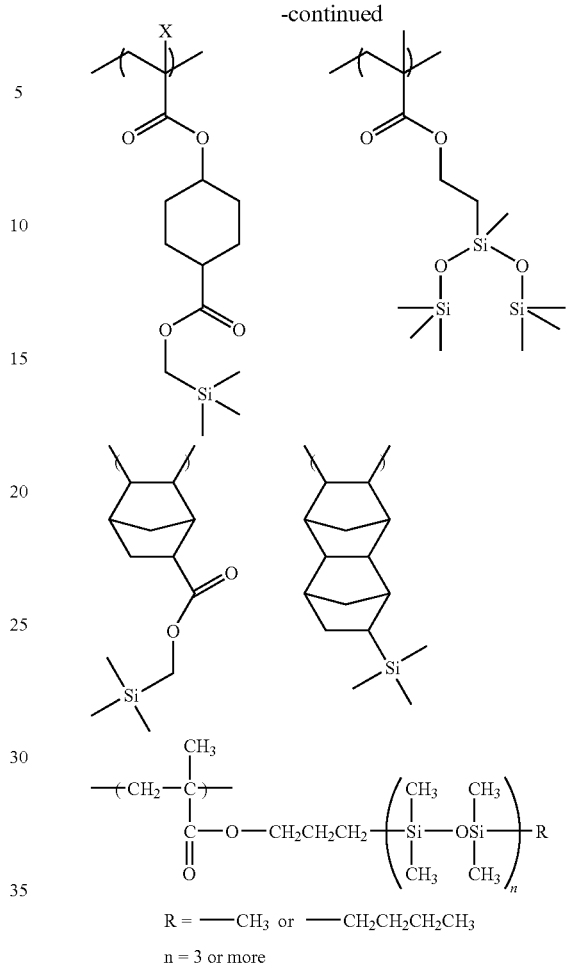

Silicon atom-containing resin (C) contained in a positive resist composition in the invention may further contain a fluorine atom.

When silicon atom-containing resin (C) contains a fluorine atom, it is preferred that the fluorine atom is contained as a group selected from the group consisting of the following (F-a), (F-b) and (F-c):

(F-a): an alkyl group having a fluorine atom having from 1 to 4 carbon atoms,
(F-b): a cycloalkyl group having a fluorine atom, and
(F-c): an aryl group having a fluorine atom.

(F-a) An alkyl group having a fluorine atom having from 1 to 4 carbon atoms is a straight chain or branched alkyl group substituted with at least one fluorine atom, and may further have other substituents.

(F-b) A cycloalkyl group having a fluorine atom is a monocyclic or polycyclic cycloalkyl group substituted with at least one fluorine atom, and may further have other substituents.

(F-c) An aryl group having a fluorine atom is an aryl group such as a phenyl group or a naphthyl group substituted with at least one fluorine atom, and may further have other substituents.

When silicon atom-containing resin (C) contains a fluorine atom, the fluorine atom may be present either on the main chain or side chain of the resin, but is preferably present on the side chain.

When silicon atom-containing resin (C) contains a fluorine atom, alkali-soluble group (X), alkali-hydrolyzable group (Y), and acid-decomposable group (Z) contained in resin (C) may contain a fluorine atom. Specifically, fluorinated alcohol group such as a hexafluoroisopropanol group can be contained as alkali-soluble group (X).

When silicon atom-containing resin (C) contains a fluorine atom, the fluorine atom may be contained together in repeating units containing alkali-soluble group (X), alkali-hydrolyzable group (Y), and acid-decomposable group (Z), as described above, or may be contained in a repeating unit other than repeating units containing groups (X) to (Z).

Specifically, it is preferred for resin (C) to contain a fluorine atom in either form of a repeating unit shown by the following formula (C3) or (C4).

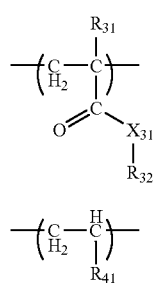

In formulae (C3) and (C4), $X_{31}$ represents an oxygen atom or $-N(R_{33})-$. $R_{33}$ represents a hydrogen atom, an alkyl group, or a cycloalkyl group. The alkyl group may be straight chain or branched, and may have a substituent such as a halogen atom.

$R_{31}$ represents a hydrogen atom, a halogen atom, an alkyl group, or a cycloalkyl group. The alkyl group may be straight chain or branched, and may have a substituent such as a halogen atom.

$R_{32}$ and $R_{41}$ each represents an organic group having at least one fluorine atom.

The alkyl group represented by $R_{31}$ and $R_{33}$ preferably has from 1 to 5 carbon atoms, e.g., a methyl group, an ethyl group, a t-butyl group, etc., are exemplified. The cycloalkyl group represented by $R_{31}$ and $R_{33}$ preferably has from 3 to 10 carbon atoms, e.g., a cyclohexyl group, a cyclooctyl group, etc., are exemplified.

When silicon atom-containing resin (C) contains a fluorine atom, the specific examples of repeating units having a fluorine atom are shown below, but the invention is not restricted thereto.

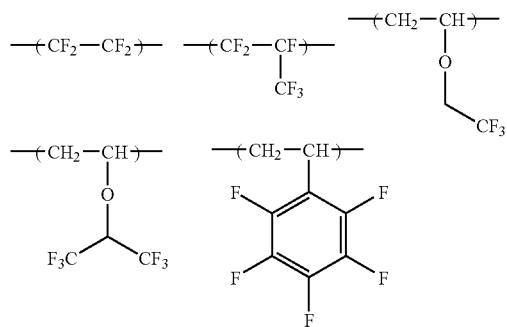

-continued

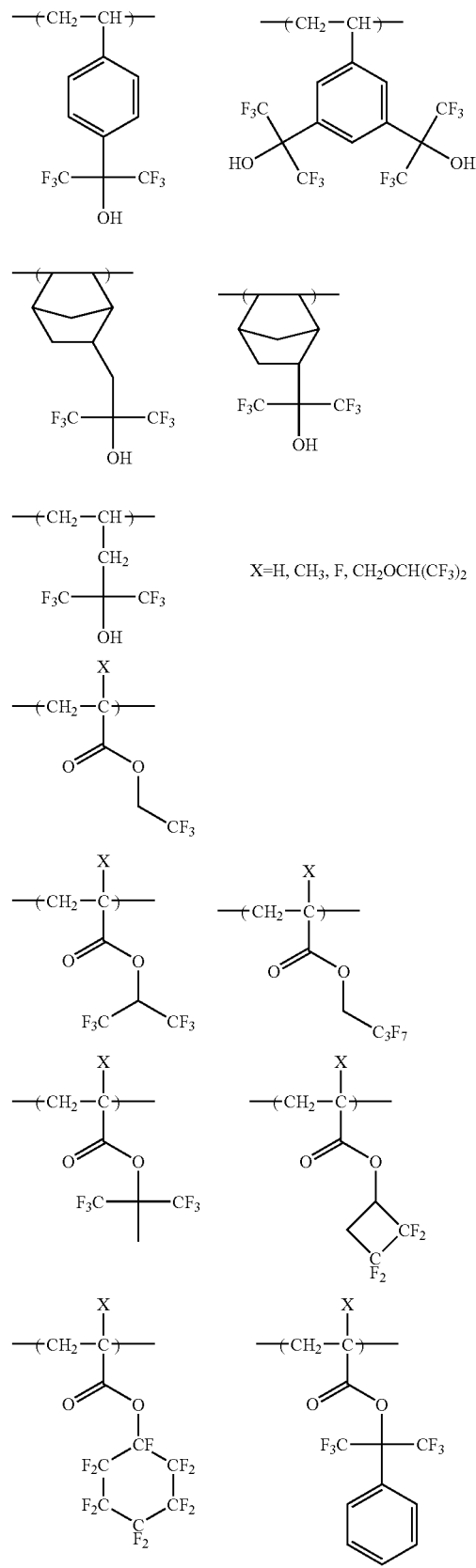

X=H, CH$_3$, F, CH$_2$OCH(CF$_3$)$_2$

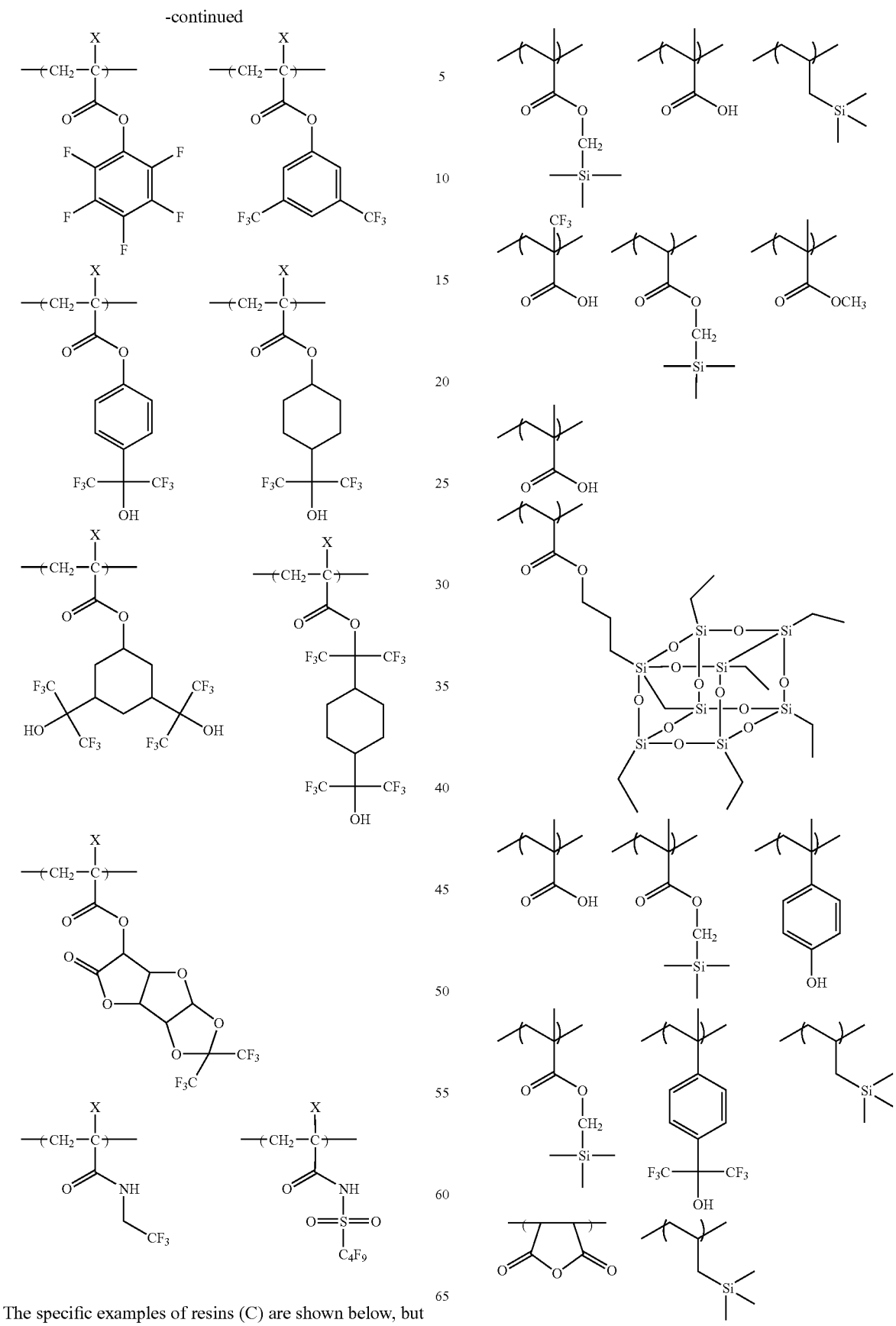
The specific examples of resins (C) are shown below, but the invention is not restricted thereto.

-continued
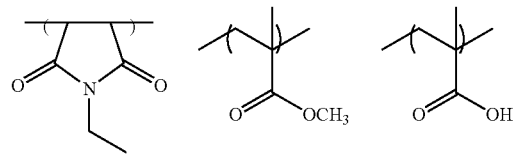
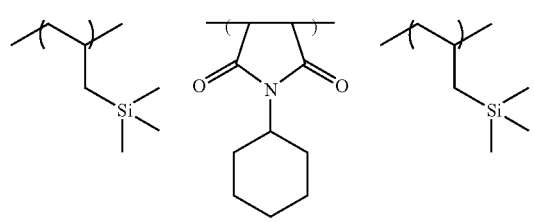
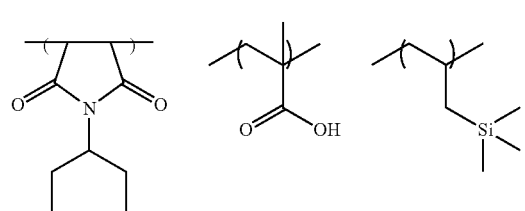
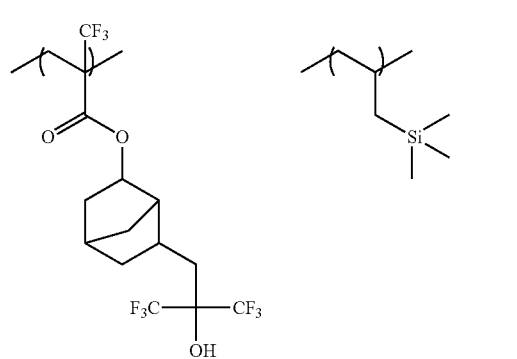
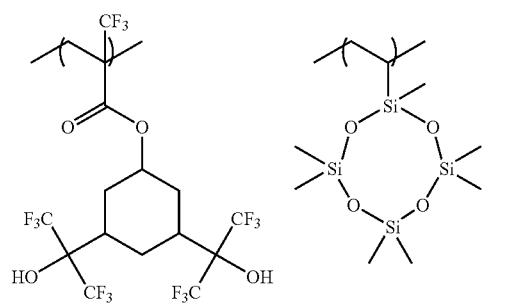
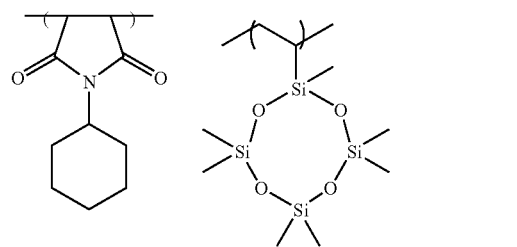
-continued
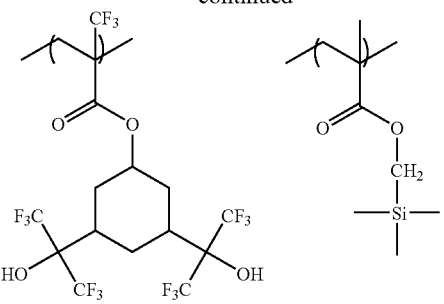
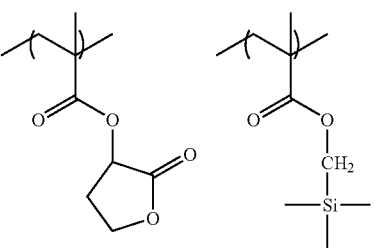
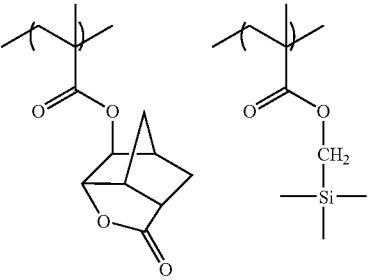
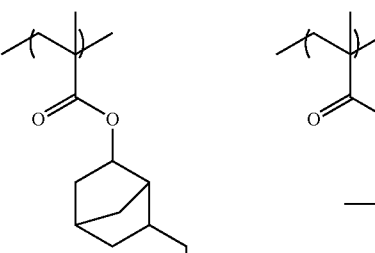
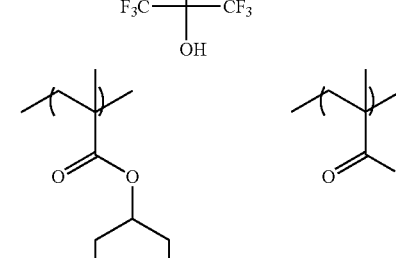
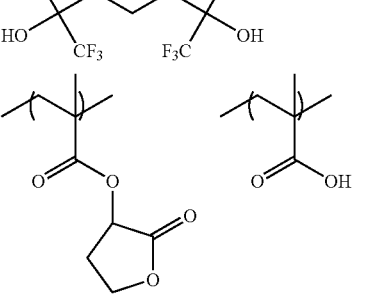

-continued
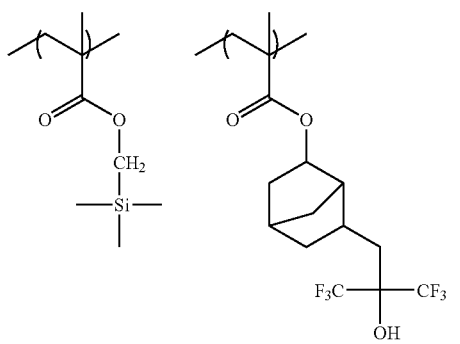
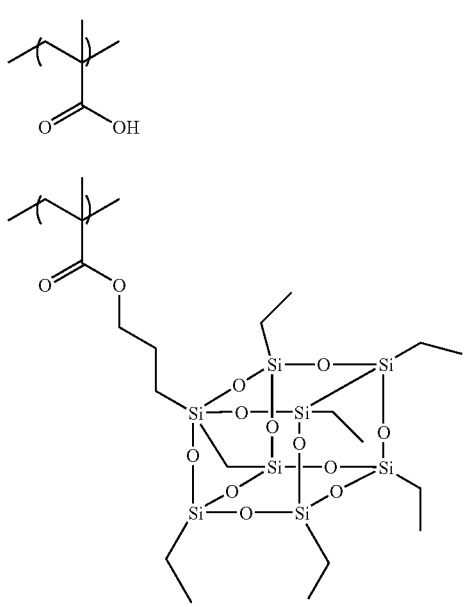
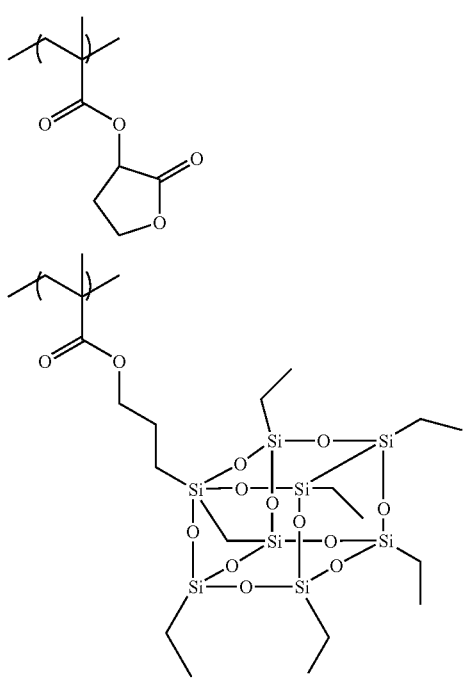
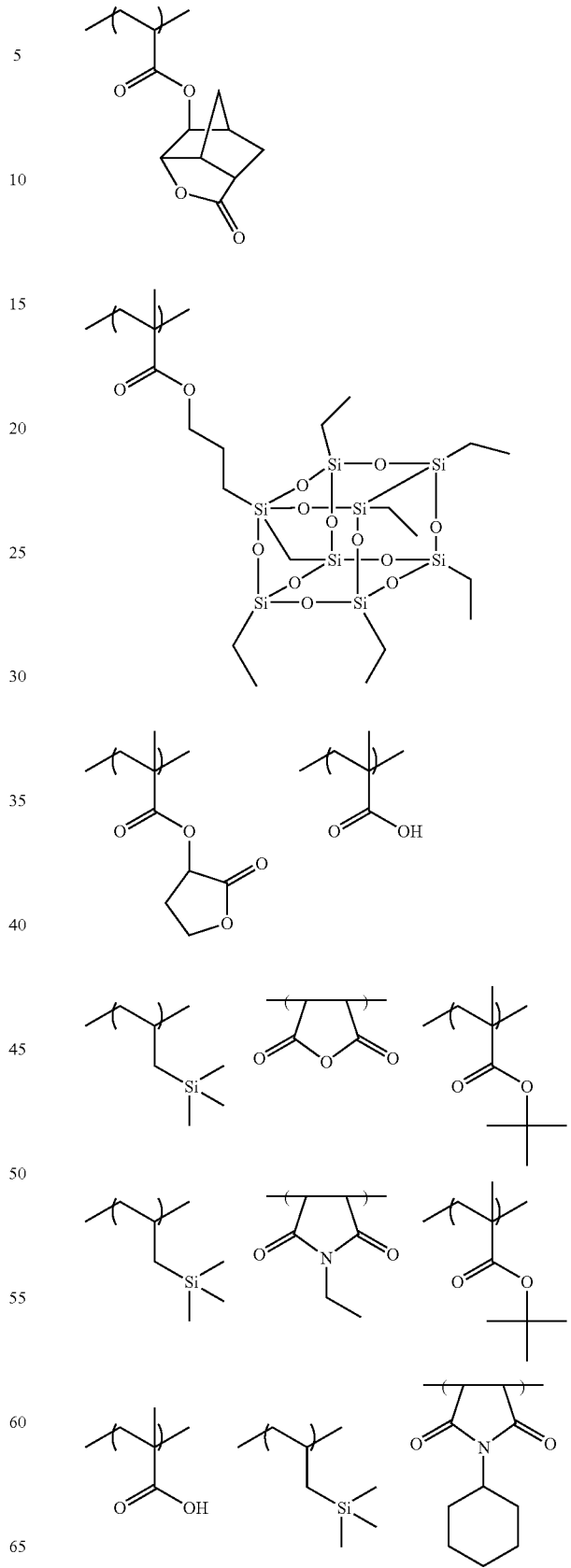

-continued
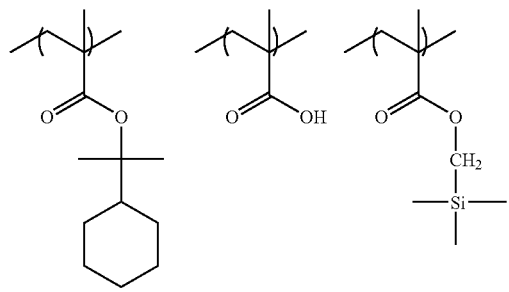
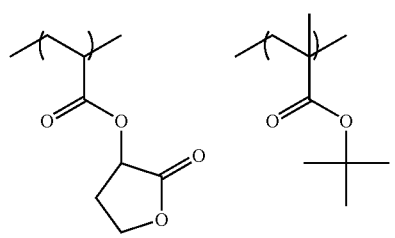
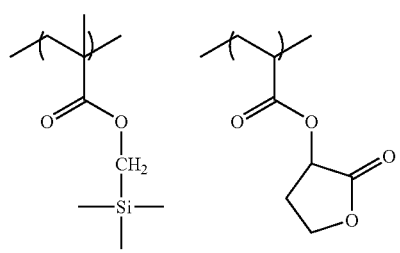
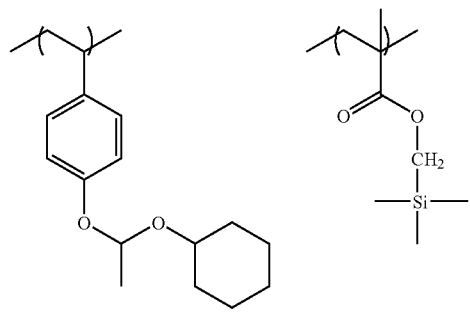
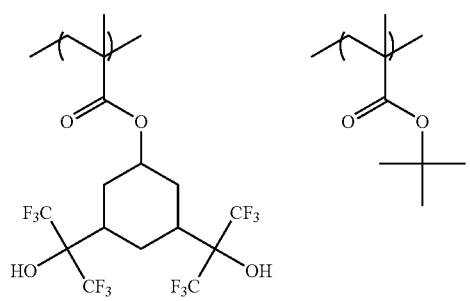
-continued
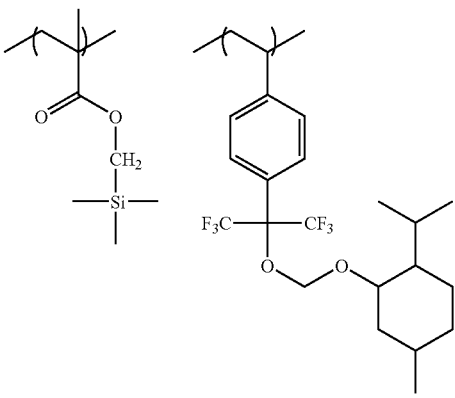
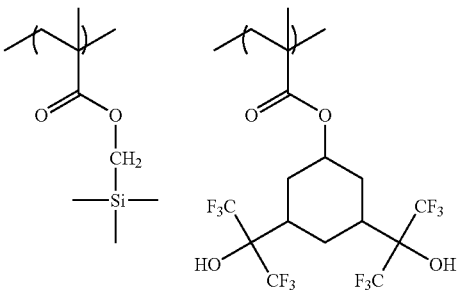
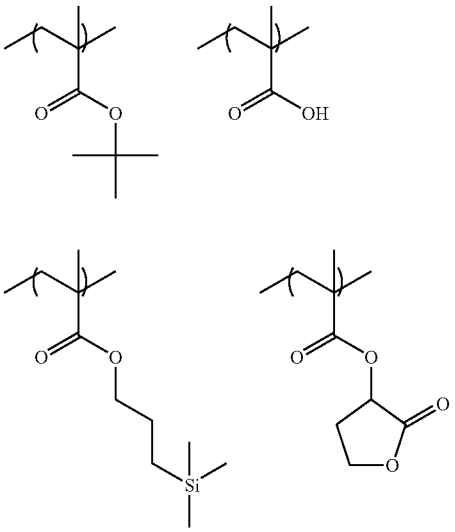
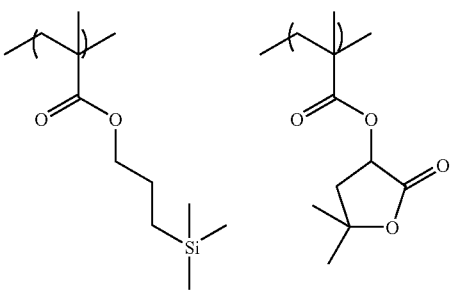

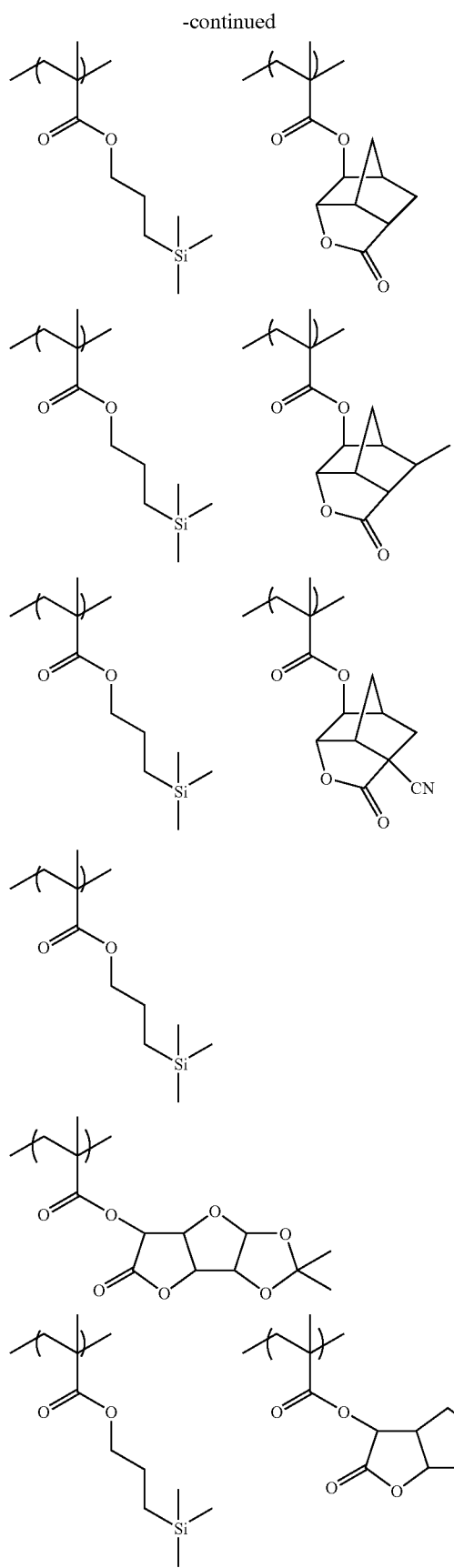
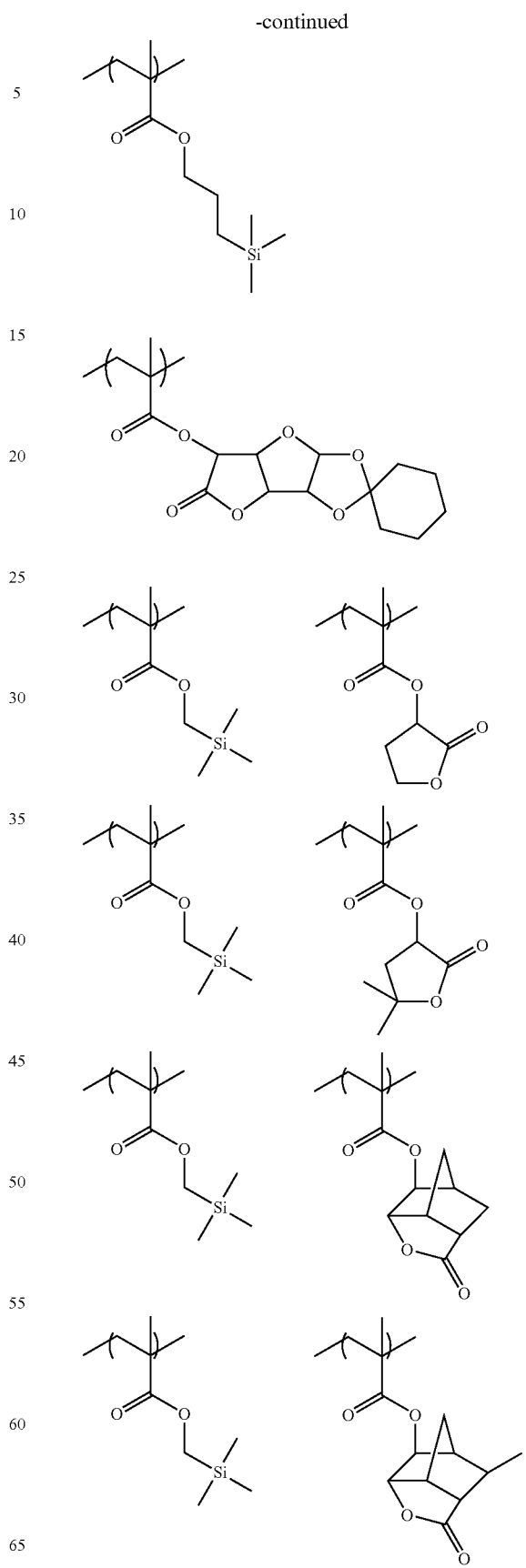

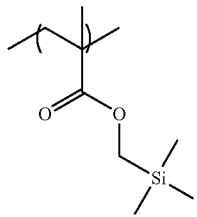 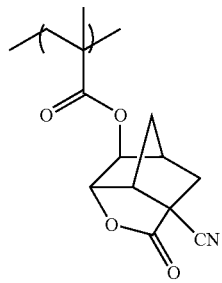
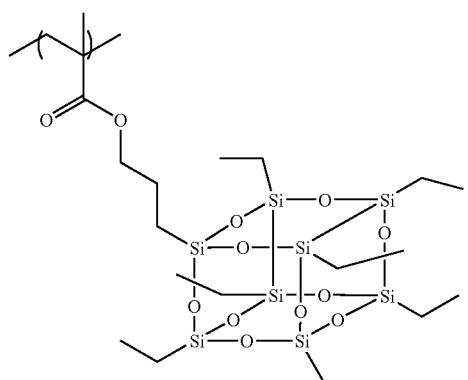
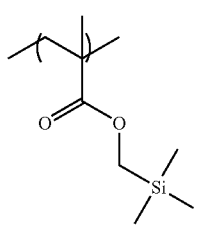
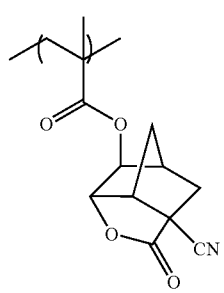
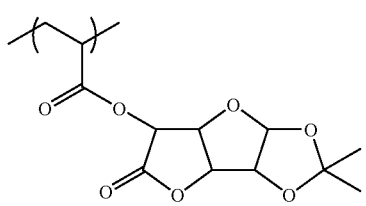
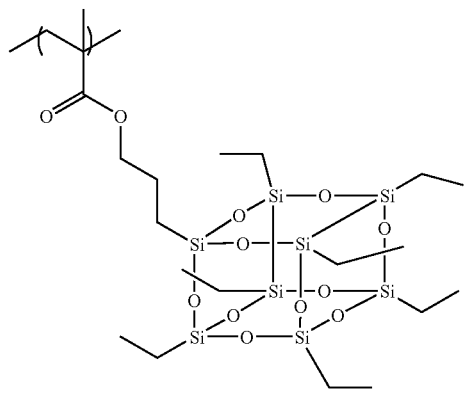
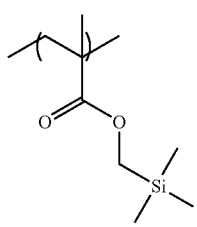 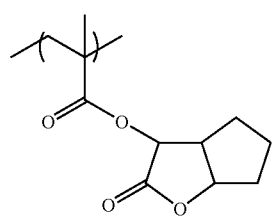
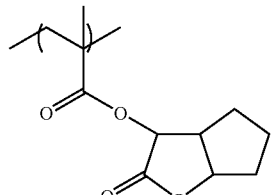
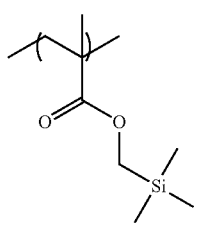
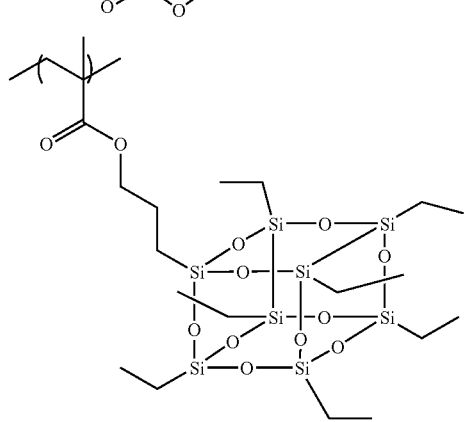
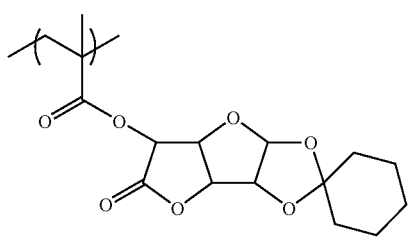

-continued
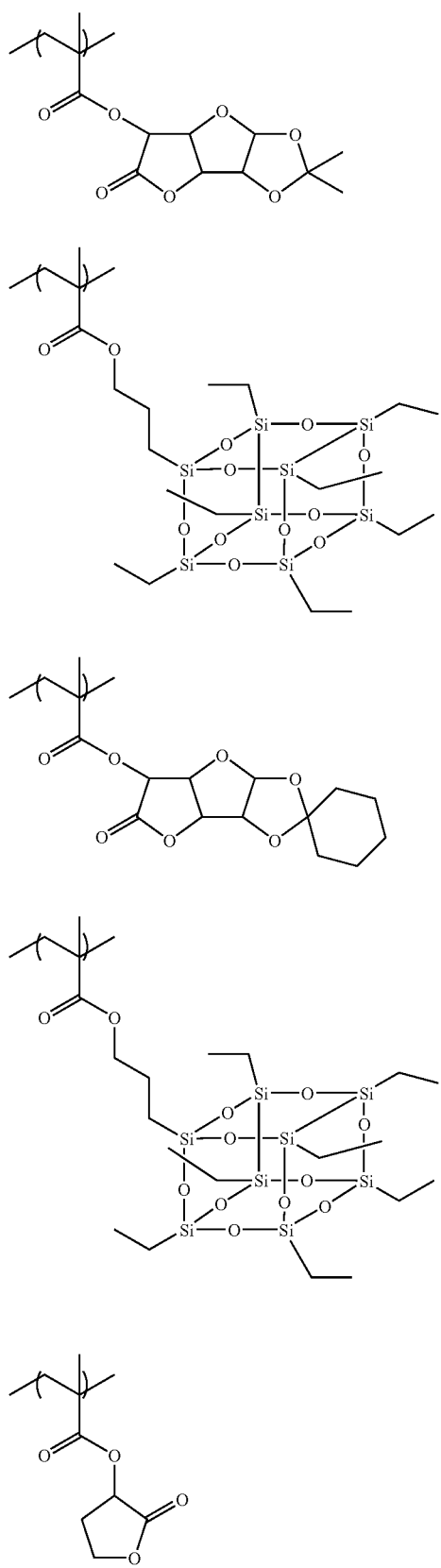
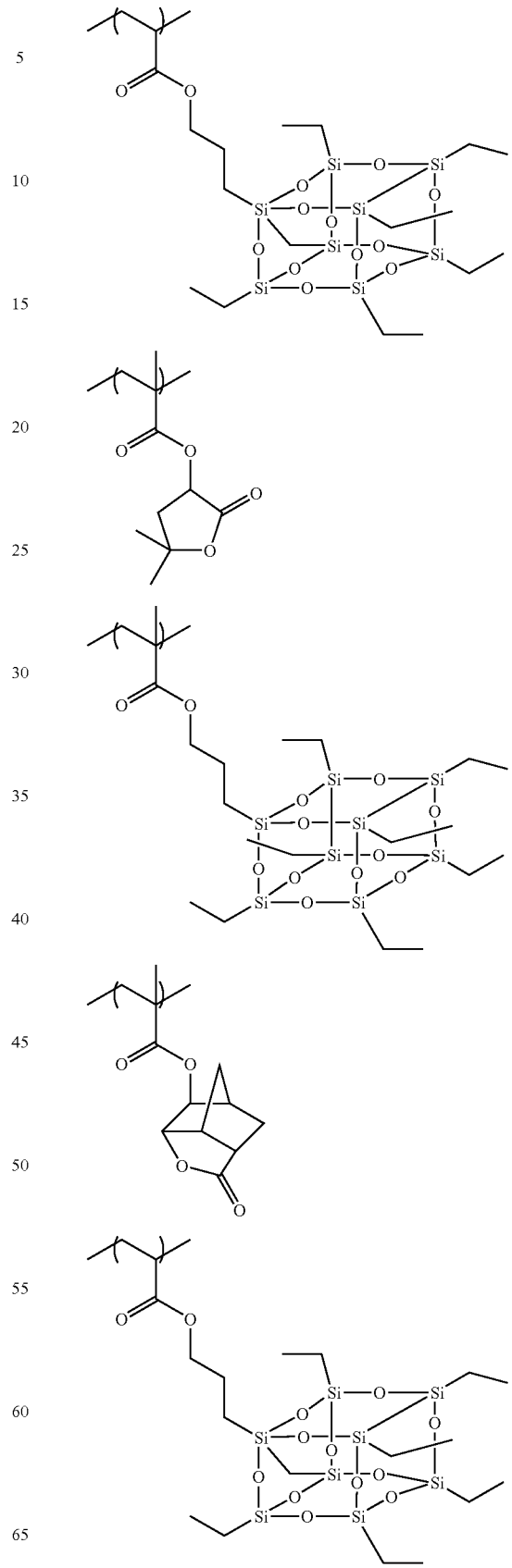

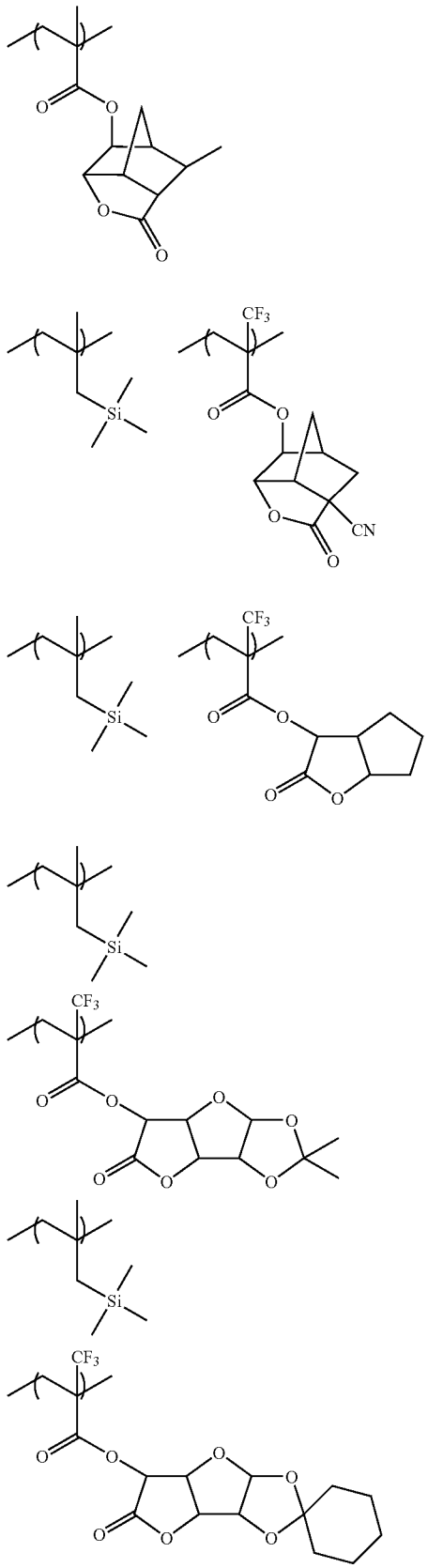

-continued

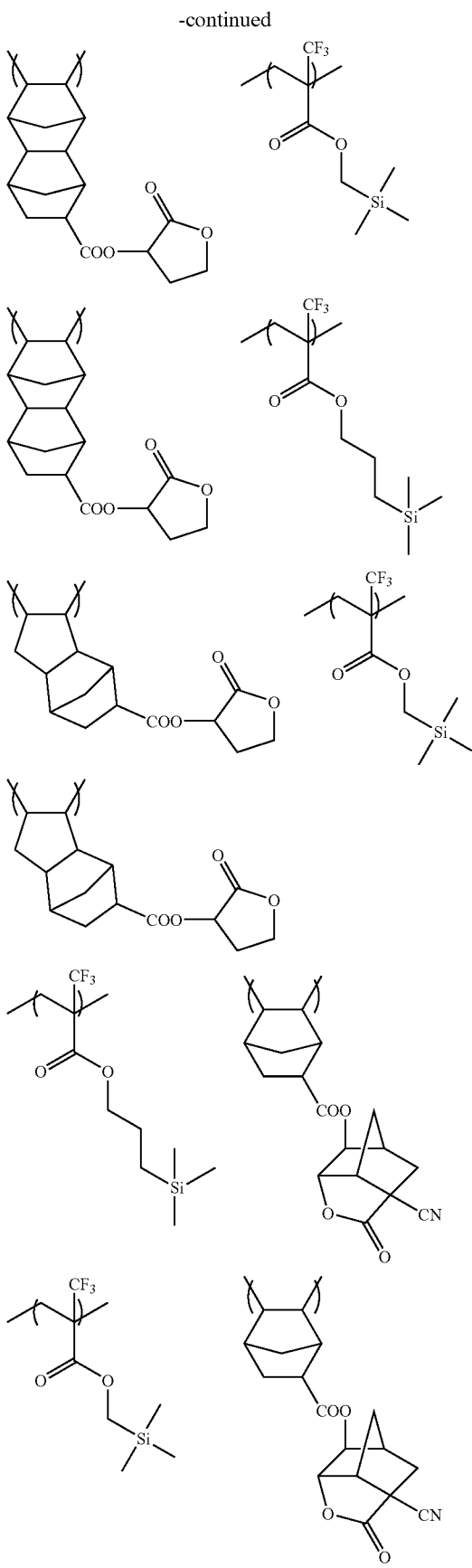

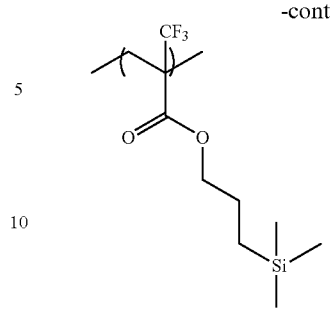

Resin (C) is preferably a resin selected from the following (C-1) to (C-12), and more preferably a resin selected from (C-1) to (C-4), (C-8) to (C-13).

(C-1): A resin comprising repeating unit (a) having a group having a silicon atom, and repeating unit (x) having alkali-soluble group (X), and more preferably a copolymer resin of repeating unit (a) and repeating unit (x).

(C-2): A resin comprising repeating unit (a) having a group having a silicon atom, and repeating unit (y) having group (Y) capable of decomposing by the action of an alkali developer to thereby increase the solubility in an alkali developer, and more preferably a copolymer resin of repeating unit (a) and repeating unit (y).

(C-3): A resin comprising repeating unit (a) having a group having a silicon atom, and repeating unit (z) having group (Z) capable of decomposing by the action of an acid, and more preferably a copolymer resin of repeating unit (a) and repeating unit (z).

(C-4): A resin comprising repeating unit (a) having a group having a silicon atom, repeating unit (x) having alkali-soluble group (X), and repeating unit (y) having group (Y) capable of decomposing by the action of an alkali developer to thereby increase the solubility in an alkali developer, and more preferably a copolymer resin of repeating unit (a), repeating unit (x), and repeating unit (y).

(C-5): A resin comprising repeating-unit (a) having a group having a silicon atom, repeating unit (x) having alkali-soluble group (X), and repeating unit (z) having group (Z) capable of decomposing by the action of an acid, and more preferably a copolymer resin of repeating unit (a), repeating unit (x), and repeating unit (z).

(C-6): A resin comprising repeating unit (a) having a group having a silicon atom, repeating unit (y) having group (Y) capable of decomposing by the action of an alkali developer to thereby increase the solubility in an alkali developer, and repeating unit (z) having group (Z) capable of decomposing by the action of an acid, and more preferably a copolymer resin of repeating unit (a), repeating unit (y), and repeating unit (z).

(C-7): A resin comprising repeating unit (a) having a group having a silicon atom, repeating unit (x) having alkali-soluble group (X), repeating unit (y) having group (Y) capable of decomposing by the action of an alkali developer to thereby increase the solubility in an alkali developer, and repeating unit (z) having group (Z) capable of decomposing by the action of an acid, and more preferably a copolymer resin of repeating unit (a), repeating unit (y), and repeating unit (z).

(C-8): A resin comprising repeating unit (ax) having both alkali-soluble group (X) and a group having a silicon atom, and more preferably a resin comprising repeating unit (ax) alone.

(C-9): A resin comprising repeating unit (ay) having both group (Y) capable of decomposing by the action of an alkali developer to thereby increase the solubility in an alkali developer and a group having a silicon atom, and more preferably a resin comprising repeating unit (ay) alone.

(C-10): A resin comprising repeating unit (ax) having both alkali-soluble group (X) and a group having a silicon atom, and repeating unit (y) having group (Y) capable of decomposing by the action of an alkali developer to thereby increase the solubility in an alkali developer, and more preferably a copolymer resin of repeating unit (ax) and repeating unit (y).

(C-11): A resin comprising repeating unit (ax) having both alkali-soluble group (X) and a group having a silicon atom, and repeating unit (z) having group (Z) capable of decomposing by the action of an acid, and more preferably a copolymer resin of repeating unit (ax) and repeating unit (z).

(C-12): A resin comprising repeating unit (a) having a group having a silicon atom, and repeating unit (ax) having both alkali-soluble group (X) and a group having a silicon atom, and more preferably a copolymer resin of repeating unit (a) and repeating unit (ax).

(C-13): A resin comprising repeating unit (a) having a group having a silicon atom, and repeating unit (ay) having both group (Y) capable of decomposing by the action of an alkali developer to thereby increase the solubility in all alkali developer and a group having a silicon atom, and more preferably a copolymer resin of repeating unit (a) and repeating unit (ay).

In resins (C-1), (C-2) and (C4), the amount of repeating unit (a) to be introduced is preferably from 40 to 99 mol %, and more preferably from 60 to 80 mol %.

In resin (C-10), the amount of repeating unit (ax) to be introduced is preferably from 40 to 99 mol %, and more preferably from 60 to 90 mol %.

When silicon atom-containing resin (C) contains alkali-soluble group (X) and/or alkali-hydrolyzable group (Y), the amount of alkali-soluble group (X) (an acid group) and alkali-hydrolyzable group (Y) (an acid group generated by alkali hydrolysis) is preferably from 2 to 10 meq/g as the acid value of resin (C), and more preferably from 2 to 8 meq/g. The acid value is based on the measurement of the amount of potassium hydroxide (mg) required to neutralize the compound.

When silicon atom-containing resin (C) contains acid-decomposable group (Z), the amount of acid-decomposable group (Z) is preferably from 5 to 100% as mol % of the repeating unit having an acid-decomposable group, and more preferably from 10 to 100%.

The silicon atoms contained in silicon atom-containing resin (C) are preferably from 2 to 50 mass % to the molecular weight of resin (C), and more preferably from 2 to 30 mass %. Repeating units containing silicon atoms are preferably contained from 10 to 100 mass % in resin (C), and more preferably from 20 to 100 mass %.

The weight average molecular weight of silicon atom-containing resin (C) is preferably from 1,000 to 100,000, and more preferably from 1,000 to 50,000.

It is preferred that the residual amount of monomers of silicon atom-containing resin (C) is from 0 to 10 mass %, and more preferably from 0 to 5 mass %. In view of resolution, a resist form, the sidewalls of a resist pattern and roughness, the molecular weight distribution (Mw/Mn, also referred to as the degree of dispersion) of silicon atom-containing resin (C) is preferably from 1 to 5, and more preferably from 1 to 3.

The addition amount of resin (C) in a positive resist composition is preferably from 0.1 to 30 mass % based on the total solids content of the resist composition, more preferably from 0.1 to 10 mass %, and still more preferably from 0.1 to 5 mass %.

Silicon atom-containing resin (C) may be used alone, or a plurality of resins may be mixed.

Similarly to resin (A), it is preferred that silicon atom-containing resin (C) is as a matter of course little in impurities such as metals, the amount of residual monomers and oligomer components is not more than the prescribed value, e.g., preferably 0.1 mass % by HPLC, by which not only the sensitivity and resolution as a resist, processing stability and a pattern form can be bettered, but also a resist composition excellent in the aspects of the foreign matters in the liquid and aging fluctuation such as sensitivity can be obtained.

Silicon atom-containing resin (C) can be synthesized according to ordinary methods, or various commercially available products can be used. For example, a resin can be obtained by radical polymerization as in the synthesis of acid-decomposable resin (A) described above and ordinary purification arid the like.

As the polymerization initiator, for example, V601, V60, V65 (manufactured by Wako Pure Chemical Industries Ltd.) etc. can be used. The polymerization reaction can be controlled by using a chain transfer agent.

(D) Organic Solvents:

As the solvents usable for dissolving the above components to prepare a positive resist composition, e.g., alkylene glycol monoalkyl ether carboxylate, alkylene glycol monoalkyl ether, alkyl lactate, alkylalkoxy propionate, cyclic lactones having from 4 to 10 carbon atoms, monoketone compounds having from 4 to 10 carbon atoms which may contain a ring, alkylene carbonate, alkylalkoxy acetate, and alkyl pyruvate can be exemplified.

As the alkylene glycol monoalkyl ether carboxylate, e.g., propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate are preferably exemplified.

As the alkylene glycol monoalkyl ether, e.g., propylene glycol monomethyl ether, propylene glycol monoethyl ether, propylene glycol monopropyl ether, propylene glycol monobutyl ether, ethylene glycol monomethyl ether, and ethylene glycol monoethyl ether are preferably exemplified.

As the alkyl lactate, e.g., methyl lactate, ethyl lactate, propyl lactate, and butyl lactate can be preferably exemplified.

As the alkylalkoxy propionate, e.g., ethyl 3-ethoxy propionate, methyl 3-methoxy propionate, methyl 3-ethoxy propionate, and ethyl 3-methoxy propionate are preferably exemplified.

As the cyclic lactones having from 4 to 10 carbon atoms, e.g., β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone are preferably exemplified.

As the monoketone compounds having from 4 to 10 carbon atoms which may contain a ring, e.g., 2-butanone, 3-methyl-butanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4, 4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonane, 5-nonane, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclo-hexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methyl-cycloheptanone, and 3-methylcycloheptanone are preferably exemplified.

As the alkylene carbonate, e.g., propylene carbonate, vinylene carbonate, ethylene carbonate, and butylene carbonate are preferably exemplified.

As the alkylalkoxy acetate, e.g., 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate are preferably exemplified.

As the alkyl pyruvate, e.g., methyl pyruvate, ethyl pyruvate, and propyl pyruvate are preferably exemplified.

Solvents having a boiling point of 130° C. or more under room temperature and normal pressure are preferably used, specifically, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate are exemplified.

In the invention solvents may be used alone, or two or more solvents may be used in combination.

In the invention, a mixed solvent comprising a solvent containing a hydroxyl group in the structure and a solvent not containing a hydroxyl group in the structure may be used as organic solvent.

As the solvent containing a hydroxyl group, e.g., ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are particularly preferred.

As the solvent not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide can be exemplified. Of these solvents, propylene glycol monomethyl ether acetate, ethylethoxy propionate, 2-heptanone, γ-butyrolactone, cyclohexanone, and butyl acetate are particularly preferred, and propylene glycol monomethyl ether acetate, ethylethoxy propionate and 2-heptanone are most preferred.

The mixing ratio (by mass) of the solvent containing a hydroxyl group and the solvent not containing a hydroxyl group is from 1/99 to 99/1, preferably from 10/90 to 90/10, and more preferably from 20/80 to 60/40. A mixed solvent comprising 50 mass % or more of a solvent not containing a hydroxyl group is especially preferred in the point of coating uniformity.

(E) Basic Compounds:

For reducing the fluctuation of performances due to aging from exposure to heating, it is preferred for a positive resist composition of the invention to contain basic compound (E).

As preferred basic compounds, compounds having a partial structure represented be any of the following formulae (A) to (E) can be exemplified.

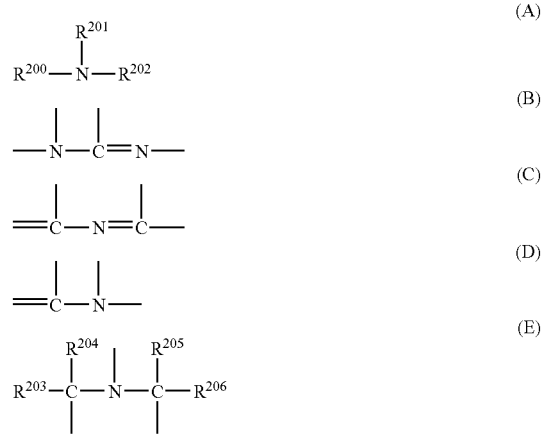

In formulae (A) to (E), $R^{200}$, $R^{201}$ and $R^{202}$, which may be the same or different, each represents a hydrogen atom, an alkyl group having from 1 to 20 carbon atoms, a cycloalkyl group having from 3 to 20 carbon atoms, or an aryl group having from 6 to 20 carbon atoms, and $R^{201}$ and $R^{202}$ may be bonded to each other to form a ring.

The alkyl group may be unsubstituted or substituted, and as the alkyl group having a substituent, an aminoalkyl group having from 1 to 20 carbon atoms, a hydroxyalkyl group having from 1 to 20 carbon atoms, and a cyanoalkyl group having from 1 to 20 carbon atoms are preferred.

$R^{203}$, $R^{204}$, $R^{205}$ and $R^{206}$, which may be the same or different, each represents an alkyl group having from 1 to 20 carbon atoms.

These alkyl groups in formulae (A) to (E) are more preferably unsubstituted.

As the preferred examples of basic compounds, guanidine, aminopyrrolidine, pyrazole, pyrazoline, piperazine, aminomorpholine, aminoalkylmorpholine, and piperidine can be exemplified. As the further preferred compounds, compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, aniline derivatives having a hydroxyl group and/or an ether bond, etc., can be exemplified.

As the compounds having an imidazole structure, 2,4,5-triphenylimidazole, and benzimidazole can be exemplified. As the compounds having a diazabicyclo structure, 1,4-diazabicyclo[2,2,2]octane, 1,5-diazabicyclo[4,3,0]nona-5-ene, and 1,8-diazabicyclo[5,4,0]undeca-7-ene can be exemplified. As the compounds having an onium hydroxide structure, triaryl-sulfonium hydroxide, phenacylsulfonium hydroxide, sulfonium hydroxide having a 2-oxoalkyl group, specifically triphenyl-sulfonium hydroxide, tris(t-butylphenyl)sulfoniun hydroxide, bis(t-butylphenyl)iodonium hydroxide, phenacylthiophenium hydroxide, and 2-oxopropylthiophenium hydroxide can be exemplified. The compounds having an onium carboxylate structure are compounds having an onium hydroxide structure in which the anionic part is carboxylated, e.g., acetate, adamantane-1-carboxylate and perfluoroalkyl carboxylate are exemplified. As the compounds having a trialkylamine structure, tri(n-butyl)amine and tri(n-octyl) amine are exemplified. As the aniline compounds, 2,6-diisopropyl-aniline, N,N-dimethylaniline, N,N-dibutylaniline, and N,N-dihexylaniline are exemplified. As the alkylamine derivatives having a hydroxyl group and/or an ether bond, ethanolamine, diethanolamine, triethanolamine, and tris (methoxyethoxyethyl)amine are exemplified. As the aniline derivatives having a hydroxyl group and/or an ether bond, N,N-bis(hydroxyethyl)aniline is exemplified.

These basic compounds are used alone or in combination of two or more.

The use amount of basic compounds is generally from 0.001 to 10 mass % based on the solids content of the positive resist composition, and preferably from 0.01 to 5 mass %.

The proportion of use amount of acid generators and basic compounds in a composition is preferably acid generator/basic compound (molar ratio) of from 2.5 to 300. That is, from the point of sensitivity and resolution, the molar ratio is preferably 2.5 or more, and in view of the restraint of the reduction of resolution by the thickening of a resist pattern due to aging from exposure to heating treatment, the molar ratio is preferably 300 or less. Acid generator/basic compound (molar ratio) is more preferably from 5.0 to 200, and still more preferably from 7.0 to 150.

(F) Surfactants:

It is preferred for the positive resist composition in the invention to further contain surfactant (F), and it is more preferred to contain either one or two or more of fluorine and/or silicon surfactants (a fluorine surfactant, a silicon surfactant, a surfactant containing both a fluorine atom and a silicon atom).

By containing surfactant (F), it becomes possible for the positive resist composition in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The commercially available surfactants shown below can also be used as they are.

As the commercially available fluorine or silicon surfactants usable in the invention, e.g., Eftop EF301 and EF303 (manufactured by Shin-Akita Kasei Co., Ltd.), Fluorad FC 430, 431 and 4430 (manufactured by Sumitomo 3M Limited), Megafac F171, F173, F176, F189, F113, F110, F177, F120, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.), GF-300 and Gf-150 (manufactured by TOAGOSEI CO., LTD.), Sarfron S-393 (manufactured by SEIMI CHEMICAL CO., LTD.), Eftop EF121, EF122A, EF122B, RF122C, EF125M, EF135M, EF351, 352, EF801, EF802, and EF601 (manufactured by JEMCO INC.), PF636, PF656, PF6320 and PF6520 (manufactured by OMNOVA), and FTX-204D, 208G, 218G 230G 204D, 208D, 212D, 218, and 222D (manufactured by NEOS) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene)) methacrylate are preferred, and they may be distributed at random or may be block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene) acrylate (or methacrylate) may be not only bipolymers but also terpolymers or higher polymers obtained by copolymerization of monomers having different two or more kinds of fluoro-aliphatic groups or different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and poly(oxyalkylene) acrylate (or methacrylate), and copolymers of acrylate (or methacrylate) having a $C_3F_7$ group, poly(oxyethylene) acrylate (or methacrylate), and poly(oxy-propylene) acrylate (or methacrylate) are exemplified.

In the invention, surfactants other than fluorine and/or silicon surfactants can also be used. Specifically, nonionic surfactants, such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkylallyl ether, e.g., polyoxyethylene octylphenol ether, polyoxyethylene nonylphenol ether, etc., polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., and polyoxyethylene sorbitan fatty acid esters, e.g., polyoxy-ethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., can be exemplified.

These surfactants may be used alone or may be used in combination of some kinds.

The amount of surfactants (F) is preferably in proportion of from 0.01 to 10 mass % to the total amount of the positive resist composition (excluding solvents), more preferably from 0.1 to 5 mass %.

(H) Carboxylic Acid Onium Salt:

A positive resist composition in the invention may further contain carboxylic acid onium salt (H). As carboxylic acid onium salt (H), carobxylic acid sulfonium salt, carobxylic acid iodonium salt, carobxylic acid ammonium salt, etc., can be exemplified. As carboxylic acid onium salt (H), iodonium salt and sulfonium salt are preferred. It is preferred that the carboxylate residue of carboxylic acid onium salt (H) of the invention does not contain an aromatic group and a carbon-carbon double bond. An especially preferred anion moiety is a straight chain or branched, monocyclic or polycyclic alkylcarboxylate anion having from 1 to 30 carbon atoms, and the carboxylate anion in which a part or all of the alkyl groups are substituted with fluorine atoms are more preferred. An oxygen atom may be contained in the alkyl chain, by which the transparency to the lights of 220 nm or less is ensured, sensitivity and resolution are enhanced, and condensation and rarefaction dependency and exposure margin are improved.

As fluorine-substituted carboxylate anions, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, 2,2-bistrifluoromethylpropionic acid, etc., are exemplified.

These carboxylic acid onium salts (H) can be synthesized by reacting sulfonium hydroxide, iodonium hydroxide, or ammonium hydroxide and carboxylic acid with silver oxide in an appropriate solvent.

The content of carboxylic acid onium salt (H) in a composition is generally from 0.1 to 20 wt % to the total solids content of the composition, preferably from 0.5 to 10 wt %, and more preferably from 1 to 7 wt %.

Other Additives:

If necessary, dyes, plasticizers, photosensitizers, light absorbers, alkali-soluble resins, dissolution inhibitors, and compounds for accelerating solubility in a developing solution (e.g., phenolic compounds having a molecular weight of 1,000 or less, alicyclic or aliphatic compounds having a carboxyl group) may further be added to a positive resist composition in the present invention.

Such phenolic compounds having a molecular weight of 1,000 or less can be easily synthesized with referring to the methods disclosed, e.g., in JP-A-4-122938, JP-A-2-2853 1, U.S. Pat. No. 4,916,210, and EP 219294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, cyclohexanedicarboxylic acid, etc., are exemplified, but the invention is not limited to these compounds.

Physical Properties of Resist Composition:

From the viewpoint of the improvement of resolution, it is preferred that a positive resist composition in the invention is used in a film thickness of from 30 to 250 nm, and more preferably from 30 to 200 nm. Such a film thickness can be obtained by prescribing the concentration of solids content in a positive resist composition in an appropriate range to give proper viscosity to thereby improve coating property and film forming property.

The concentration of entire solids content in a positive resist composition is generally preferably from 1 to 10 mass %, more preferably from 1 to 8 mass %, and still more preferably from 1.0 to 7.0 mass %.

Pattern Forming Method:

A positive resist composition in the invention is used by dissolving the above components in a prescribed organic solvent, preferably in a mixed solvent as described above, filtering the resulting solution through a filter, and coating the solution on a prescribed support as follows. Filters for filtration are preferably made of polytetrafluoroethylene, polyethylene or nylon having a pore diameter of 0.1 μm or less, more preferably 0.05 μm or less, and still more preferably 0.03 μm or less.

For example, a positive resist composition is coated on a substrate such as the one used in the manufacture of precision integrated circuit elements (e.g., silicon/silicon dioxide coating) by an appropriate coating method with a spinner or a coater, and dried to form a photosensitive film.

The photosensitive film is then irradiated with actinic ray or radiation through a prescribed mask, and the exposed film is preferably subjected to baking (heating), development and rinsing, whereby a good pattern can be obtained.

As actinic rays or radiation, infrared rays, visible rays, ultraviolet rays, far ultraviolet rays, X-rays and electron beams can be exemplified, preferably vacuum ultraviolet rays of wavelengths of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and an ArF excimer laser, an $F_2$ excimer laser, EUV (13 nm), and electron beams are preferably used.

Prior to formation of a photosensitive film, an antireflection film may be coated on a substrate in advance.

As antireflection films, an inorganic film type, e.g., titanium, titanium dioxide, titanium nitride, chromium oxide, carbon, and amorphous silicon, and an organic film type comprising a light absorber and a polymer material are exemplified, and any of these materials can be used. As the organic antireflection films, commercially available organic antireflection films such as DUV30 series and DUV-40 series (manufactured by Brewer Science), AR-2, AR-3 and AR-5 (manufactured by Shipley Company LLC), etc., can be used.

In a development process, an alkali developer is used as follows. As the alkali developer of a resist composition, alkaline aqueous solutions of inorganic alkalis, e.g., sodium hydroxide, potassium hydroxide, sodium carbonate, sodium silicate, sodium metasilicate, and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanol-amine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkali developers.

The alkali concentration of alkali developers is generally from 0.1 to 20 mass %.

The pH of alkali developers is generally from 10.0 to 15.0.

Further, an appropriate amount of alcohols and surfactants may be added to the alkali aqueous solution.

A developing method may be, for instance, a developing method where a developing solution is fed on a resist film disposed on a substrate and a puddle owing to the developing solution is formed on the resist film to bring the substrate to standstill or to rotate the substrate at a low-speed, or a developing method where a developing solution is fed on a resist film disposed on a substrate and, without forming a puddle owing to a developing solution on a resist film, the substrate is rotated at a high-speed.

Pure water can also be used as a rinsing liquid and an appropriate amount of surfactants may be added thereto.

After development process or rinsing process, a process to remove the developing solution or rinsing liquid on the pattern can be performed by supercritical fluid.

At the time of irradiation with actinic ray or radiation, exposure (immersion exposure) may be performed by filling a liquid (an immersion medium) having higher refractive index than that of air between a resist film and a lens, by which resolution can be raised. As the immersion medium, any liquids can be used so long as they are liquids higher in refractive index than air, but pure water is preferred. An overcoat layer may further be provided on a photosensitive film so that an immersion medium and the photosensitive film are not directly touched in performing immersion exposure, by which the elution of the composition from the photosensitive film to the immersion medium is restrained and development defect can be reduced.

Before or after the immersion exposure process (or in both), a surface of a resist film can be cleaned with a cleaning liquid. The cleaning liquid may be a water system and an organic system. However, water or a water-miscible organic solvent such as methanol, ethanol or isopropyl alcohol is desirable. Owing to the cleaning process before or after the immersion exposure process, dust and particles on a surface of the resist film can be reduced and thereby the defective performance can be improved.

An immersion liquid for use in immersion exposure is described below.

An immersion liquid for use in immersion exposure preferably has a temperature coefficient of refractive index as small as possible so as to be transparent to the exposure wavelength and to hold the distortion of optical image reflected on the resist to the minimum. In particular, when the exposure light source is an ArF excimer laser (wavelength: 193 nm), it is preferred to use water as the immersion liquid for easiness of availability and easy handling property, in addition to the above points.

Further, in view of the improvement of refractive index, a medium having a refractive index of 1.5 or more can also be used, e.g., an aqueous solution and an organic solvent can be used as the medium.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As such an additive, aliphatic alcohols having a refractive index almost equal to the refractive index of water is preferred, specifically methyl alcohol, ethyl alcohol and isopropyl alcohol are exemplified. By the addition of an alcohol having a refractive index almost equal to that of water, even if the alcohol component in water is evaporated and the concentration of the content is changed, the fluctuation of the refractive index of the liquid as a whole can be made extremely small. On the other hand, when substances opaque to the light of 193 nm or impurities largely different from water in a refractive index are mixed, these substances bring about the distortion of the optical image reflected on the resist. Accordingly the water used is preferably distilled water. Further, pure water filtered through an ion exchange filter may be used.

The electric resistance of water is preferably 18.3 MΩ·cm or higher, and TOC (organic material concentration) is preferably 20 ppb or lower. Further, it is preferred that water has been subjected to deaeration treatment.

It is possible to heighten lithographic performance by increasing the refractive index of an immersion liquid. From such a point of view, additives capable of heightening a refractive index may be added to water, or heavy water ($D_2O$) may be used in place of water.

A film hardly soluble in an immersion liquid (hereinafter also referred to as "topcoat") may be provided between a positive resist film comprising a positive resist composition of the invention and an immersion liquid so as to prevent the resist film from touching the immersion liquid directly. The necessary functions required of a topcoat are the aptitude for coating on the upper layer of a resist, the transparency to radiation, particularly the transparency to the light of 193 nm, and the insolubility in an immersion liquid. It is preferred that a topcoat is not mixed with a resist and capable of being coated uniformly on a resist upper layer.

From the viewpoint of the transparency to 193 nm, polymers not containing aromatic groups are preferred as a topcoat. Specifically, hydrocarbon polymers, acrylic ester polymers, polymethacrylic acid, polyacrylic acid, polyvinyl ether, silicon-containing polymers and fluorine-containing polymers are exemplified. Considering that impurities eluting from a topcoat to an immersion liquid soil an optical lens, the residual monomer components of a polymer contained in a topcoat is preferably less.

When a topcoat is peeled, a developing solution may be used, or a remover may be used separately. As the remover, solvents low in osmosis into a resist are preferred. In view of capable of performing peeling process at the same time with the development process of a resist, peeling by an alkali developer is preferred. From the viewpoint of performing peeling by an alkali developer, a topcoat is preferably acidic, but from the point of non-intermixture with a resist, it may be neutral or alkaline.

Resolution increases when there is no difference in the refractive indexes between a topcoat and an immersion liquid. When water is used as the immersion liquid in an ArF excimer laser (wavelength: 193 nm) exposure light source, it is preferred that the refractive index of the topcoat for ArF immersion exposure is preferably near the refractive index of the immersion liquid. For bringing the refractive index of the topcoat near to that of the immersion liquid, it is preferred for the topcoat to contain a fluorine atom. Further, from the viewpoint of the transparency and refractive index, the topcoat is preferably a thin film.

It is preferred that a topcoat should not be mixed with a resist, and further not mixed with an immersion liquid. From this point of view, when water is used as the immersion liquid, the solvent for a topcoat is preferably hardly soluble in the solvent of the resist and a water-insoluble medium. Further, when an immersion liquid is an organic solvent, the topcoat may be water-soluble or water-insoluble.

A resist composition according to the invention, when it is formed into a resist film, preferably has the sweepback contact angle to water of 65° or more. In particular, the sweepback contact angle is preferably in the range of 65 to 80°. Furthermore, the sweepback contact angle to water of a resin film that is made of a resin (C) alone is preferably in the range of 70 to 110°. Here, the sweepback contact angle is one obtained under normal temperature and normal pressure. The sweepback contact angle is a contact angle when an interface of a liquid drop recedes from a surface of the resist film.

EXAMPLE

The invention will be described in further detail with reference to examples, but the contents of the invention are by no means restricted thereto.

Examples 1 to 60 and Comparative Examples 1 to 3

The structures, compositions (molar ratios correspond to repeating units from the left side in order), weight average molecular weights (Mw), and the degrees of dispersion (Mw/Mn) of resins (A) used in Examples and Comparative Examples are shown below.

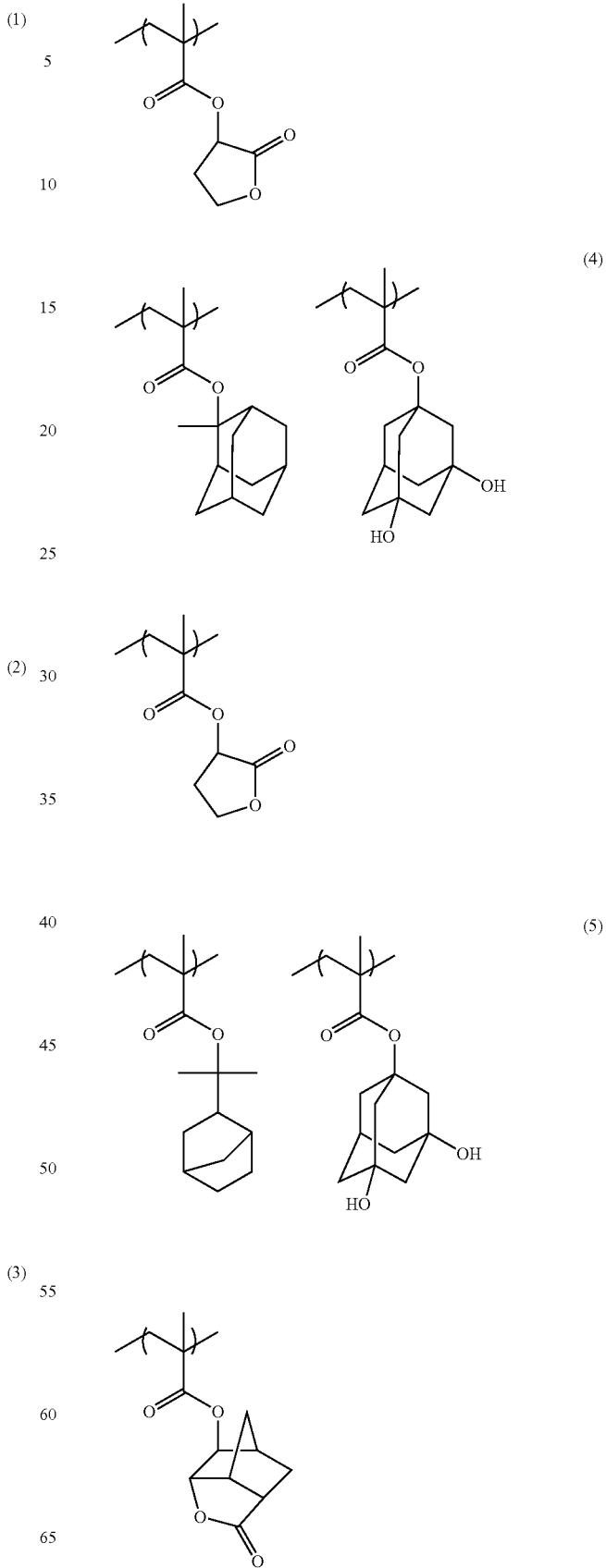

-continued
(6)
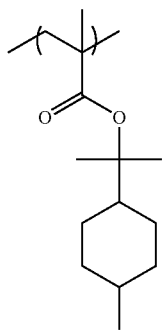 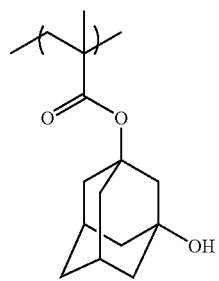
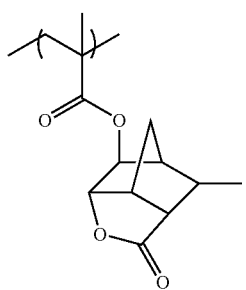
(7)
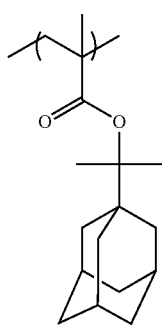
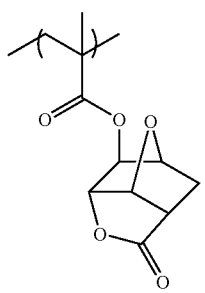
(8)
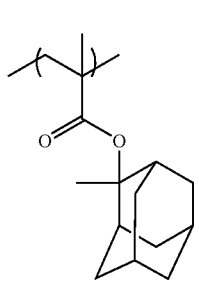
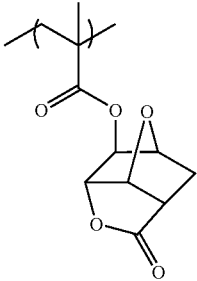
(9)
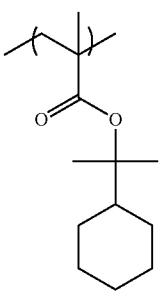 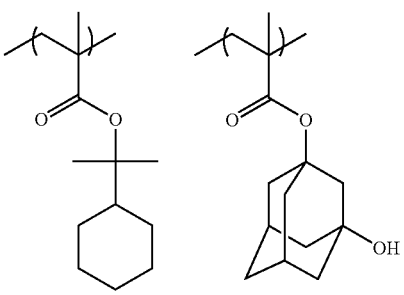
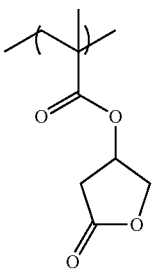
(10)
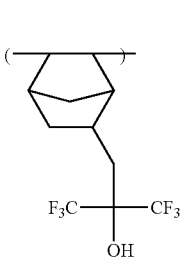 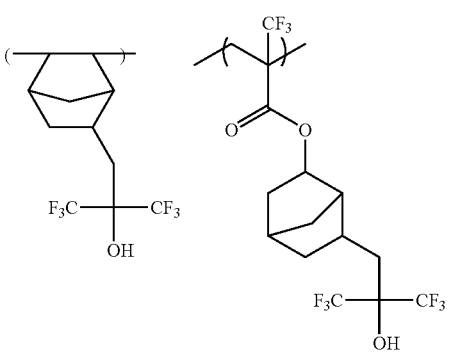
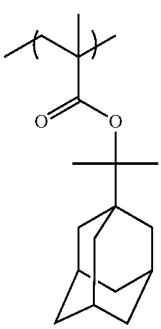

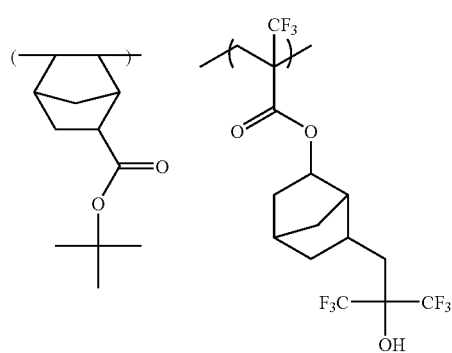
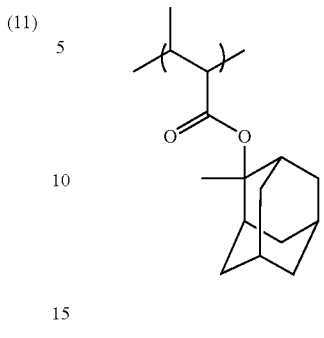
(11)
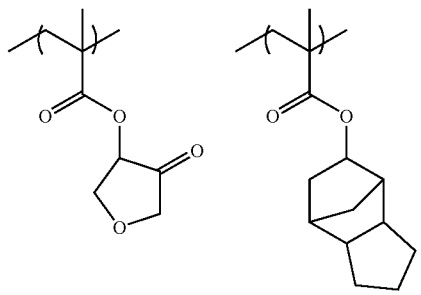
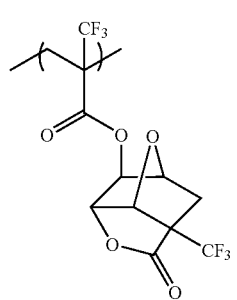
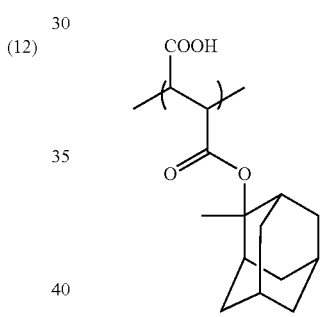
(12)
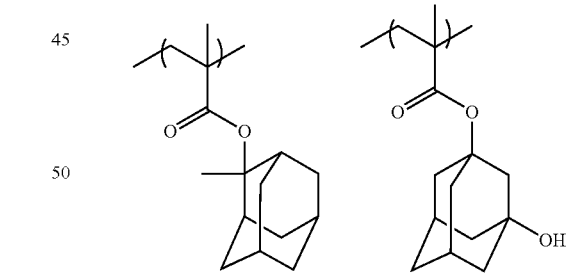
(15)
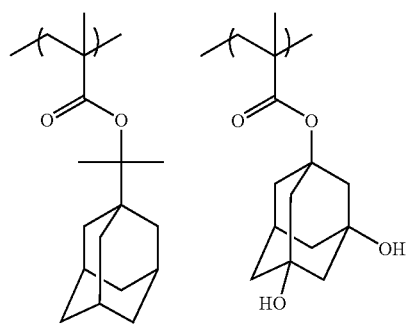
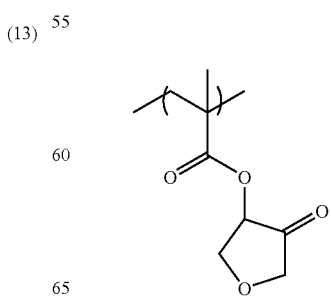
(16)
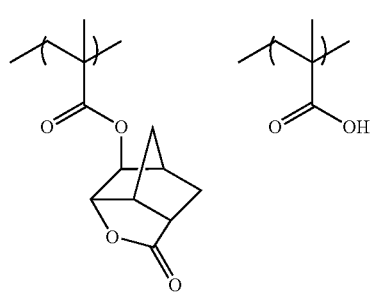
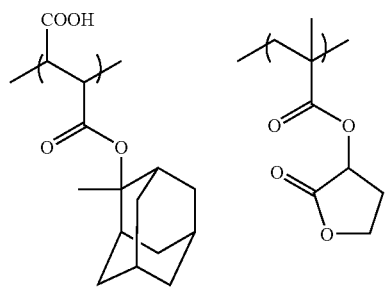
(13)

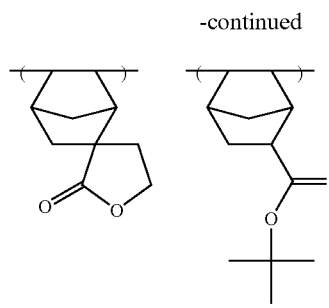
(17)
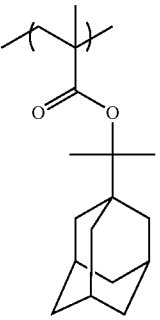
(20)
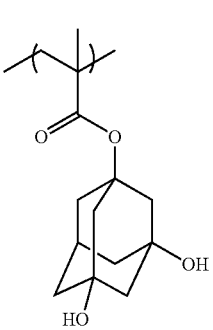
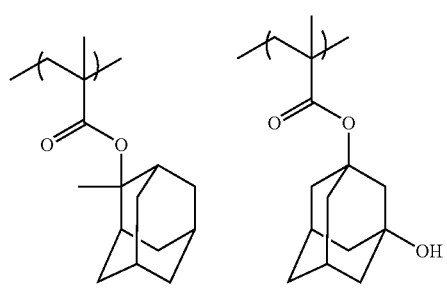
(18)
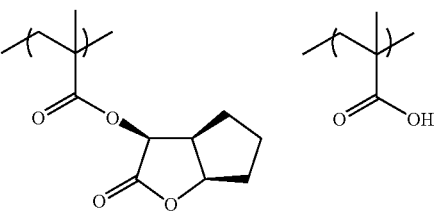
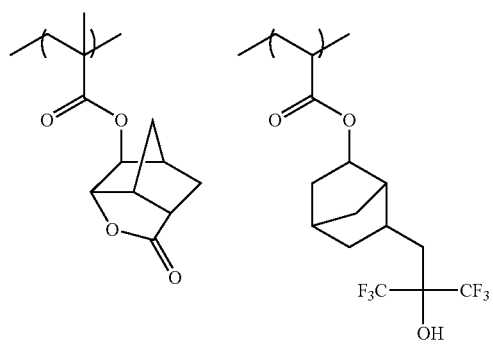
(21)
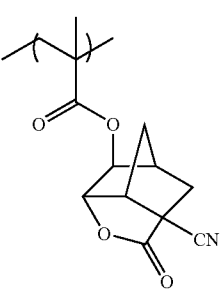
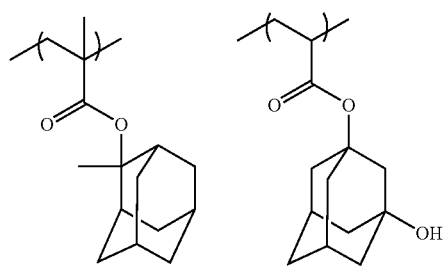
(19)
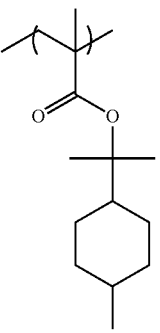
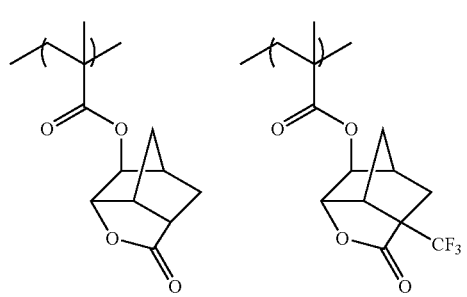
(22)
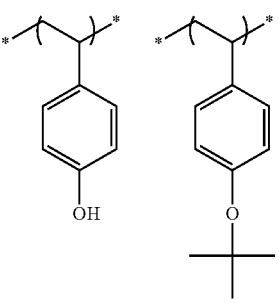

-continued
(23)
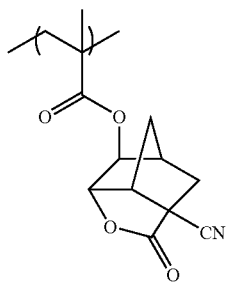 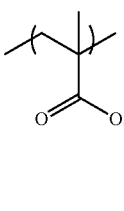
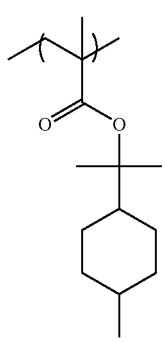
(24)
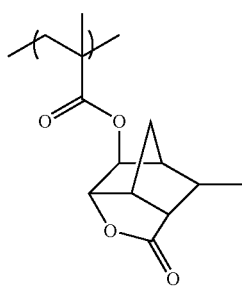
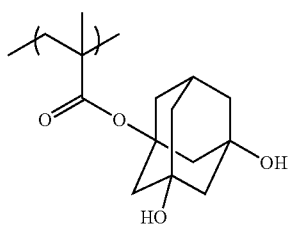
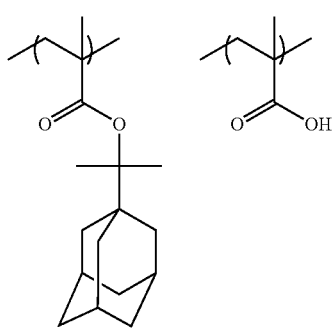
-continued
(25)
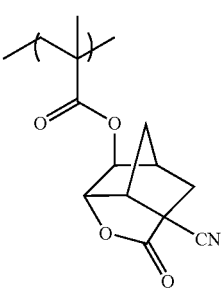 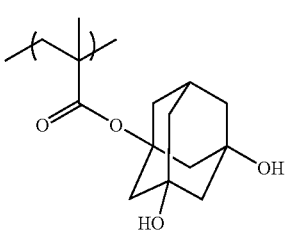
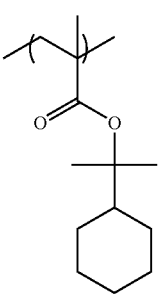 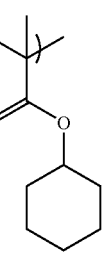
(26)
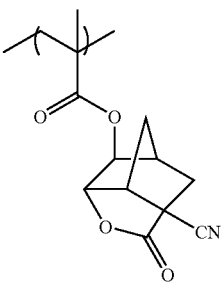
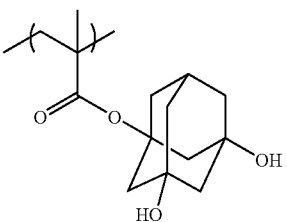 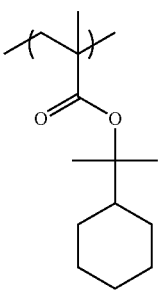
(27)
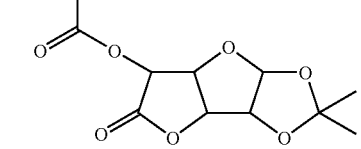
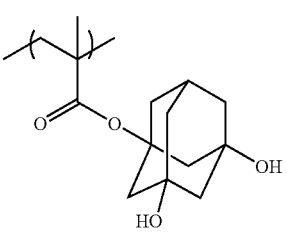

-continued
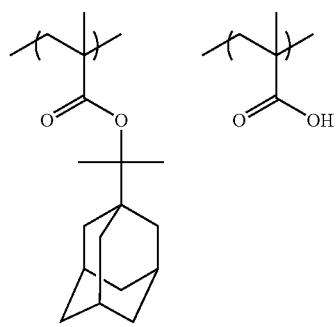
(28)
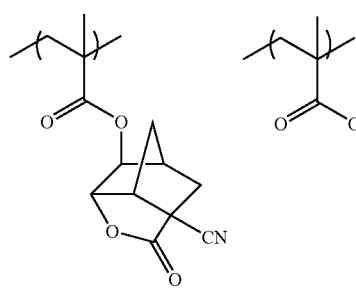
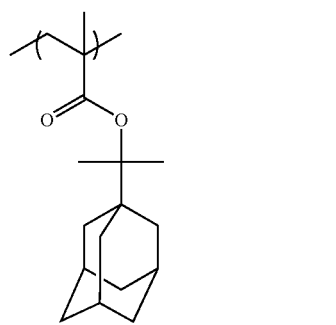
(29)
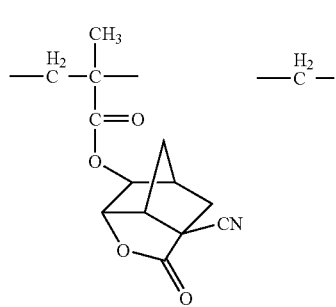
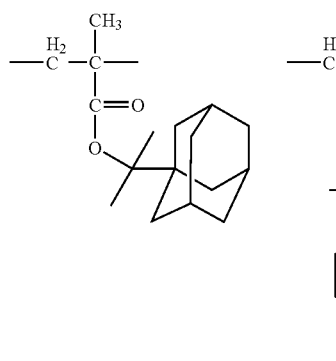
-continued
(30)
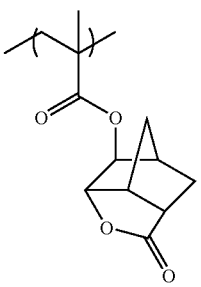
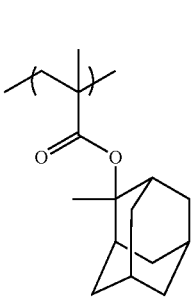
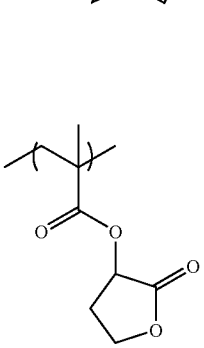
(31)
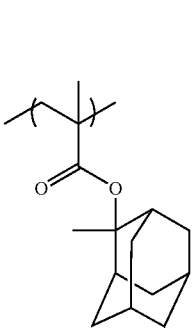
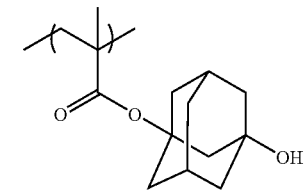
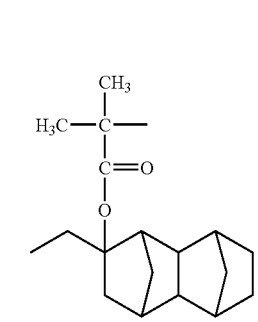
(32)
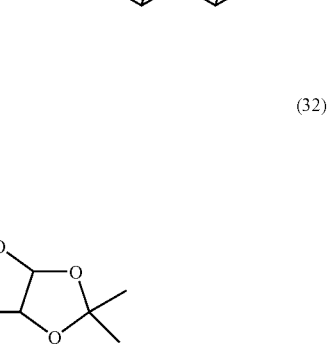

-continued

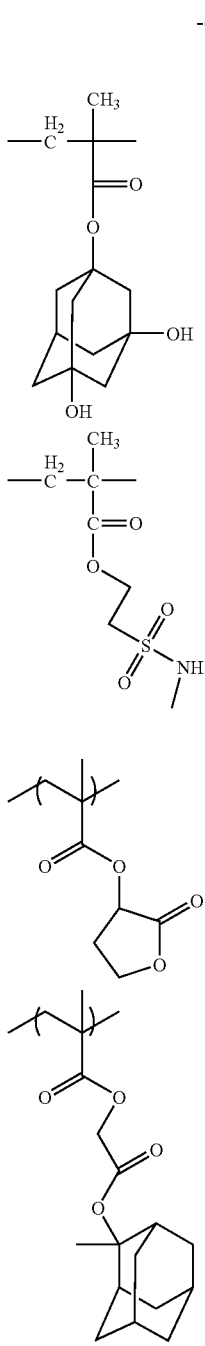

(33)

TABLE 1

| Resin | Composition | Mw | Mw/Mn |
|---|---|---|---|
| 1 | 39/20/41 | 9,800 | 1.9 |
| 2 | 40/22/38 | 12,000 | 2.0 |
| 3 | 34/33/33 | 11,000 | 2.3 |
| 4 | 45/15/40 | 10,500 | 2.1 |
| 5 | 35/15/50 | 6,700 | 2.2 |
| 6 | 30/25/45 | 8,400 | 2.3 |
| 7 | 39/20/41 | 10,500 | 2.1 |
| 8 | 49/10/41 | 9,500 | 2.5 |
| 9 | 35/32/33 | 14,000 | 2.6 |
| 10 | 35/35/30 | 6,700 | 2.3 |
| 11 | 40/22/38 | 8,500 | 2.5 |

TABLE 1-continued

| Resin | Composition | Mw | Mw/Mn |
|---|---|---|---|
| 12 | 40/20/35/5 | 12,500 | 2.4 |
| 13 | 50/50 | 14,000 | 1.9 |
| 14 | 40/15/40/5 | 10,000 | 1.8 |
| 15 | 50/50 | 8,300 | 1.5 |
| 16 | 40/15/40/5 | 9,800 | 2.3 |
| 17 | 50/50 | 5,200 | 2.1 |
| 18 | 35/20/40/5 | 6,100 | 2.3 |
| 19 | 30/30/30/10 | 8,600 | 2.5 |
| 20 | 40/20/35/5 | 12,000 | 2.1 |
| 21 | 40/20/40 | 7,800 | 1.9 |
| 22 | 80/20 | 8,800 | 2.1 |

TABLE 2

| Resin | Composition | Mw | Mw/Mn |
|---|---|---|---|
| 23 | 50/10/40 | 7,600 | 1.7 |
| 24 | 40/20/30/10 | 7,500 | 1.7 |
| 25 | 40/10/40/10 | 9,500 | 1.7 |
| 26 | 45/15/40 | 9,300 | 1.7 |
| 27 | 45/25/25/5 | 8,600 | 1.6 |
| 28 | 50/20/30 | 5,300 | 1.7 |

TABLE 3

| Resin | Composition | Mw | Mw/Mn |
|---|---|---|---|
| 29 | 40/20/30/10 | 6800 | 1.5 |
| 30 | 40/20/20/20 | 7200 | 1.6 |
| 31 | 40/20/30/10 | 8800 | 1.6 |
| 32 | 40/20/30/10 | 5800 | 2.1 |
| 33 | 40/20/40 | 7000 | 1.7 |

SYNTHESIS EXAMPLE 1

Synthesis of Resin (C-1)

Methyl (trimethylsilyl) methacrylate and methacrylic acid in the proportion of 50/50 were put in a reaction vessel and dissolved in propylene glycol monomethyl ether acetate to prepare 450 g of a solution having the concentration of solids content of 22%. To the solution was added 5 mol % of a polymerization initiator V-601 (manufactured by Wako Pure Chemical Industries Ltd.), and, in the nitrogen atmosphere, the solution was dropped to 50 ml of propylene glycol monomethyl ether acetate heated at 80° C. over 2 hours. After completion of dropping, the reaction solution was stirred for 2 hours to obtain Reaction Solution (C-1). After termination of the reaction, Reaction Solution (C-1) was cooled to room temperature, crystallized with ten times the amount of a mixed solvent of hexane/ethyl acetate of 90/10, the precipitated white powder was filtered and the objective Resin (C-1) was recovered.

The polymer composition ratio of Resin (C-1) found by $^{13}$CNMR and oxidimetry was 50/50. The weight average molecular weight as the standard polystyrene equivalent by the GPC measurement was 13,200, and the degree of dispersion was 2.2.

SYNTHESIS EXAMPLE 2

Synthesis of Resin (C-2)

Resin (C-2) was synthesized in the same method as in Synthesis Example 1 by putting the materials in the reaction vessel in the proportion of 30/70. Methanol was used as the solvent in crystallization. The polymer composition ratio of Resin (C-2) found by $^{13}$CNMR and oxidimetry was 32/68. The weight average molecular weight as the standard polystyrene equivalent by the GPC measurement was 13,000, and the degree of dispersion was 2.1.

SYNTHESIS EXAMPLE 3

Synthesis of Resin (C-3)

Allyltrimethylsilane, maleic anhydride, and t-butyl methacrylate in the proportion of 40/40/20 were were put in the reaction vessel and dissolved in propylene glycol monomethyl ether acetate to prepare 450 g of a solution having the concentration of solids content of 50%. To the solution was added 4 mol % of a polymerization initiator V-65 (manufactured by Wako Pure Chemical Industries Ltd.), and, in the nitrogen atmosphere, the solution was stirred for 5 hours to obtain Reaction Solution (C-3). After termination of the reaction, Reaction Solution (C-3) was cooled to room temperature, crystallized with five times the amount of a mixed solvent of methanol, the precipitated white powder was filtered and the objective Resin (C-3) was recovered.

The polymer composition ratio of Resin (C-3) found by $^{13}$CNMR was 35/35/30. The weight average molecular weight as the standard polystyrene equivalent by the GPC measurement was 8,500, and the degree of dispersion was 1.8.

SYNTHESIS EXAMPLE 4

Synthesis of Resin (C-4)

Allyltrimethylsilane, N-ethylmaleimide and methacrylic acid in the proportion of 35/35/30 were put in the reaction vessel and dissolved in tetrahydrofuran to prepare 300 g of a solution having the concentration of solids content of 80%. To the solution was added 5 mol % of a polymerization initiator V-65 (manufactured by Wako Pure Chemical Industries Ltd.), and, in the nitrogen atmosphere, the solution was dropped to 30 ml of tetrahydrofuran heated at 65° C. over 4 hours. After completion of dropping, the reaction solution was stirred for 2 hours to obtain Reaction Solution (C-4). After termination of the reaction, Reaction Solution (C-4) was cooled to room temperature, crystallized with five times the amount of a mixed solvent of hexane/ethyl acetate of 90/10, the precipitated white powder was filtered and the objective Resin (C-4) was recovered.

The polymer composition ratio of Resin (C-4) found by $^{13}$CNMR and oxidimetry was 32/32/36. The weight average molecular weight as the standard polystyrene equivalent by the GPC measurement was 10,000, and the degree of dispersion was 2.1.

SYNTHESIS EXAMPLE 5

Synthesis of Resin (C-5)

Methacryloxypropylheptaethyl-T8-silsesquioxane and methacrylic acid in the proportion of 40/60 were put in the reaction vessel and dissolved in tetrahydrofuran to prepare 450 g of a solution having the concentration of solids content of 50%. To the solution was added 4 mol % of a polymerization initiator V-65 (manufactured by Wako Pure Chemical Industries Ltd.), and, in the nitrogen atmosphere, the solution was stirred for 5 hours to obtain Reaction Solution (C-5).

After termination of the reaction, Reaction Solution (C-5) was cooled to room temperature, crystallized with ten times the amount of a mixed solvent of methanol, the precipitated white powder was filtered and the objective Resin (C-5) was recovered.

The polymer composition ratio of Resin (C-5) found by $^{13}$CNMR was 35/65. The weight average molecular weight as the standard polystyrene equivalent by the GPC measurement was 8,500, and the degree of dispersion was 1.8.

Further, Resins (C-6) to (C-12) could be obtained according to the same synthesis method.

The weight average molecular weights as the standard polystyrene equivalent by the GPC measurement, composition ratios (molar ratios correspond to repeating units from the left side in order), and the degrees of dispersion of Resins (C-6) to (C-12) are summarized in the following Table 4.

TABLE 4

| Resin | Composition | Mw | Mw/Mn |
|---|---|---|---|
| (C-6) | 30/70 | 5,900 | 2.0 |
| (C-7) | 15/15/70 | 6,100 | 1.9 |
| (C-8) | 30/70 | 7,000 | 1.8 |
| (C-9) | 30/70 | 6,200 | 1.7 |
| (C-10) | 35/65 | 5,100 | 1.7 |
| (C-11) | 30/70 | 5,600 | 1.6 |
| (C-12) | 50/50 | 5,000 | 1.7 |

TABLE 5

| Resin | Composition | Mw | Mw/Mn |
|---|---|---|---|
| (C-13) | 50/50 | 8500 | 1.2 |
| (C-14) | 15/20/65 | 16000 | 1.3 |

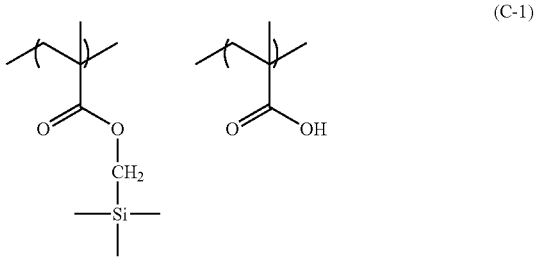

(C-1)

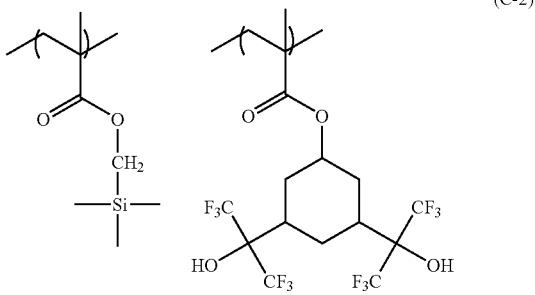

(C-2)

-continued
(C-3)
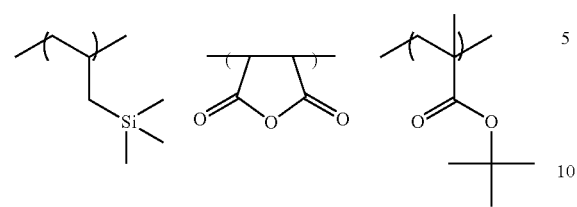
(C-4)
(C-5)
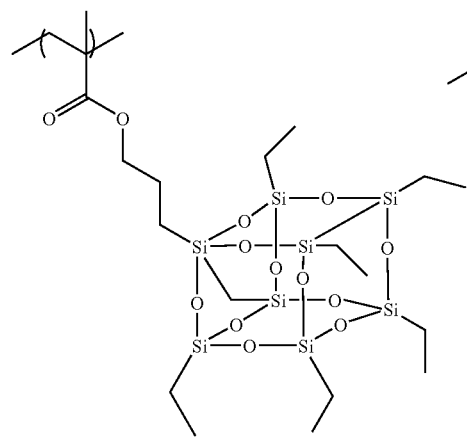 
(C-6)
(C-7)
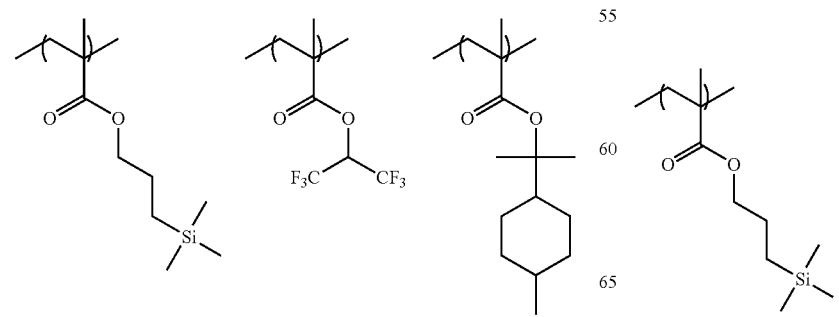
-continued
(C-8)
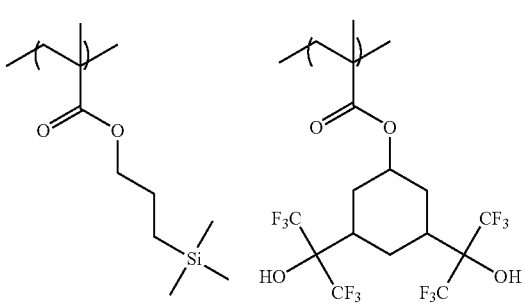
(C-9)
(C-10)
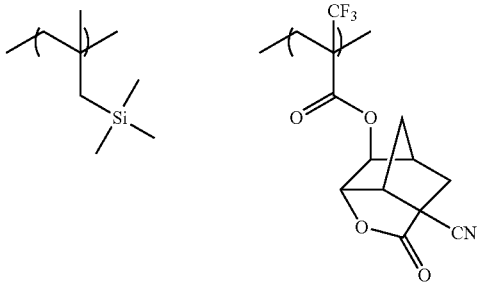
(C-11)
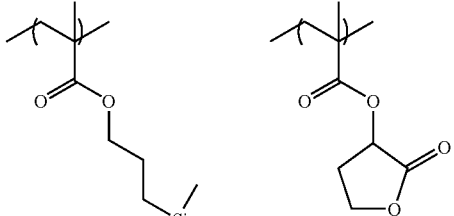
(C-12)
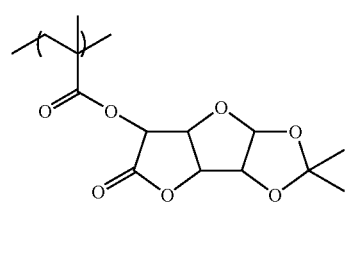

-continued

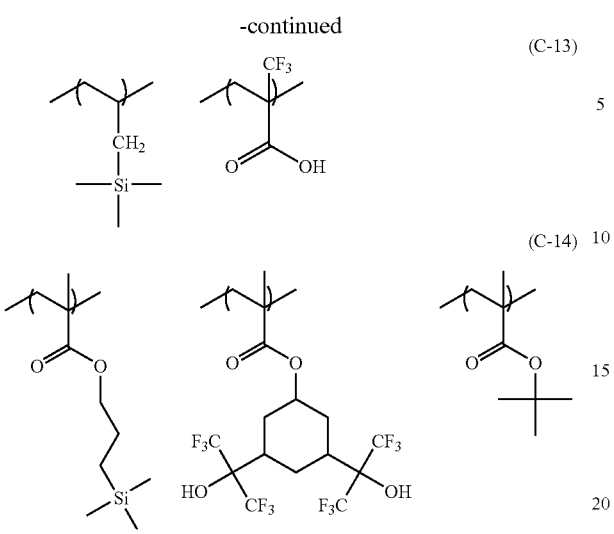

(C-13)

(C-14)

Preparation of Resist:

The components of each sample shown in Tables 7 to 10 below were dissolved in a solvent to prepare a solution having the concentration of solids content of 7 mass %, and each solution was filtered through a polyethylene filter having a pore diameter of 0.1 μm, whereby a positive resist solution was obtained. The thus prepared positive resist solutions were evaluated by the following methods. The results obtained are shown in Tables 7 to 10. Regarding each component in Tables 7 to 10, when two or more components are used, the ratio is mass ratio.

Image Performance Test:

Exposure Condition (1):

An organic antireflection film ARC29A (manufactured by Nissan Chemical Industries, Ltd.) was coated on a silicone wafer, and the coated layer was baked at 205° C. for 60 seconds to form an antireflection film having a thickness of 78 nm. The prepared positive resist composition was coated thereon, and baked at 120° C. for 60 seconds, whereby a resist film having a thickness of 250 nm was formed. The obtained wafer was subjected to pattern exposure with an ArF excimer laser scanner (PAS 5500/1100, NA: 0.75, σo/σi=0.85/0.55, manufactured by ASML). After that, the wafer was heated at 120° C. for 60 seconds, and then subjected to development with a tetramethylammonium hydroxide aqueous solution (2.38 mass %) for 30 seconds, rinsing with pure water, and spin drying, whereby a resist pattern was obtained.

Exposure Condition (2):

This condition is to form a resist pattern by immersion exposure with pure water.

An organic antireflection film ARC29A (manufactured by Nissan Chemical Industries, Ltd.) was coated on a silicone wafer, and the coated layer was baked at 205° C. for 60 seconds to form an antireflection film having a thickness of 78 nm. The prepared positive resist composition was coated thereon, and baked at 120° C. for 60 seconds, whereby a resist film having a thickness of 250 nm was formed. The obtained wafer was subjected to pattern exposure with an ArF excimer laser immersion scanner (NA: 0.75). As the immersion liquid, super pure water of specific resistivity of 18.0 MΩ or higher was used. After that, the wafer was heated at 120° C. for 60 seconds, and then subjected to development with a tetramethylammonium hydroxide aqueous solution (2.38 mass %) for 30 seconds, rinsing with pure water, and spin drying, whereby a resist pattern was obtained.

Examples 61 through 74 are similarly processed under the conditions shown in Table 6 below to obtain resist patterns.

TABLE 6

|  | Bake temperature of resist composition after coating (time) | Film Thickness (nm) | Bake temperature after exposure (time) | Developing Time (sec) |
| --- | --- | --- | --- | --- |
| Example 61 | 110° C. (60 sec) | 250 | 120° C. (60 sec) | 30 |
| Example 62 | 120° C. (60 sec) | 200 | 115° C. (60 sec) | 30 |
| Example 63 | 130° C. (60 sec) | 150 | 130° C. (60 sec) | 30 |
| Example 64 | 110° C. (60 sec) | 160 | 120° C. (60 sec) | 30 |
| Example 65 | 100° C. (60 sec) | 180 | 110° C. (60 sec) | 60 |
| Example 66 | 90° C. (60 sec) | 140 | 120° C. (60 sec) | 30 |
| Example 67 | 120° C. (60 sec) | 150 | 120° C. (60 sec) | 90 |
| Example 68 | 130° C. (60 sec) | 150 | 120° C. (60 sec) | 30 |
| Example 69 | 110° C. (60 sec) | 100 | 100° C. (60 sec) | 30 |
| Example 70 | 115° C. (60 sec) | 160 | 120° C. (60 sec) | 30 |
| Example 71 | 125° C. (60 sec) | 140 | 120° C. (60 sec) | 30 |
| Example 72 | 110° C. (90 sec) | 220 | 120° C. (60 sec) | 30 |
| Example 73 | 110° C. (30 sec) | 180 | 120° C. (60 sec) | 30 |
| Example 74 | 110° C. (60 sec) | 150 | 120° C. (60 sec) | 30 |

Profile:

The profile of the obtained pattern was observed with a scanning electron microscope (S-9260, manufactured by Hitachi, Ltd.) and evaluated.

Line Edge Roughness:

Concerning the edge in the machine direction of the line pattern in the range of 5 μm, the distance from the intrinsic base line of the edge was measured at 50 points with an SEM (S-8840, manufactured by Hitachi, Ltd.), and standard deviation was found and 3σ was computed. The smaller the value, the better is the performance.

Figure 2:
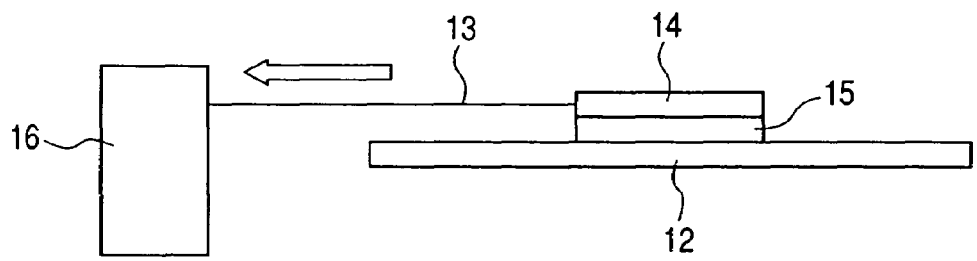
FIG. 2 is a schematic view showing the state of evaluating the following ability of water to a quartz plate.
Figure 3A:
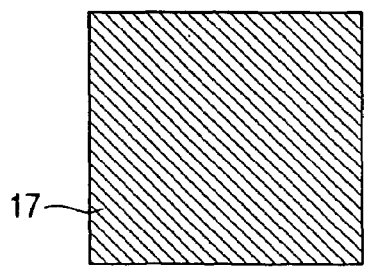
FIGS. 3A to 3D are schematic views showing the following ability of water to a quartz plate.
Figure 3B:
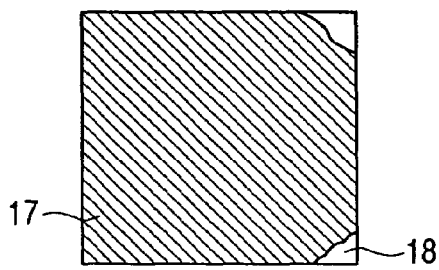
Figure 3C:
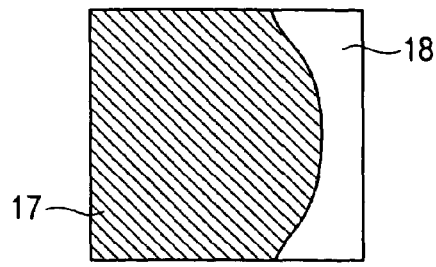
Figure 3D:
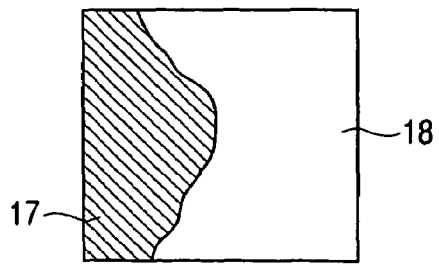

Following Ability of Water:

Each positive resist composition prepared was coated on a silicone wafer and baked at 115° C. for 60 seconds to thereby form a resist film having a thickness of 200 nm. In the next place, as shown in FIG. 2, 15 ml of distilled water was dropped with a pipet on the central part of wafer 12 coated with the positive resist composition. Quartz plate 14 of 10 cm square having kite string 13 was put on the distilled water paddle and the entire space between wafer 12 and quartz plate 14 was filled with distilled water 15.

Subsequently, in the state that wafer 12 was fixed, kite string 13 attached to quartz plate 14 was wound on the rotating part of motor 16 rotating at a speed of 30 cm/sec, and motor 16 was switched on for 0.5 sec and quartz plate 14 was moved. After quartz plate 14 was moved, the amount of the distilled water remained under quartz plate 14 was judged by the following criteria, and this was taken as the following ability of water.

FIG. 3A to 3D are typical views showing various patterns looked down at quartz plate 3 from above after moving the quartz plate. Oblique lines 17 show the area of distilled water remained under the quartz plate, and blank area 18 is the area where distilled water could not follow-up the movement of the quartz plate and air got into.

As shown in (a), the case where distilled water remains on the whole surface after moving the quartz plate is graded o, the area where air is getting into stays 10% or so to the area of the quartz plate as shown in (b) is graded A, and the area where air is getting into is 20% or more to the area of the quartz plate as shown in (c) and (d) is graded x.

Measurement of Sweepback Contact Angle:

The prepared positive resist composition was coated on a silicone wafer by spin coating and baked on a hot plate to thereby form a resist film having a thickness of 200 nm. The sweepback contact angle of a droplet was measured according to an extending and contracting method of a dynamic contact angle meter (manufactured by Kyowa Interface Science Co., Ltd.). A droplet having an initial droplet size of 35 μl was sucked at a rate of 6 μl/sec. for 5 seconds, and the value where the dynamic contact angle during suction was stabilized was taken as the sweepback contact angle.

The results obtained are shown in Tables 7 to 10 below.

TABLE 7

| | | Composition | | | | | Results of Evaluation | | | | | |
|---|---|---|---|---|---|---|---|---|---|---|---|---|
| | | Photo-Acid | Solvent | Basic | Resin | Sur- | Ordinary Exposure | | Immersion Exposure | | Sweepback | Following |
| Ex. No. | Resin (2 g) | Generator (mg) | (mass ratio) | Cpd. (mg) | (C) (mg) | factant (mg) | Profile | LER (nm) | Profile | LER (nm) | Contact Angle | Ability of Water |
| Ex. 1 | 1 | z2 (80) | SL-1/SL-2 (60/40) | N-5 (7) | C-1 (20) | W-1 (3) | Rectangle | 6.7 | Rectangle | 6.6 | 67 | ○ |
| Ex. 2 | 2 | z51 (100) | SL-2/SL-4/SL-6 (40/59/1) | N-6 (10) | C-2 (30) | W-4 (3) | Rectangle | 6.5 | Rectangle | 6.7 | 68 | ○ |
| Ex. 3 | 3 | z2/z52 (20/100) | SL-2/SL-4 (70/30) | N-3 (6) | C-1 (30) | W-6 (3) | Rectangle | 6.8 | Rectangle | 6.6 | 67 | ○ |
| Ex. 4 | 4 | z55/z65 (20/100) | SL-2/SL-4 (60/40) | — | C-1 (100) | — | T-top | 6.8 | T-top | 6.9 | 69 | ○ |
| Ex. 5 | 5 | z55/z51 (20/80) | SL-3/SL-4 (30/70) | N-6 (10) | C-2 (50) | W-6 (4) | Rectangle | 6.5 | Rectangle | 6.5 | 68 | ○ |
| Ex. 6 | 6 | z44/z65 (25/80) | SL-2/SL-4/SL-5 (40/58/2) | N-1 (7) | C-3 (50) | W-6 (4) | Rectangle | 6.7 | Rectangle | 6.8 | 67 | ○ |
| Ex. 7 | 7 | z55/z47 (30/60) | SL-1/SL-2 (60/40) | N-4 (13) | C-2 (100) | W-6 (4) | Rectangle | 6.5 | Rectangle | 6.5 | 75 | ○ |
| Ex. 8 | 8 | z65 (100) | SL-1/SL-2 (60/40) | N-3 (6) | C-4 (90) | W-2 (3) | Rectangle | 6.6 | Rectangle | 6.7 | 70 | ○ |
| Ex. 9 | 9 | z44/z65 (50/50) | SL-2/SL-4/SL-6 (40/59/1) | N-2 (9) | C-3 (30) | W-3 (3) | Rectangle | 6.7 | Rectangle | 6.7 | 67 | ○ |
| Ex. 10 | 10 | z51 (100) | SL-2/SL-4 (70/30) | N-5 (7) | C-5 (30) | W-5 (3) | Rectangle | 6.6 | Rectangle | 6.7 | 67 | ○ |
| Ex. 11 | 11 | z55/z65 (40/60) | SL-2/SL-4 (60/40) | N-1 (7) | C-5 (100) | W-4 (3) | Rectangle | 6.7 | Rectangle | 6.7 | 68 | ○ |
| Ex. 12 | 12 | z55/z65 (20/80) | SL-1/SL-2 (50/50) | N-3 (6) | C-1 (100) | W-1 (3) | Rectangle | 6.8 | Rectangle | 6.6 | 69 | ○ |
| Ex. 13 | 13 | z37 (110) | SL-1/SL-2 (30/70) | N-5 (7) | C-5 (30) | W-1 (5) | Rectangle | 7.3 | Rectangle | 7.3 | 67 | ○ |
| Ex. 14 | 14 | z62 (120) | SL-2/SL-4/SL-6 (40/59/1) | N-1 (7) | C-3 (50) | W-4 (5) | Rectangle | 6.5 | Rectangle | 6.7 | 68 | ○ |
| Ex. 15 | 15 | z55/z51 (40/50) | SL-2/SL-4 (60/40) | N-3 (6) | C-2 (80) | W-6 (5) | Rectangle | 6.7 | Rectangle | 6.7 | 75 | ○ |
| Ex. 16 | 16 | z65/z9 (100/10) | SL-2/SL-4 (60/40) | — | C-3 (100) | W-1 (5) | Rectangle | 6.7 | Rectangle | 6.9 | 73 | ○ |
| Ex. 17 | 17 | z66 (100) | SL-1/SL-2 (60/40) | N-5 (7) | C-1 (30) | W-1 (5) | Rectangle | 7.5 | Rectangle | 7.5 | 67 | ○ |
| Ex. 18 | 18 | z16 (90) | SL-2/SL-4/SL-6 (40/59/1) | N-6 (10) | C-4 (50) | W-4 (5) | Rectangle | 6.6 | Rectangle | 5.7 | 67 | ○ |
| Ex. 19 | 19 | z55 (80) | SL-2/SL-4 (70/30) | N-3 (6) | C-2 (100) | W-6 (5) | Rectangle | 6.5 | Rectangle | 6.5 | 72 | ○ |
| Ex. 20 | 20 | z51 (100) | SL-2/SL-4 (70/30) | — | C-1 (30) | — | Round top | 6.9 | Round top | 6.8 | 67 | ○ |
| Comp. Ex. 1 | 1 | z2 (80) | SL-1/SL-2 (60/40) | N-5 (7) | — | W-1 (5) | T-top | 8.0 | Round top | 8.0 | 55 | x |

TABLE 8

| | | Composition | | | | | Results of Evaluation | | | | | |
|---|---|---|---|---|---|---|---|---|---|---|---|---|
| | | Photo-Acid | Solvent | Basic | Resin | Sur- | Ordinary Exposure | | Immersion Exposure | | Sweepback | Following |
| Ex. No. | Resin (2 g) | Generator (mg) | (mass ratio) | Cpd. (mg) | (C) (mg) | factant (mg) | Profile | LER (nm) | Profile | LER (nm) | Contact Angle | Ability of Water |
| Ex. 21 | 9 | z2 (80) | SL-1/SL-2 (60/40) | N-5 (7) | C-6 (20) | W-1 (3) | Rectangle | 6.0 | Rectangle | 6.1 | 72 | ○ |
| Ex. 22 | 1 | z51 (100) | SL-2/SL-4/SL-6 (40/59/1) | N-6 (10) | C-7 (30) | W-4 (3) | Rectangle | 6.8 | Rectangle | 6.7 | 73 | ○ |
| Ex. 23 | 12 | z2/z62 (20/100) | SL-2/SL-4 (70/30) | N-3 (6) | C-5 (150) | W-1 (3) | Rectangle | 7.7 | Rectangle | 7.5 | 65 | Δ |

TABLE 8-continued

| | Composition | | | | | Results of Evaluation | | | | | |
|---|---|---|---|---|---|---|---|---|---|---|---|
| | | | | | | Ordinary Exposure | | Immersion Exposure | | Sweepback | Following |
| Ex. No. | Resin (2 g) | Photo-Acid Generator (mg) | Solvent (mass ratio) | Basic Cpd. (mg) | Resin (C) (mg) | Sur-factant (mg) | Profile | LER (nm) | Profile | LER (nm) | Contact Angle | Ability of Water |
| Ex. 24 | 20 | z55/z65 (20/100) | SL-2/SL-4 (60/40) | N-1 (7) | C-6 (30) | W-1 (3) | Rectangle | 6.2 | Rectangle | 5.9 | 74 | ○ |
| Ex. 25 | 8 | z55/z51 (20/80) | SL-3/SL-4 (30/70) | N-6 (10) | C-7 (35) | W-4 (4) | Rectangle | 6.5 | Rectangle | 6.4 | 72 | ○ |
| Ex. 26 | 20 | z44/z65 (25/80) | SL-2/SL-4/SL-5 (40/58/2) | N-1 (7) | C-3 (2) | W-3 (4) | Rectangle | 7.3 | Rectangle | 7.3 | 64 | Δ |
| Ex. 27 | 21 | z55/z47 (30/60) | SL-1/SL-2 (60/40) | N-5 (10) | C-6 (15) | W-1 (4) | Rectangle | 6.0 | Rectangle | 5.9 | 75 | ○ |
| Ex. 28 | 12 | z65 (100) | SL-1/SL-2 (60/40) | N-3 (6) | C-7 (10) | W-2 (3) | Rectangle | 6.6 | Rectangle | 6.7 | 73 | ○ |
| Ex. 29 | 8 | z44/z65 (50/50) | SL-2/SL-4/SL-6 (40/59/1) | N-2 (9) | C-8 (15) | W-3 (3) | Rectangle | 6.4 | Rectangle | 6.1 | 73 | ○ |
| Ex. 30 | 12 | z51 (100) | SL-2/SL-4 (70/30) | N-5 (7) | C-7 (10) | W-1 (3) | Rectangle | 6.3 | Rectangle | 6.0 | 71 | ○ |
| Ex. 31 | 12 | z2/z62 (20/100) | SL-2/SL-4 (70/30) | N-3 (6) | C-8 (25) | W-1 (3) | Rectangle | 6.6 | Rectangle | 6.6 | 68 | ○ |
| Ex. 32 | 20 | z44/z65 (25/80) | SL-2/SL-4/SL-5 (40/58/2) | N-1 (7) | C-6 (30) | W-3 (4) | Rectangle | 6.6 | Rectangle | 6.6 | 76 | ○ |
| Comp. Ex. 2 | 4 | z55/z65 (20/100) | SL-2/SL-4 (60/40) | — | — | — | T-top | 8.5 | T-top | 8.3 | 53 | x |
| Ex. 33 | 22 | z2 (80) | SL-1/SL-2 (60/40) | N-5 (7) | C-1 (20) | W-1 (3) | Taper | 18.1 | Taper | 18.6 | 63 | Δ |
| Comp. Ex. 3 | 22 | z2 (80) | SL-1/SL-2 (60/40) | N-5 (7) | — | W-1 (3) | Taper | 19.2 | Taper | 19.8 | 38 | x |

TABLE 9

| | Composition | | | | | Results of Evaluation | | | | | |
|---|---|---|---|---|---|---|---|---|---|---|---|
| | | | | | | Ordinary Exposure | | Immersion Exposure | | Sweepback | Following |
| Ex. No. | Resin (2 g) | Photo-Acid Generator (mg) | Solvent (mass ratio) | Basic Cpd. (mg) | Resin (C) (mg) | Surfactant (mg) | Profile | LER (nm) | Profile | LER (nm) | Contact Angle | Ability of Water |
| Ex. 34 | 23 | z23/z55 (21.4/85.4) | SL-1/SL-2 (40/60) | N-2 (11) | C-9 (8) | W-4 (2) | Rectangle | 5.6 | Rectangle | 5.6 | 75 | ○ |
| Ex. 35 | 23 | z23/z65 (19.8/95.2) | SL-2/SL-4 (40/60) | N-3/N-5 (8.5/1.8) | C-10 (10) | W-4 (2) | Rectangle | 5.5 | Rectangle | 5.6 | 75 | ○ |
| Ex. 36 | 23 | z23/z55 (21.4/85.4) | SL-1/SL-2 (40/60) | N-1/N-5 (9.1/2.3) | C-11 (10) | W-4 (2) | Rectangle | 5.3 | Rectangle | 5.1 | 77 | ○ |
| Ex. 37 | 23 | z63 (101.4) | SL-2/SL-4/SL-6 (59/40/1) | N-1/N-5 (9.1/2.3) | C-12 (8) | W-6 (2) | Rectangle | 5.8 | Rectangle | 5.5 | 74 | ○ |
| Ex. 38 | 24 | z23/z55 (21.4/85.4) | SL-1/SL-2 (40/60) | N-2 (11) | C-9 (8) | W-4 (2) | Rectangle | 6.5 | Rectangle | 6.5 | 75 | ○ |
| Ex. 39 | 24 | z23/z65 (19.8/95.2) | SL-2/SL-4 (40/60) | N-3/N-5 (8.5/1.8) | C-10 (10) | W-4 (2) | Rectangle | 6.1 | Rectangle | 6.2 | 73 | ○ |
| Ex. 40 | 24 | z23/z55 (21.4/85.4) | SL-1/SL-2 (40/60) | N-1/N-5 (9.1/2.3) | C-11 (10) | W-4 (2) | Rectangle | 6.4 | Rectangle | 6.3 | 76 | ○ |
| Ex. 41 | 24 | z63 (101.4) | SL-2/SL-4/SL-6 (59/40/1) | N-1/N-5 (9.1/2.3) | C-12 (8) | W-6 (2) | Rectangle | 6.3 | Rectangle | 6.4 | 72 | ○ |
| Ex. 42 | 25 | z23/z55 (21.4/85.4) | SL-1/SL-2 (40/60) | N-2 (11) | C-9 (10) | W-4 (2) | Rectangle | 5.5 | Rectangle | 5.7 | 75 | ○ |
| Ex. 43 | 25 | z23/z65 (19.8/95.2) | SL-2/SL-4 (40/60) | N-3/N-5 (8.5/1.8) | C-10 (12) | W-4 (2) | Rectangle | 5.8 | Rectangle | 5.8 | 75 | ○ |
| Ex. 44 | 25 | z23/z55 (21.4/85.4) | SL-1/SL-2 (40/60) | N-1/N-5 (9.1/2.3) | C-11 (8) | W-4 (2) | Rectangle | 5.3 | Rectangle | 5.2 | 77 | ○ |
| Ex. 45 | 25 | z63 (101.4) | SL-2/SL-4/SL-6 (59/40/1) | N-1/N-5 (9.1/2.3) | C-12 (8) | W-6 (2) | Rectangle | 5.8 | Rectangle | 5.5 | 74 | ○ |
| Ex. 46 | 26 | z23/z55 (21.4/85.4) | SL-1/SL-2 (40/60) | N-2 (11) | C-9 (8) | W-4 (2) | Rectangle | 5.4 | Rectangle | 5.7 | 75 | ○ |
| Ex. 47 | 26 | z23/z65 (19.8/95.2) | SL-2/SL-4 (40/60) | N-3/N-5 (8.5/1.8) | C-10 (10) | W-4 (2) | Rectangle | 5.9 | Rectangle | 6.0 | 75 | ○ |
| Ex. 48 | 26 | z23/z55 (21.4/85.4) | SL-1/SL-2 (40/60) | N-1/N-5 (9.1/2.3) | C-11 (8) | W-4 (2) | Rectangle | 5.1 | Rectangle | 4.9 | 77 | ○ |
| Ex. 49 | 26 | z63 (101.4) | SL-2/SL-4/SL-6 (59/40/1) | N-1/N-5 (9.1/2.3) | C-12 (8) | W-6 (2) | Rectangle | 5.8 | Rectangle | 5.5 | 74 | ○ |

TABLE 9-continued

| | Composition | | | | | | Results of Evaluation | | | | | |
|---|---|---|---|---|---|---|---|---|---|---|---|---|
| | | Photo-Acid | Solvent | Basic | Resin | | Ordinary Exposure | | Immersion Exposure | | Sweepback | Following |
| Ex. No. | Resin (2 g) | Generator (mg) | (mass ratio) | Cpd. (mg) | (C) (mg) | Surfactant (mg) | Profile | LER (nm) | Profile | LER (nm) | Contact Angle | Ability of Water |
| Ex. 50 | 27 | z23/z55 (21.4/85.4) | SL-1/SL-2 (40/60) | N-2 (11) | C-9 (8) | W-4 (2) | Rectangle | 6.0 | Rectangle | 6.5 | 75 | ○ |
| Ex. 51 | 27 | z23/z65 (19.8/95.2) | SL-2/SL-4 (40/60) | N-3/N-5 (8.5/1.8) | C-10 (10) | W-4 (2) | Rectangle | 6.2 | Rectangle | 6.2 | 73 | ○ |
| Ex. 52 | 27 | z23/z55 (21.4/85.4) | SL-1/SL-2 (40/60) | N-1/N-5 (9.1/2.3) | C-11 (10) | W-6 (2) | Rectangle | 6.4 | Rectangle | 6.3 | 76 | ○ |
| Ex. 53 | 27 | z63 (101.4) | SL-2/SL-4/SL-6 (59/40/1) | N-1/N-5 (9.1/2.3) | C-12 (8) | W-1 (2) | Rectangle | 6.3 | Rectangle | 6.4 | 72 | ○ |
| Ex. 54 | 28 | z23/z51 (27.5/79.5) | SL-2/SL-4 (40/60) | N-2 (11) | C-9 (8) | W-4 (2) | Rectangle | 5.0 | Rectangle | 4.9 | 76 | ○ |
| Ex. 55 | 28 | z23/z55 (27.5/79.5) | SL-1/SL-2 (40/60) | N-3/N-5 (4.5/5.0) | C-11 (8) | W-4 (2) | Rectangle | 4.5 | Rectangle | 4.4 | 76 | ○ |
| Ex. 56 | 28 | z63 (101.4) | SL-2/SL-4/SL-6 (59/40/1) | N-1/N-5 (9.1/2.3) | C-10 (10) | W-1 (2) | Rectangle | 5.1 | Rectangle | 5.2 | 74 | ○ |
| Ex. 57 | 28 | z23/z58 (27.5/80.0) | SL-1/SL-2 (40/60) | N-3/N-5 (4.5/5.0) | C-12 (10) | W-4 (2) | Rectangle | 4.6 | Rectangle | 4.4 | 75 | ○ |
| Ex. 58 | 23/28 (1 g/1 g) | z23/z51 (27.5/79.5) | SL-2/SL-4 (40/60) | N-2 (11) | C-11 (8) | W-4 (2) | Rectangle | 5.0 | Rectangle | 4.9 | 76 | ○ |
| Ex. 59 | 23/28 (1 g/1 g) | z23/z55 (27.5/79.5) | SL-1/SL-2 (40/60) | N-3/N-5 (4.5/5.0) | C-11 (8) | W-4 (2) | Rectangle | 4.4 | Rectangle | 4.4 | 75 | ○ |
| Ex. 60 | 23/28 (1 g/1 g) | z23/z65 (19.8/95.2) | SL-2/SL-4 (40/60) | N-3/N-5 (8.5/1.8) | C-11 (10) | W-4 (2) | Rectangle | 4.9 | Rectangle | 4.9 | 75 | ○ |

TABLE 10

| | Composition | | | | | | Results of Evaluation | | | | | |
|---|---|---|---|---|---|---|---|---|---|---|---|---|
| | | Photo-Acid | Solvent | Basic | Resin | | Ordinary Exposure | | Immersion Exposure | | Sweepback | Following |
| Ex. No. | Resin (2 g) | Generator (mg) | (mass ratio) | Cpd. (mg) | (C) (mg) | Surfactant (mg) | Profile | LER (nm) | Profile | LER (nm) | Contact Angle | Ability of Water |
| Ex. 61 | 29 | Z2 (80) | SL-2/SL-4 (60/40) | N-1 (7) | C-1 (3) | W-1 (3) | Rectangle | 6.7 | Rectangle | 6.7 | 69 | ○ |
| Ex. 62 | 30 | Z2 (80) | SL-2/SL-4 (60/40) | N-2 (9) | C-13 (10) | W-1 (4) | Rectangle | 6.8 | Rectangle | 6.8 | 71 | ○ |
| Ex. 63 | 31 | Z2 (80) | SL-2/SL-4 (60/40) | N-7 (8) | C-3 (12) | W-2 (3) | Rectangle | 6.6 | Rectangle | 6.6 | 72 | ○ |
| Ex. 64 | 32 | Z2 (80) | SL-2/SL-4 (60/40) | N-8 (10) | C-4 (8) | W-1 (3) | Rectangle | 6.7 | Rectangle | 6.6 | 70 | ○ |
| Ex. 65 | 33 | Z2 (80) | SL-2/SL-4 (60/40) | N-6 (10) | C-14 (11) | W-1 (4) | Rectangle | 6.9 | Rectangle | 7.0 | 72 | ○ |
| Ex. 66 | 23 | Z67 (90) | SL-2/SL-4 (60/40) | N-9 (7) | C-2 (50) | W-3 (3) | Rectangle | 6.9 | Rectangle | 6.9 | 71 | ○ |
| Ex. 67 | 23 | Z69 (100) | SL-2/SL-4 (60/40) | N-8 (8) | C-1/C-14 (2/8) | W-1 (3) | Rectangle | 6.9 | Rectangle | 6.8 | 73 | ○ |
| Ex. 68 | 23 | Z70 (95) | SL-2/SL-4 (60/40) | N-2 (9) | C-1 (6) | — | Rectangle | 7.0 | Rectangle | 6.9 | 68 | ○ |
| Ex. 69 | 25 | Z71 (97) | SL-2/SL-4 (60/40) | N-7 (8) | C-13 (10) | W-7 (3) | Rectangle | 7.0 | Rectangle | 7.1 | 69 | ○ |
| Ex. 70 | 26 | Z72 (98) | SL-2/SL-4 (60/40) | N-8 (10) | C-14 (10) | W-1 (3) | Rectangle | 7.0 | Rectangle | 7.0 | 70 | ○ |
| Ex. 71 | 29 | Z73 (95) | SL-2/SL-4 (60/40) | N-6 (10) | C-14 (10) | W-1 (3) | Rectangle | 6.9 | Rectangle | 6.9 | 72 | ○ |
| Ex. 72 | 7 | Z69/Z70 (50/40) | SL-2/SL-4 (60/40) | N-1 (7) | C-14 (10) | W-1 (3) | Rectangle | 6.8 | Rectangle | 6.8 | 71 | ○ |
| Ex. 73 | 1 | Z70/Z37 (80/10) | SL-2/SL-4 (60/40) | N-2 (9) | C-14 (10) | W-1 (3) | Rectangle | 6.8 | Rectangle | 6.7 | 70 | ○ |
| Ex. 74 | 29 | Z70/Z74 (95/15) | SL-2/SL-4 (60/40) | N-7 (8) | C-14 (10) | W-1 (3) | Rectangle | 6.8 | Rectangle | 6.9 | 68 | ○ |

The abbreviations in Tables 7 to 10 are as follows.
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
N-7: Triethanolamine N-8: Tetrabutylammonium hydoxide
N-9: Phenylbenzimidazole
W-1: Megafac F176 (fluorine surfactant, manufactured by Dainippon Ink and Chemicals Inc.)
W-2: Megafac $R_{08}$ (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
W-5: PF656 (fluorine surfactant, manufactured by OMNOVA)
W-6: PF6320 (fluorine surfactant, manufactured by OMNOVA)
W-7: PF6520 (fluorine surfactant, manufactured by OMNOVA)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate From the above results, it can be understood that the resist compositions according to the invention are excellent in line edge roughness, and have various excellent performances of following ability of water.

The invention can provide a positive resist composition suitable for immersion exposure that shows good line edge roughness and excellent following ability of an immersion liquid, and a pattern-forming method using the same.

The entire disclosure of each and every foreign patent application from which the benefit of foreign priority has been claimed in the present application is incorporated herein by reference, as if fully set forth.

What is claimed is:

1. A positive resist composition containing:
    (A) a resin capable of increasing its solubility in an alkali developer by action of an acid and not containing a silicon atom;
    (B) a compound capable of generating an acid upon irradiation with actinic ray or radiation,
    (C) from 0.1 to 5 mass % of a total solids content in the composition of a silicon atom-containing resin having at least one group selected from groups (X) to (Z),
    (X) an alkali-soluble group,
    (Y) a group capable of decomposing by action of an alkali developer to increase the solubility of resin (C) in an alkali developer,
    (Z) a group capable of decomposing by action of an acid to increase the solubility of resin (C) in an alkali developer; and
    (D) a solvent.

2. The positive resist composition as claimed in claim 1, wherein the resin (A) has a monocyclic or polycyclic alicyclic hydrocarbon structure.

3. The positive resist composition as claimed in claim 1, wherein the silicon atom-containing resin (C) is a silicon atom-containing resin that is alkali-soluble and/or capable of increasing its solubility in an alkali developer by action of an acid.

4. The positive resist composition as claimed in claim 1, wherein the silicon atom-containing resin (C) is a resin that is alkali-soluble and does not increase its solubility in an alkali developer by action of an acid.

5. The positive resist composition as claimed in claim 1, wherein the silicon atom-containing resin (C) has at least one kind of repeating unit having a lactone group.

6. The positive resist composition as claimed in claim 1, wherein the silicon atom-containing resin (C) is a resin that is alkali-insoluble and capable of increasing its solubility in an alkali developer by action of an acid.

7. The positive resist composition as claimed in claim 1, which is exposed with vacuum ultraviolet rays of wavelengths of 200 nm or less.

8. The positive resist composition as claimed in claim 1, wherein the weight average molecular weight of the silicon atom-containing resin (C) is from 1,000 to 100,000.

9. The positive resist composition as claimed in claim 1, wherein the silicon atom-containing resin (C) further contains a fluorine atom.

10. The positive resist composition as claimed in claim 1, wherein the resin (A) has a repeating unit having an alicyclic hydrocarbon group substituted with a hydroxyl group or a cyano group.

11. A pattern-forming method comprising:
    forming a resist film with the resist composition as claimed in claim 1;
    exposing the resist film; and
    developing the exposed resist film.

12. The positive resist composition as claimed in claim 1, wherein the silicon atom-containing resin (C) has the alkali-soluble group (X), and wherein the alkali-soluble group (X) is a carboxylic acid group, a fluorinated alcohol group or a sulfonylimido group.

* * * * *